(12) United States Patent
Hashimoto et al.

(10) Patent No.: US 12,210,285 B2
(45) Date of Patent: Jan. 28, 2025

(54) RESIN COMPOSITION, RESIN SHEET, CURED FILM, METHOD FOR PRODUCING CURED FILM, SEMICONDUCTOR DEVICE, AND DISPLAY DEVICE

(71) Applicant: TORAY INDUSTRIES, INC., Tokyo (JP)

(72) Inventors: Keika Hashimoto, Otsu (JP); Yuki Masuda, Otsu (JP); Yuki Takeyama, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 1075 days.

(21) Appl. No.: 17/252,934

(22) PCT Filed: Jul. 25, 2019

(86) PCT No.: PCT/JP2019/029213
§ 371 (c)(1),
(2) Date: Dec. 16, 2020

(87) PCT Pub. No.: WO2020/026937
PCT Pub. Date: Feb. 6, 2020

(65) Prior Publication Data
US 2021/0116810 A1      Apr. 22, 2021

(30) Foreign Application Priority Data
Aug. 1, 2018   (JP) .................. 2018-144810

(51) Int. Cl.
*G03F 7/038* (2006.01)
*C08G 73/10* (2006.01)
(Continued)

(52) U.S. Cl.
CPC ....... *G03F 7/0387* (2013.01); *C08G 73/1067* (2013.01); *C08J 5/18* (2013.01);
(Continued)

(58) Field of Classification Search
None
See application file for complete search history.

(56) References Cited

U.S. PATENT DOCUMENTS

2019/0081258 A1\* 3/2019 Masuda ............... G03F 7/0233

FOREIGN PATENT DOCUMENTS

JP       2013174843 A  \*  9/2013
JP       2014-71374 A      4/2014
(Continued)

OTHER PUBLICATIONS

International Search Report, issued in PCT/JP2019/029213, PCT/ISA/210, dated Oct. 15, 2019.
(Continued)

*Primary Examiner* — Randy P Gulakowski
*Assistant Examiner* — Ha S Nguyen
(74) *Attorney, Agent, or Firm* — Birch, Stewart, Kolasch & Birch, LLP

(57) ABSTRACT

Provided is a resin composition which makes it possible to improve the resistance to a flux to be used in soldering and the resistance to reflow, and which, when used as a photosensitive resin composition, can be cured into a film capable of being imparted with such thick film processability that the film can be processed with high sensitivity even when the thickness of the film is as high as 15 μm or more. A resin composition comprising (A) a resin having a structural unit represented by general formula (1) and/or general formula (2), (B) a phenolic resin and (C) an antioxidant agent, wherein the phenolic resin (B) contains a structure represented by general formula (3).

20 Claims, 5 Drawing Sheets

(51) Int. Cl.
| | |
|---|---|
| C08G 73/22 | (2006.01) |
| C08J 5/18 | (2006.01) |
| C08K 5/00 | (2006.01) |
| C08K 5/23 | (2006.01) |
| C08L 61/34 | (2006.01) |
| C08L 79/08 | (2006.01) |
| G03F 7/004 | (2006.01) |
| G03F 7/022 | (2006.01) |
| G03F 7/023 | (2006.01) |
| G03F 7/039 | (2006.01) |
| G03F 7/20 | (2006.01) |
| G03F 7/26 | (2006.01) |
| G09F 9/30 | (2006.01) |
| H01L 21/48 | (2006.01) |
| H01L 21/683 | (2006.01) |
| H01L 23/00 | (2006.01) |
| H01L 23/14 | (2006.01) |
| H01L 23/31 | (2006.01) |
| H01L 23/498 | (2006.01) |
| H01L 23/538 | (2006.01) |
| H01L 27/12 | (2006.01) |

(52) U.S. Cl.
CPC ............... *C08L 61/34* (2013.01); *C08L 79/08* (2013.01); *G03F 7/039* (2013.01); *H01L 21/4857* (2013.01); *H01L 23/3128* (2013.01); *H01L 23/5383* (2013.01); *H01L 24/02* (2013.01); *H01L 24/05* (2013.01); *H01L 24/13* (2013.01); *H01L 24/20* (2013.01); *H01L 27/124* (2013.01); *H01L 27/1248* (2013.01); *C08J 2361/34* (2013.01); *C08J 2379/08* (2013.01); *C08J 2471/12* (2013.01); *H01L 2224/02311* (2013.01); *H01L 2224/02331* (2013.01); *H01L 2224/0239* (2013.01); *H01L 2224/0401* (2013.01); *H01L 2224/05008* (2013.01); *H01L 2224/13026* (2013.01); *H01L 2224/214* (2013.01); *H01L 2224/215* (2013.01); *H01L 2924/01022* (2013.01); *H01L 2924/01024* (2013.01); *H01L 2924/01029* (2013.01); *H01L 2924/01047* (2013.01)

(56) References Cited

FOREIGN PATENT DOCUMENTS

| | | | | |
|---|---|---|---|---|
| WO | WO-2014046062 A1 | * | 3/2014 | ............. C08G 69/26 |
| WO | WO-2017064984 A1 | * | 4/2017 | ............. C08G 73/10 |
| WO | WO 2017/188153 A1 | | 11/2017 | |

OTHER PUBLICATIONS

Written Opinion of the International Searching Authority, issued in PCT/JP2019/029213, PCT/ISA/237, dated Oct. 15, 2019.

* cited by examiner

RESIN COMPOSITION, RESIN SHEET, CURED FILM, METHOD FOR PRODUCING CURED FILM, SEMICONDUCTOR DEVICE, AND DISPLAY DEVICE

TECHNICAL FIELD

The present invention relates to a resin composition.

BACKGROUND ART

Heretofore, polyimide-based resins and polybenzoxazole-based resins, which have excellent heat resistance, electrical insulation properties, mechanical properties, etc., have been widely used in surface protective films and interlayer dielectric films of semiconductor devices, insulation layers of display apparatuses such as organic light emitting devices etc., and planarizing films for substrates of thin film transistors (hereinafter occasionally referred to as TFTs), and the like.

In recent years, there are increasing demands for polyimide based resins and polybenzoxazole based resins that have not only the above characteristics, but also high sensitivity to the g-line (436 nm), h-line (405 nm), i-line (365 nm), etc., used as light exposure sources in order to realize improved productivity.

Techniques proposed so far to improve the sensitivity include, for example, the use of a mixture of 100 parts by mass of a polyimide precursor or a polybenzoxazole precursor containing 101 parts by mass or more of a novolac resin and/or a polyhydroxystyrene resin (see Patent document 1) and the use of a mixture of a polyimide precursor or a polybenzoxazole precursor containing a phenol resin of a specific structure (see Patent documents 2 and 3).

PRIOR ART DOCUMENTS

Patent Documents

Patent document 1: Japanese Unexamined Patent Publication (Kokai) No. 2005-352004
Patent document 2: Japanese Unexamined Patent Publication (Kokai) No. 2018-22171
Patent document 3: Japanese Unexamined Patent Publication (Kokai) No. 2018-55124

SUMMARY OF INVENTION

Problems to be Solved by the Invention

Although showing improved sensitivity to light in the wavelength range used for light exposure, the compositions described in the above documents have problems relating to simultaneous realization of it along with high resistance to flux used for welding, high reflow resistance, and processability to produce a thick cured film of 15 μm or more.

Means of Solving the Problems

To solve the above problem, the present invention is configured as described below.

[1] A resin composition including: (A) a resin having a structural unit as represented by the general formula (1) and/or general formula (2), (B) a phenol resin, and (C) an antioxidant, wherein the phenol resin of (B) contains a structure as represented by the general formula (3), and the component (B) accounts for 5 parts by mass or more and 49 parts by mass or less relative to 100 parts by mass of the component (A).

[Chemical formula 1]

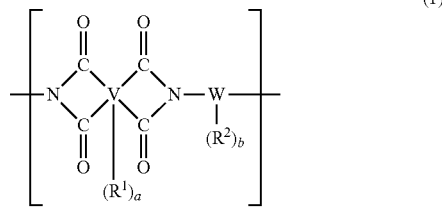

In the general formula (1), V is a tetravalent to decavalent organic group; W is a divalent to octavalent organic group; a and b each denote an integer of 0 to 6; $R^1$ and $R^2$ each denote one selected from the group consisting of a hydroxyl group, carboxy group, sulfonic group, and thiol group; the plurality of $R_1$'s may be identical to or different from each other; and the plurality of $R^2$'s may be identical to or different from each other.

[Chemical formula 2]

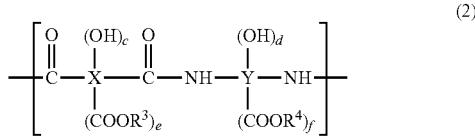

In the general formula (2), X and Y each independently denote a divalent to octavalent organic group containing two or more carbon atoms; $R^3$ and $R^4$ each independently represent a hydrogen atom or a monovalent organic group containing 1 to 20 carbon atoms; c and d each denote an integer of 0 to 4; and e and f each denote an integer of 0 to 2.

[Chemical formula 3]

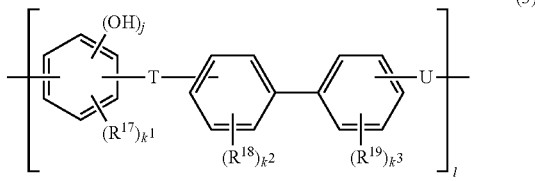

In the general formula (3), $R^{17}$, $R^{18}$, and $R^{19}$ each denote a monovalent organic group containing 1 to 20 carbon atoms; T and U each independently denote an alkylene group or alkylene oxide group containing 1 to 20 carbon atoms; j denotes an integer of 1 to 3; $k^1$, $k^2$, and $k^3$ each denote an integer of 0 to 2; and I denotes an integer of 3 to 100.

[2] A cured film formed by curing the aforementioned resin composition or a resin sheet formed from the aforementioned resin composition.

[3] A cured film production method including a step for forming a resin film by coating a substrate with the aforementioned resin composition or laminating a substrate with a resin sheet formed from the aforementioned resin composition, followed by drying, a light exposure step for exposing the dried resin film to light, a development step for developing the light-exposed resin film, and a heat treatment step for heat-treating the developed resin film.

[4] A semiconductor apparatus including metal wiring and an insulation film, wherein the aforementioned cured film is used as the insulation film.

[5] A display apparatus including a first electrode disposed on a substrate, an insulation layer covering the periphery of the first electrode, and a second electrode disposed opposite to the first electrode, wherein the insulation layer contains the aforementioned cure film.

[6] A display apparatus including a thin film transistor containing metal wiring disposed on a substrate, a planarizing film disposed so as to cover the irregularities on the thin film transistor containing metal wiring, and a display device disposed on the planarizing film, wherein the planarizing film contains the aforementioned cured film.

Advantageous Effects of the Invention

The resin composition according to the present invention is high in compatibility and serves to ensure improved resistance to flux used for welding and reflow resistance and form a photosensitive resin composition having a thick film processability to enable high sensitivity processing even when forming a thick cured film of 15 μm or more.

DESCRIPTION OF PREFERRED EMBODIMENTS

Figure 1:
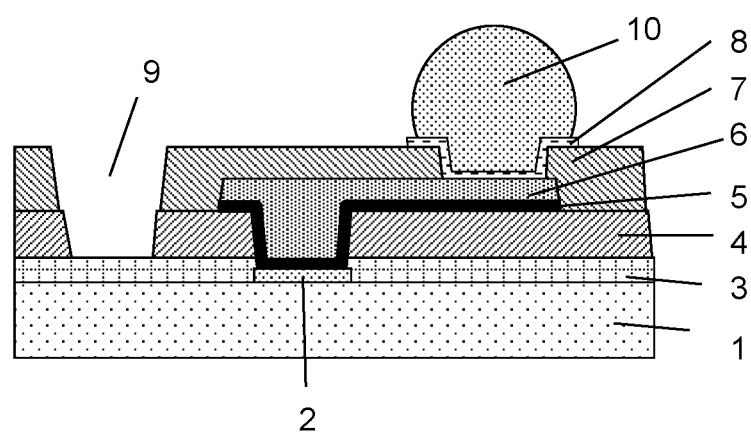
FIG. 1 This is an enlarged cross-sectional view of the pat part of a semiconductor apparatus with a bump.

The resin composition according to the present invention is a resin composition including: (A) a resin having a structural unit as represented by the general formula (1) and/or general formula (2) (hereinafter occasionally referred to as the component (A)), (B) a phenol resin (hereinafter occasionally referred to as the component (B)), and (C) an antioxidant (hereinafter occasionally referred to as the component (C)), wherein the phenol resin of (B) contains a structure as represented by the general formula (3), and the component (B) account for 5 parts by mass or more and 49 parts by mass or less relative to 100 parts by mass of the component (A).

[Chemical formula 4]

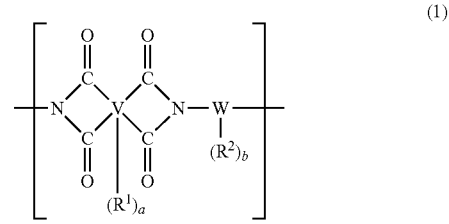

(1)

In the general formula (1), V is a tetravalent to decavalent organic group; W is a divalent to octavalent organic group; a and b each denote an integer of 0 to 6; $R^1$ and $R^2$ each denote one selected from the group consisting of a hydroxyl group, carboxy group, sulfonic group, and thiol group; the plurality of $R^1$'s may be identical to or different from each other; and the plurality of $R^2$'s may be identical to or different from each other.

[Chemical formula 5]

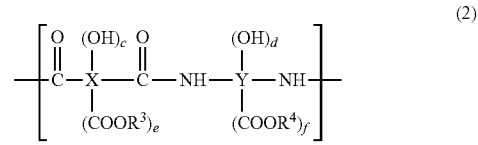

(2)

In the general formula (2), X and Y each independently denote a divalent to octavalent organic group containing two or more carbon atoms; $R^3$ and $R^4$ each independently denote a hydrogen atom or a monovalent organic group containing 1 to 20 carbon atoms; c and d each denote an integer of 0 to 4; and e and f each denote an integer of 0 to 2.

[Chemical formula 6]

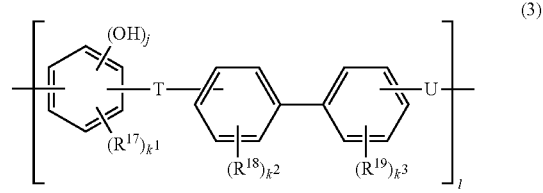

(3)

In the general formula (3), $R^{17}$, $R^{18}$, and $R^{19}$ each denote a monovalent organic group containing 1 to 20 carbon atoms; T and U each independently denote an alkylene group or alkylene oxide group containing 1 to 20 carbon atoms; j denotes an integer of 1 to 3; $k^1$, $k^2$, and $k^3$ each denote an integer of 0 to 2; and I denotes an integer of 3 to 100.

The component (A) contained in the resin composition according to the present invention is described below.

<Component (A)>

The component (A) has a structural unit as represented by the general formula (1) and/or the general formula (2).

[Chemical formula 7]

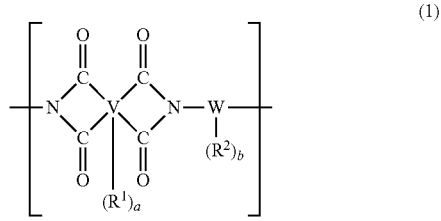

(1)

In the general formula (1), V is a tetravalent to decavalent organic group; W is a divalent to octavalent organic group; a and b each denote an integer of 0 to 6; $R^1$ and $R^2$ each denote one selected from the group consisting of a hydroxyl group, carboxy group, sulfonic group, and thiol group; the plurality of $R^1$'s may be identical to or different from each other; and the plurality of $R^2$'s may be identical to or different from each other.

[Chemical formula 8]

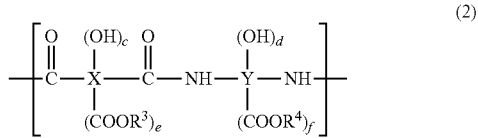

(2)

In the general formula (2), X and Y each independently denote a divalent to octavalent organic group containing two or more carbon atoms; $R^3$ and $R^4$ each independently denote a hydrogen atom or a monovalent organic group containing 1 to 20 carbon atoms; c and d each denote an integer of 0 to 4; and e and f each denote an integer of 0 to 2.

Specifically, the component (A) is preferably at least one resin selected from the group consisting of polyimide, polyimide precursor, and polybenzoxazole precursor, or a copolymer thereof. Each of these resins may be contained singly or a plurality of the resins may be contained in combination. Being high in heat resistance and low in outgassing rate at a temperature of 160° C. or higher after heat treatment, these resins are particularly preferred as material for planarizing film, insulation layer, barrier rib, protective film, and interlayer dielectric film used in organic light emitting devices, display apparatuses, and semiconductor devices.

There are no specific limitations on the component (A), but it is preferably an alkali-soluble resin from the viewpoint of environment load reduction. Described below are alkali-soluble resins useful for the present invention. A solution of γ-butyrolactone resin is spread over a silicon wafer and prebaked at 120° C. for 4 minutes to form a prebaked film having a film thickness of 10 μm±0.5 μm. Then, the prebaked film is immersed in a 2.38 mass % aqueous solution of tetramethyl ammonium hydroxide at 23±1° C. for 1 minute and then rinsed in pure water, followed by determining the decrease in film thickness. If the prebaked film is dissolved at a rate of 50 nm/min or more, then the resin is defined as alkali-soluble.

The polyimide, polyimide precursor, and polybenzoxazole precursor are described below. There are no specific limitations on the polyimide as long as it has an imide ring. There are no specific limitations on the polyimide precursor as long as it has a structure that can form an imide ring-containing polyimide when undergoing dehydration-cyclization, and it may contain polyamic acid, polyamic acid ester, etc. There are no specific limitations on the polybenzoxazole precursor as long as it has a structure that can form a benzoxazole ring-containing polybenzoxazole when undergoing dehydration-cyclization, and it may contain polyhydroxyamide, etc.

In the general formula (1), it is preferable that a+b>0 in order to allow the component (A) to be alkali-soluble. In the general formula (2), furthermore, it preferable that c+d+e+f>0. In the case where the general formula (2) represents a polyimide precursor, it is preferable that X and Y in the general formula (2) each has an aromatic group. Furthermore, it is more preferable that the general formula (2) has an aromatic group as X, meets the relation e>0, has a carboxy group or a carboxy ester group at the ortho position of the aromatic amide group, and contains a structure that forms an imide ring through dehydration-cyclization.

In the case where the general formula (2) represents a polybenzoxazole precursor, it is more preferable that the general formula (2) has an aromatic group as X, meets the relation d>0, has a hydroxyl group at the ortho position of the aromatic amide group, and contains a structure that forms a benzoxazole ring through dehydration-cyclization.

For the component (A), the number of repetitions n of a structural unit as represented by the general formula (1) or (2) is preferably 5 to 100,000, more preferably 10 to 100,000.

Furthermore, another structural unit may be contained in addition to a structural unit as represented by the general formula (1) or (2). Examples of such another structural unit include, but not limited to, cardo structure and siloxane structure. In this case, the main constituent unit is preferably a structural unit as represented by the general formula (1) or (2). Here, the main constituent unit is the structural unit that is represented by the general formula (1) or (2) and accounts for 50 mol % or more, preferably 70 mol % or more, of all structural units.

<Acid Residue in General Formula (1) and General Formula (2)>

V—$(R^1)^a$ in the general formula (1) and $(OH)_c$—X—$(COOR^3)_e$ in the general formula (2) each denote an acid residue. V is a tetravalent to decavalent organic group and in particular, it is preferably an organic group containing 4 to 40 carbon atoms and having an aromatic ring or a cyclic aliphatic group. X is a divalent to octavalent organic group having 2 or more carbon atoms and in particular, it is preferably an organic group containing 4 to 40 carbon atoms and having an aromatic ring or an aliphatic group.

Examples of the acid component present in the acid residue include, but not limited to, dicarboxylic acids such as terephthalic acid, isophthalic acid, diphenyl ether dicarboxylic acid, bis(carboxyphenyl) hexafluoropropane, biphenyl dicarboxylic acid, benzophenone dicarboxylic acid, and triphenyl dicarboxylic acid; tricarboxylic acids such as trimellitic acid, trimesic acid, diphenyl ether tricarboxylic acid, and biphenyl tricarboxylic acid; and tetracarboxylic acids such as pyromellitic acid, 3,3',4,4'-biphenyl tetracarboxylic acid, 2,3,3',4'-biphenyl tetracarboxylic acid, 2,2',3,3'-biphenyl tetracarboxylic acid, 3,3',4,4'-diphenyl ether tetracarboxylic acid, 3,3',4,4'-benzophenone tetracarboxylic acid, 2,2',3,3'-benzophenone tetracarboxylic acid, 2,2-bis(3,4-dicarboxyphenyl) propane, 2,2-bis(2,3-dicarboxyphenyl) propane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) ether, 1,2,5,6-naphthalene tetracarboxylic acid, 9,9-bis(3,4-dicarboxyphenyl) fluorene, 9,9-bis{4-(3,4-dicarboxyphenoxy) phenyl}fluorene, 2,3,6,7-naphthalene tetracarboxylic acid, 2,3,6,7-naphthalene tetracarboxylic acid, 2,3,5,6-pyridine tetracarboxylic acid, 3,4,9,10-perylene tetracarboxylic acid, 2,2-bis(3,4-dicarboxyphenyl) hexafluoropropane, and aromatic tetracarboxylic acids having structures as shown below, butane tetracarboxylic acid, cyclobutane tetracarboxylic acid, and 1,2,3,4-cyclopentane tetracarboxylic acid. Two or more of these may be used in combination.

[Chemical formula 9]

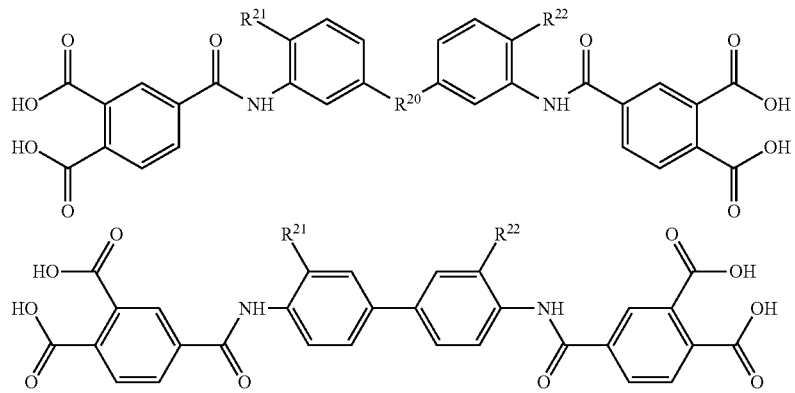

In the formulae, $R^{20}$ denotes an oxygen atom, $C(CF_3)_2$, or $C(CH_3)_2$. $R^{21}$ and $R^{22}$ each denote a hydrogen atom or a hydroxyl group.

These acids may be used in their original form or in the form of anhydrides, halides, or active esters.

<Di-Amine Residue in General Formula (1) and General Formula (2)>

W—$(R^2)_b$ in the general formula (1) and $(OH)_d$—Y—$(COOR^4)_f$ in the general formula (2) each denote a di-amine residue. W and Y are each a divalent to octavalent organic group and in particular, it is preferably an organic group containing 4 to 40 carbon atoms and having an aromatic ring or a cycloaliphatic group.

Specific examples of the di-amines present in such di-amine residues include 3,4'-diaminodiphenyl ether, 4,4'-diaminodiphenyl ether, 3,4'-diaminodiphenyl methane, 4,4'-diaminodiphenyl methane, 1,4-bis(4-aminophenoxy) benzene, benzidine, m-phenylene di-amine, p-phenylene di-amine, 1,5-naphthalene di-amine, 2,6-naphthalene di-amine, bis(4-aminophenoxy) biphenyl, bis{4-(4-aminophenoxy) phenyl}ether, 1,4-bis(4-aminophenoxy) benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, and 9,9-bis(4-aminophenyl) fluorine, compounds listed above in which at least part of the hydrogen atoms in the aromatic rings are substituted by alkyl groups or halogen atoms, aliphatic cyclohexyl di-amines, methylene biscyclohexyl amines, and other di-amines having structures as given below. Two or more of these may be used in combination.

[Chemical formula 10]

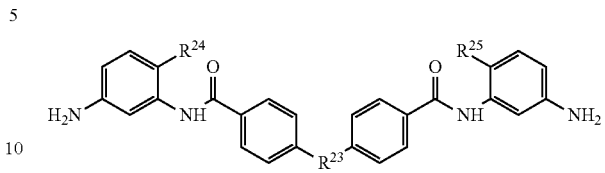

-continued

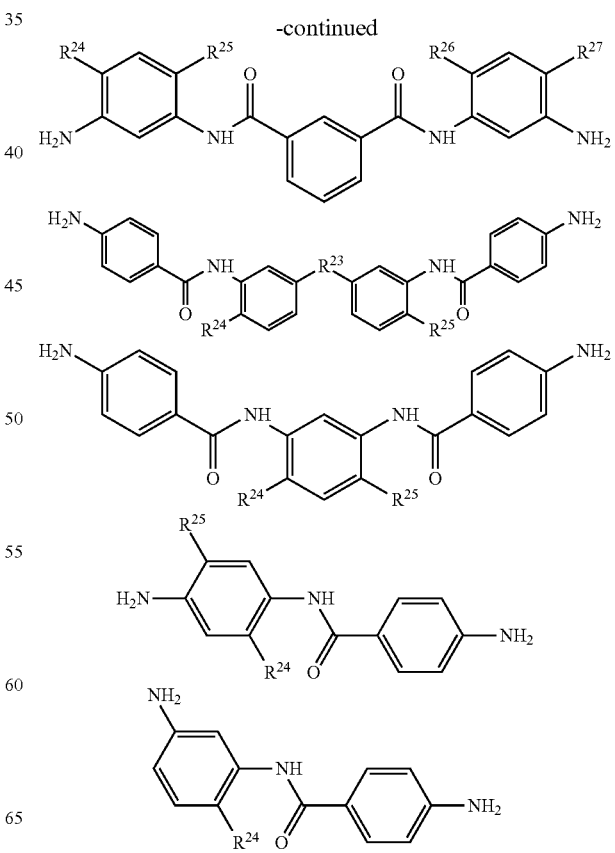

-continued

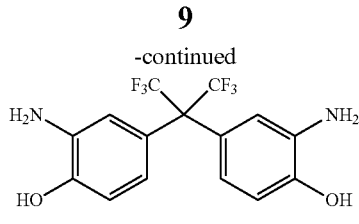

In the formulae, $R^{23}$ denotes an oxygen atom, $C(CF_3)_2$, or $C(CH_3)_2$. $R^{24}$ to $R^{27}$ each independently denote a hydrogen atom or a hydroxyl group.

Furthermore, it is preferable that, of the di-amines present in the di-amine residues, at least one di-amine has a structure as represented by any of the general formulae (8).

[Chemical formula 10-1]

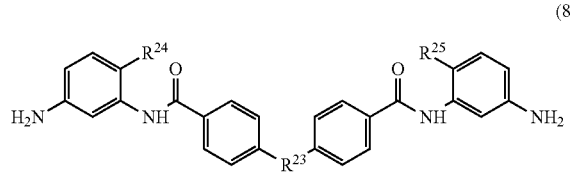

(8)

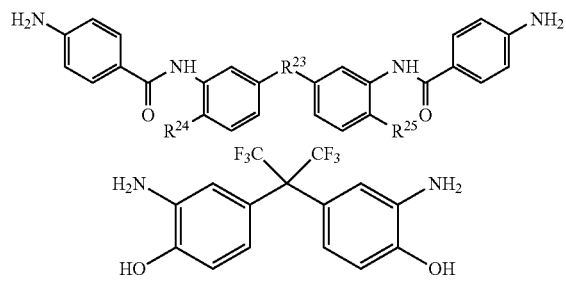

wherein in general formulae (8), $R^{23}$ denotes $C(CF_3)_2$, and $R^{24}$ and $R^{25}$ each independently denote a hydrogen atom or a hydroxyl group.

It is preferable for the di-amine residues having structure as shown above to account for 65 mol % or more of all di-amine residues. In addition, it is preferable for them to account for 95 mol % or less of all di-amine residues. If their amount is in the above range, it ensures a moderate developability, improved i-line permeability as an alkali-developable material, thick film processability to permit high sensitivity processing even when forming a thick cured film of 15 μm or more, and reflow resistance.

These di-amines may be used in the form of the original di-amines, diisocyanate compounds produced through reaction between di-amine and phosgene, or trimethylsilylated di-amines.

<Group Selected from Alkylene Groups and Alkylene Ether Groups>

It is also preferable for the compound (A) to contain a group selected from alkylene groups and alkylene ether groups. These groups may contain aliphatic rings. It is particularly preferable for the group selected from alkylene groups and alkylene ether groups to be a group as represented by the general formula (4),

[Chemical formula 11]

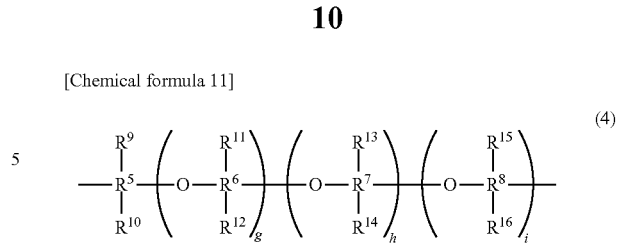

(4)

In the general formula (4), $R^6$ to $R^8$ each independently denote an alkylene group containing 1 to 6 carbon atoms. $R^9$ to $R^{16}$ each independently denote a hydrogen, fluorine, or an alkyl group containing 1 to 6 carbon atoms. It is noted that the structures in parentheses different from each other. Furthermore, g, h, and i are each independently an integer of 0 to 35 and meet the relation g+h+i>0.

Groups as represented by the general formula (4) include, for example, methylene group, ethylene group, propylene group, butylene group, dodecyl group, ethylene oxide group, propylene oxide group, and butylene oxide group, which may be linear, branched, or cyclic.

If the compound (A) has a group selected from alkylene groups and alkylene ether groups, a resin composition containing the component (A) can be cured into a cured film having high elongation property. In addition, the resin becomes flexible, and it becomes possible to depress the increase in stress that can occur when cyclizing an imide precursor structure or a benzoxazole precursor structure. This makes it possible to depress the increase in the stress imposed on the substrate wafer that can occur when cyclizing the above precursor structures. Furthermore, alkylene groups and alkylene ether groups are low in ultraviolet absorbability and therefore, their introduction acts to increase the i-line permeability. As a result, it ensures a thick film processability to permit high sensitivity processing even when forming a thick cured film of 15 μm or more.

Such an alkylene group and alkylene ether group preferably has a weight average molecular weight of 600 or more, more preferably 900 or more, from the viewpoint of enabling the production of a cured film having high elongation property. On the other hand, it is preferably 2,000 or less, more preferably 1,800 or less, and still more preferably 1,500 or less, from the viewpoint of maintaining a solubility in alkali solutions.

In the component (A), it is preferable for W in the general formula (1) or Y in the general formula (2) to contain a group selected from alkylene groups and alkylene ether groups as described above. This makes it possible to allow a cured film with high elongation property and low stress to be produced from the resin composition and to allow the resin composition to develop thick film processability to permit high sensitivity processing.

Furthermore, if W in the general formula (1) or Y in the general formula (2) has a group as represented by the general formula (4), it serves to increase the adhesion to a substrate metal (for example copper). Specifically, the ether group contained in the general formula (1) or the general formula (2) interacts with metal through coordinate bonds etc., thereby serving to develop strong adhesion to a substrate metal.

Examples of such a di-amine containing a group selected from alkylene groups and alkylene ether groups include ethylene di-amine, 1,3-diaminopropane, 2-methyl-1,3-propane di-amine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexane di-amine, 1,3-cyclohexane di-amine, 1,4-cyclohexane di-amine, 1,2-bis(aminomethyl) cyclohexane, 1,3-bis(aminomethyl) cyclohexane, 1,4-bis(aminomethyl) cyclohexane, 4,4'-methylene bis(cyclohexyl amine), 4,4'-methylene bis(2-methylcyclohexylamine), KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700 (all trade names, manufactured by HUNTSMAN).

Here, these di-amines may contain bonds such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, and —NHCONH—. Of these, preferred are di-amines containing groups as represented by the general formula (4), such as, for example, KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700 (all trade names, manufactured by HUNTSMAN).

It is preferable for such a di-amine residue containing a group selected from alkylene groups and alkylene ether groups to account for 5 mol % or more, more preferably 10 mol % or more, of all di-amine residues. On the other hand, it preferably accounts for 40 mol % or less, more preferably 30 mol % or less, of all di-amine residues. If the amount is in the above range, it ensures an increased developability in an alkaline developer, improved i-line permeability, and thick film processability to permit high sensitivity processing even when forming a thick cured film of 15 μm or more. In addition, it enables the production of a cured film having improved elongation property.

Copolymerization with a di-amine residue having an aliphatic polysiloxane structure may be adopted unless it impairs the heat resistance. Copolymerization with a di-amine residue having an aliphatic polysiloxane structure can serve to improve the adhesiveness to the substrate. Specific examples include di-amine components such as bis(3-aminopropyl) tetramethyl disiloxane and bis(p-aminophenyl) octamethyl pentasiloxane, which may be copolymerized to 1 to 15 mol % of all di-amine residues. Copolymerization in this range is preferred in terms of improvement in the adhesiveness to the substrate such as silicon wafer and prevention of a decrease in the solubility in alkali solutions.

Chain ends of the component (A) may be capped with an acidic group-containing monoamine, acid anhydride, acid chloride, or monocarboxylic acid to provide a resin having acidic groups at backbone chain ends.

Preferable examples of the monoamine include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-aminothiophenol, 3-aminothiophenol, and 4-aminothiophenol. Two or more of these may be used in combination.

Preferable examples of the acid anhydride, acid chloride, and monocarboxylic acid include acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, and 1-mercapto-5-carboxynaphthalene; those monoacid chloride compounds that can be produced from these monocarboxylic acids by converting their carboxy groups into acid chloride groups; those monoacid chloride compounds that can be produced from dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene by converting only one of their carboxy groups into an acid chloride group; and active ester compounds that can be produced by reacting a monoacid chloride compound with N-hydroxybenzotriazole or N-hydroxy-5-norbornene-2,3-dicarboxyimide. Two or more of these may be used in combination.

The end cap compounds such as monoamine, acid anhydride, acid chloride, and monocarboxylic acid described above preferably account for 2 to 25 mol % of the total quantity of the acids and amine components present in the component (A), which accounts for 100 mol %.

End cap compounds introduced in the component (A) can be detected easily by methods as described below. A resin containing an end cap compound may be dissolved in, for instance, an acidic solution to decompose it into the amine components and acid components, that is, the constituent units of the resin, and then the end cap compound can be detected easily from observations made by gas chromatography (GC) or NMR spectroscopy. In another method, detection can be carried out by subjecting the resin containing an end cap compound directly to pyrolysis gas chromatography (PGC), infrared spectroscopy, or $^{13}$C-NMR spectroscopy.

The component (A) preferably has a weight average molecular weight of 10,000 or more and 100,000 or less. A weight average molecular weight of 10,000 or more enables the production of a cured film having improved mechanical property. The weight average molecular weight is more preferably 20,000 or more. On the other hand, a weight average molecular weight of 100,000 or less is preferred because it serves to improve the developability with various developers, and a weight average molecular weight of 50,000 or less is preferred because it serves to improve the developability with alkali solutions.

The weight average molecular weight (Mw) can be determined by GPC (gel permeation chromatography). For example, N-methyl-2-pyrrolidone (hereinafter occasionally abbreviated as NMP) is used as eluent to take measurements to determine the polystyrene-based value. In the case where two or more resins are contained in the component (A), it is enough if at least one of them has a weight average molecular weight in the above range.

It is preferable for the content of the component (A) to be 3 to 55 parts by mass, more preferably 5 to 40 parts by mass, relative to the total quantity of all components including the solvent, which account for 100 parts by mass. A content in the above range makes it possible to adjust the viscosity appropriately for the implementation of spin coating or slit coating.

<Preparation of Component (A)>

The component (A) can be prepared by a generally known method.

In the case of the production of a polyimide precursor such as polyamic acid and polyamic acid ester, for example, the first method is to perform a reaction between a tetracarboxylic dianhydride and a di-amine compound at a low temperature. The second method is to produce a diester first from a tetracarboxylic dianhydride and alcohol. This is followed by a reaction in the presence of an amine and a condensation agent. The third method is to produce a diester first from a tetracarboxylic dianhydride and alcohol. This is followed by converting the remaining dicarboxylic acid into an acid chloride and reacting it with an amine to complete the synthesis.

In the case of the production of a polybenzoxazole precursor such as polyhydroxyamide, a good production method is to performed condensation reaction between a bisaminophenol compound and a dicarboxylic acid to obtain the intended substance. Specifically, available methods include a method in which an acid is reacted with a dehydration condensation agent such as dicyclohexyl carbodiimide (DCC), followed by adding a bisaminophenol compound, and a method in which a tertiary amine such as pyridine is added to a solution of a bisaminophenol compound, followed by dropping a solution of dicarboxylic dichloride.

In the case of the production of a polyimide, it can be produced by, for example, heating a polyimide precursor as prepared by the aforementioned method or subjecting it to chemical treatment with an acid or a base to cause dehydration-cyclization.

The resin composition may also contain other alkali-soluble resins in addition to the component (A). Specifically, such other alkali-soluble resins include siloxane polymers, cyclic olefin polymers, and cardo resins. Each of these resins may be used singly or a plurality of the resins may be used in combination. In that case, it is preferable for such other alkali-soluble resins to account for 1 to 50 parts by mass relative to the total quantity of the component (A) and those other alkali-soluble resin, which accounts for 100 parts by mass.

<Siloxane Polymers>

Described next are siloxane polymers. The siloxane polymer referred to herein is a siloxane polymer that is produced by hydrolysis condensation of an organosilane. For example, a good method is to add a solvent, water, and, if necessary, a catalyst to an organosilane and heating them at 50° C. to 150° C. for about 0.5 to 100 hours while stirring. During the stirring, hydrolysis by-products (alcohols such as methanol) and condensation by-products (water) may be evaporated by distillation if necessary.

Specific examples of the organosilane include tetrafunctional silanes such as tetramethoxysilane, tetraethoxysilane, tetraacetoxysilane, and tetraphenoxysilane; trifunctional silanes such as methyl trimethoxysilane, methyl triethoxysilane, methyl triisopropoxysilane, phenyl trimethoxysilane, phenyl triethoxysilane, and p-hydroxyphenyl trimethoxysilane; bifunctional silanes such as dimethyl dimethoxysilane, dimethyl diethoxysilane, dimethyl diacetoxysilane, di-n-butyl dimethoxysilane, diphenyl dimethoxysilane, (3-glycidoxypropyl) methyl dimethoxysilane, (3-glycidoxypropyl) methyl diethoxysilane, di(1-naphthyl) dimethoxysilane, and di(1-naphthyl) diethoxysilane; monofunctional silane such as trimethyl methoxysilane, tri-n-butyl ethoxysilane, (3-glycidoxypropyl) dimethyl methoxysilane, and (3-glycidoxypropyl) dimethyl ethoxysilane; and others such as Methyl Silicate 51 manufactured by Fuso Chemical Co., Ltd., M-Silicate 51, Silicate 40, and Silicate 45 manufactured by Tama Chemicals Co., Ltd., Methyl Silicate 51, Methyl Silicate 53A, and Ethyl Silicate 40 manufactured by Colcoat Co., Ltd. Two or more of these organosilanes may be used in combination.

There are no specific limitations on the weight average molecular weight of the siloxane polymer, but the polystyrene based value is preferably 1,000 or more as determined by GPC (gel permeation chromatography) to ensure improved coating performance. From the viewpoint of solubility in developers, on the other hand, the weight average molecular weight is preferably 100,000 or less, more preferably 50,000 or less.

<Cyclic Olefin Polymers>

Described below are cyclic olefin polymers. A cyclic olefin polymer is a homopolymer or a copolymer formed of cyclic olefin monomers each having a cyclic structure (alicyclic or aromatic ring) and a carbon-carbon double bond. Such a cyclic olefin polymer may also contain a monomer that is not a cyclic olefin monomer Monomers useful to produce such a cyclic olefin polymer include cyclic olefin monomers having protonic polar groups, cyclic olefin monomers having non-protonic polar groups, cyclic olefin monomers having no polar groups, and non-cyclic olefin monomers.

Specific examples of the cyclic olefin monomers having protonic polar groups include cyclic olefins containing carboxy groups such as 5-hydroxycarbonyl bicyclo[2.2.1]hept-2-ene, 5-methyl-5-hydroxycarbonyl bicyclo[2.2.1]hept-2-ene, and 8-hydroxycarbonyl tetracyclo[4.4.0.1$^{2,5}$0.1$^{7,10}$]dodeca-3-ene; and cyclic olefins containing hydroxyl groups such as 5-(4-hydroxyphenyl) bicyclo[2.2.1]hept-2-ene, 5-methyl-5-(4-hydroxyphenyl) bicyclo[2.2.1]hept-2-ene, and 8-(4-hydroxyphenyl) tetracyclo[4.4.0.1$^{2,5}$0.1$^{7,10}$]dodeca-3-ene.

Specific examples of the cyclic olefin monomers having non-protonic polar groups include cyclic olefins having ester groups such as 5-acetoxybicyclo[2.2.1]hept-2-ene, 5-methoxycarbonyl bicyclo[2.2.1]hept-2-ene, and 8-acetoxytetracyclo[4.4.0.1$^{2,5}$0.1$^{7,10}$]dodeca-3-ene, cyclic olefins having N-substituted imide groups such as N-phenyl-(5-norbornene-2,3-dicarboxyimide); cyclic olefins having cyano groups such as 8-cyanotetracyclo[4.4.0.1$^{2,5}$0.1$^{7,10}$]dodeca-3-ene, 8-methyl-8-cyanotetracyclo[4.4.0.1$^{2,5}$.1$^{7,10}$]dodeca-3-ene, and 5-cyanobicyclo[2.2.1]hept-2-ene, and cyclic olefins having halogen atoms such as 8-chlorotetracyclo[4.4.0.1$^{2,5}$0.1$^{7,10}$]dodeca-3-ene and 8-methyl-8-chlorotetracyclo[4.4.0.1$^{2,5}$0.1$^{7}$ ]dodeca-3-ene.

Specific examples of the cyclic olefin monomers having no protonic polar groups include bicyclo[2.2.1]hept-2-ene, 5-ethyl-bicyclo[2.2.1]hept-2-ene, and tricyclo[4.3.0.1$^{2,5}$] deca-3,7-diene.

Specific examples of the non-cyclic olefin monomers include straight chain olefins including α-olefins containing 2 to 20 carbon atoms such as ethylene, propylene, and 1-buten; and nonconjugated dienes containing 2 to 20 carbon atoms such as 1,4-hexadiene. These monomers may be used singly, or two or more thereof may be used in combination.

Common methods can be used for the polymerization of cyclic olefin polymers from the aforementioned monomers. They include, for example, ring opening polymerization and addition polymerization. Preferred polymerization catalysts include, for example, metal complexes of molybdenum, ruthenium, and osmium. These polymerization catalysts may be used singly or as a combination of two or more thereof.

<Cardo Resin>

Cardo resins are described below. A cardo resin is a resin having a cardo structure, which has a backbone structure having a cyclic structure containing a quaternary carbon atom with two cyclic structures bonded thereto. A typical cardo structure is a combination of a fluorene ring and benzene rings bonded thereto. Specific examples include fluorene backbone, bisphenol fluorene backbone, bisaminophenyl fluorene backbone, fluorene backbone having an epoxy group, and fluorene backbone having an acrylic group. A cardo resin can be produced by polymerization of cardo structure-containing backbones through reaction between functional groups bonded thereto. A cardo resin has a structure (cardo structure) characterized by a backbone chain and bulky side chains each bonded thereto through one atom to form a cyclic structure extended nearly perpendicular to the backbone chain.

Specific examples of monomers having cardo structures include cardo structure-containing bisphenols such as bis(glycidyloxyphenyl) fluorene type epoxy resin, 9,9-bis(4-hydroxyphenyl) fluorene, and 9,9-bis(4-hydroxy-3-methylphenyl) fluorene; 9,9-bis(cyanoalkyl) fluorenes such as 9,9-bis(cyanomethyl) fluorene; and 9,9-bis(aminoalkyl) fluorenes such as 9,9-bis(3-aminopropyl) fluorene. They may be copolymers with other copolymerizable monomers.

Generally known methods such as ring opening polymerization and addition polymerization can be used for the polymerization of the monomers described above.

<Component (B)>

The resin composition according to the present invention contains a phenol resin as the compound (B), and the compound (B) has a structure as represented by the general formula (3).

[Chemical formula 12]

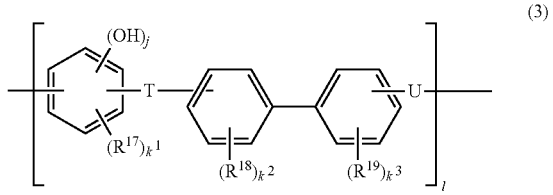

(3)

In the general formula (3), $R^{17}$, $R^{18}$, and $R^{19}$ each denote a monovalent organic group containing 1 to 20 carbon atoms; T and U each independently denote an alkylene group or alkylene oxide group containing 1 to 20 carbon atoms; j denotes an integer of 1 to 3; $k^1$, $k^2$, and $k^3$ each denote an integer of 0 to 2; and I denotes an integer of 3 to 100.

Examples of $R^{17}$, $R^{18}$, and $R^{19}$ include, but not limited to, a group selected from hydroxyl group, carboxy group, sulfonic group, and thiol group, and a group selected from an aliphatic group containing 1 to 20 carbon atoms that may have an unsaturated bond, an alicyclic group containing 3 to 20 carbon atoms, and an aromatic group containing 6 to 20 carbon atoms.

Although j denotes an integer of 1 to 3, it is preferable for j to be an integer of 1 or 2, and it is more preferable for j to be the integer of 1 to develop an appropriate degree of alkali-solubility.

Since the component (B) has the aforementioned structure, it ensures improved resistance to flux used for welding and its combined use with the component (C) described below ensures improved reflow resistance Specifically, it acts to reduce the metal oxidation caused by external moisture, oxygen, photosensitive agent, etc., in the reflow step that involves high temperature treatment and also depress the peeling between the cured film and metal or between metal and metal oxides. Furthermore, it works to develop a thick film processability to permit high sensitivity processing even when forming a thick cured film of 15 μm or more.

It is preferable for the component (B) to be a resin containing a structure described below, though it is not limited to the undermentioned structure.

[Chemical formula 13]

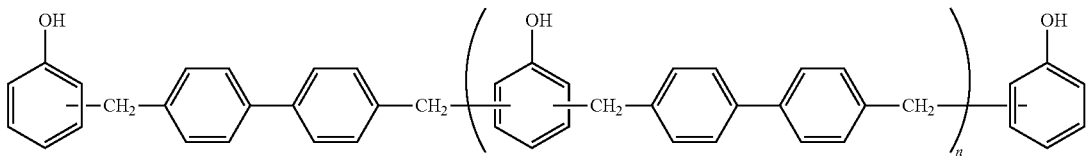

In the above formula, n denotes an integer of 2 to 99.

Specific examples of substances as represented by the above formula (3) include, but not limited to, the MEHC-7851 series phenol resins manufactured by Meiwa Plastic Industries, Ltd.

The component (B) preferably has a weight average molecular weight of 700 or more and 50,000 or less. If its weight average molecular weight is 700 or more, it ensures improved resistance to flux used for welding and its combined use with the component (C) described below ensures improved reflow resistance. On the other hand, if it has a weight average molecular weight of 25,000 or less, it serves to improve the compatibility with the component (A) and the developability with various developers, and if it has a weight average molecular weight of 9,000 or less, furthermore, it serves to further improve the compatibility with the component (A).

The component (B) preferably accounts for 5 parts by mass or more from the viewpoint of flux resistance and more preferably accounts for 10 parts by mass or more from the viewpoint of thick film processability and reflow resistance, relative to 100 parts by mass of the component (A). From the viewpoint of the compatibility with the component (A) and reflow resistance, the content is preferably 49 parts by mass or less, more preferably 19 parts by mass or less relative to 100 parts by mass of the component (A).

<Component [C]>

The resin composition according to the present invention contains an antioxidant as the component (C). Examples of the component (C) include compounds as represented by the general formula (5) given below, but it is not limited to the undermentioned structure.

[Chemical formula 14]

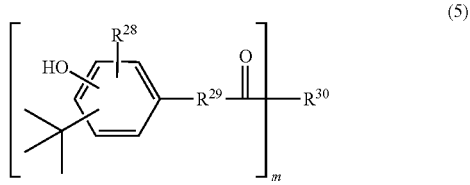

(5)

In general formula (5), $R^{28}$ denotes a hydrogen atom or an alkyl group containing 1 to 15 carbon atoms and $R^{29}$ denotes an alkylene group containing 2 or more carbon atoms. $R^{30}$ denotes a monovalent to tetravalent organic group that contains at least one selected from the group consisting of alkyl groups containing 1 or more carbon atoms, alkylene groups containing 1 or more carbon atoms, C atom, O atom, and N atom. In addition, m denotes an integer of 1 to 4.

Examples of $R^{30}$ include a quaternary carbon group, tertiary carbon group, secondary carbon group, alkyl group, cycloalkyl group, alkoxy group, alkyl ether group, alkylsilyl group, alkoxysilyl group, aryl group, aryl ether group, carboxy group, carbonyl group, allyl group, vinyl group, heterocyclic group, —O—, —NH—, —NHNH—, and combinations thereof, which may contain substituent groups. Of these, the use of an alkyl ether group or —NH— is preferred from the viewpoint of the solubility in developers and adhesion to metal and the use of —NH— is more preferred from the viewpoint of the interaction with the component (A) and adhesion to metal through metal complex formation.

The inclusion of the component (C) serves to depress the oxidative degradation of aliphatic groups and hydroxyl groups in the component (A). Furthermore, the combined use with the component [B] serves to improve the reflow resistance. Specifically, it acts to reduce the metal oxidation caused by external moisture, oxygen, photosensitive agent, etc., in the reflow step that involves high temperature treatment and also depress the peeling between the cured film and metal or between metal and metal oxides. Specific examples of the component (C) include, but not limited to, the following compounds.

[Chemical formula 15]

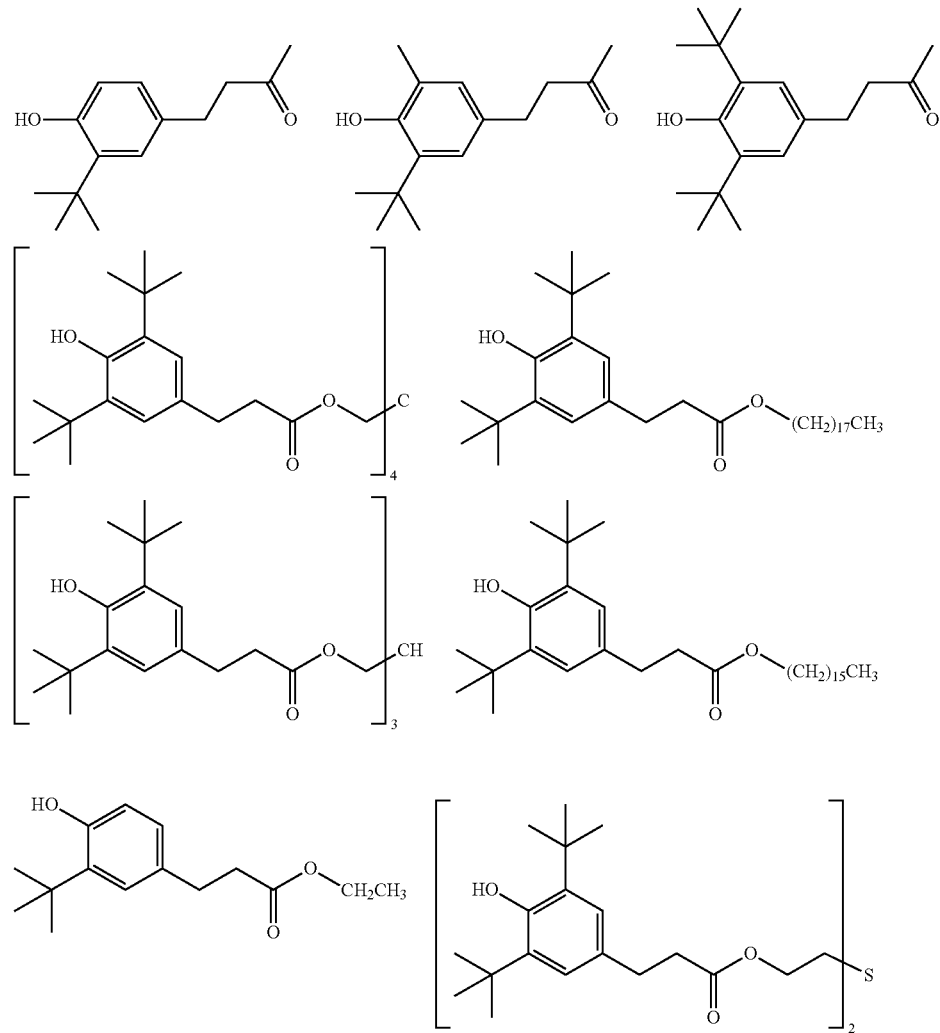

-continued
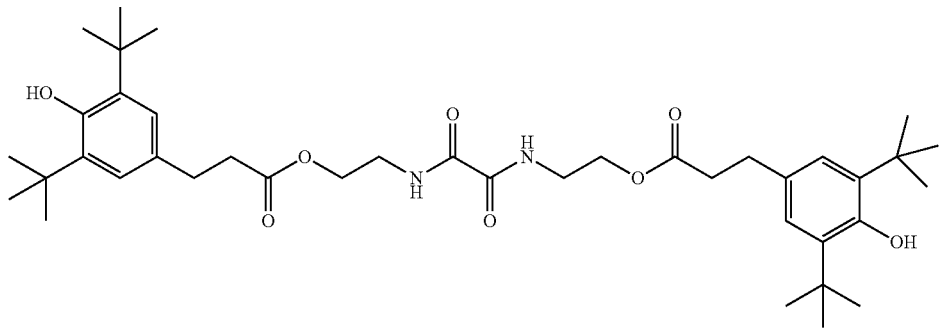
[Chemical formula 16]
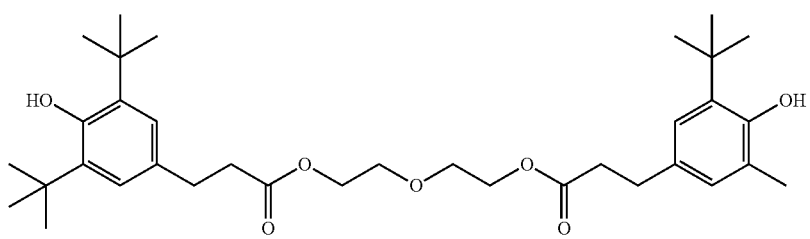
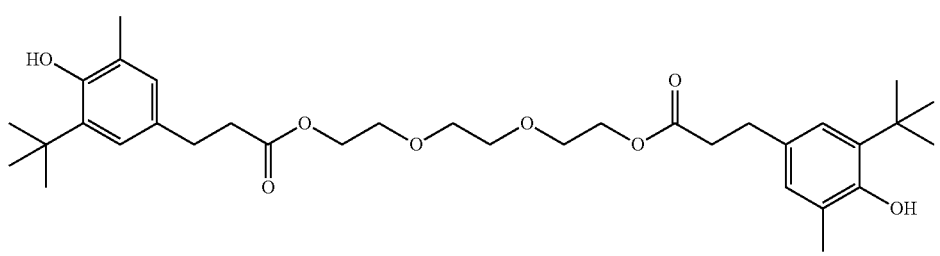
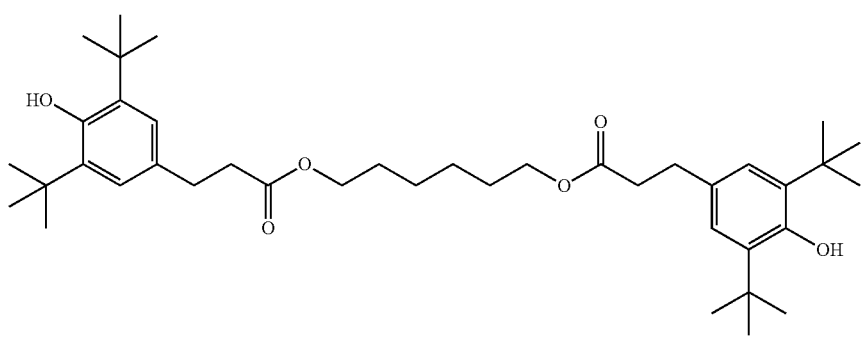
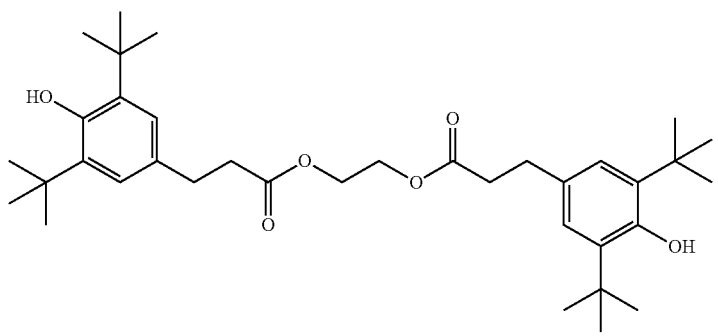

-continued
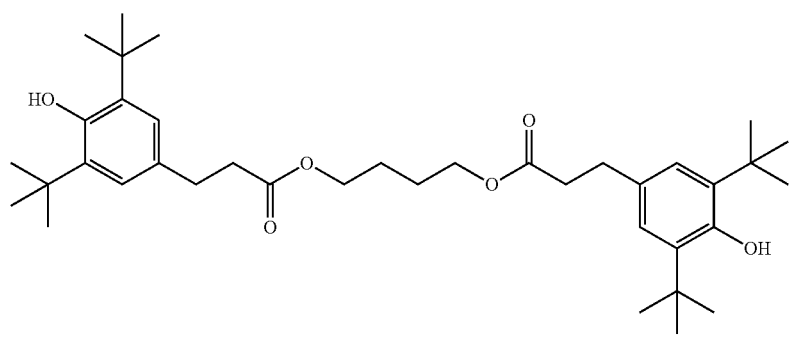
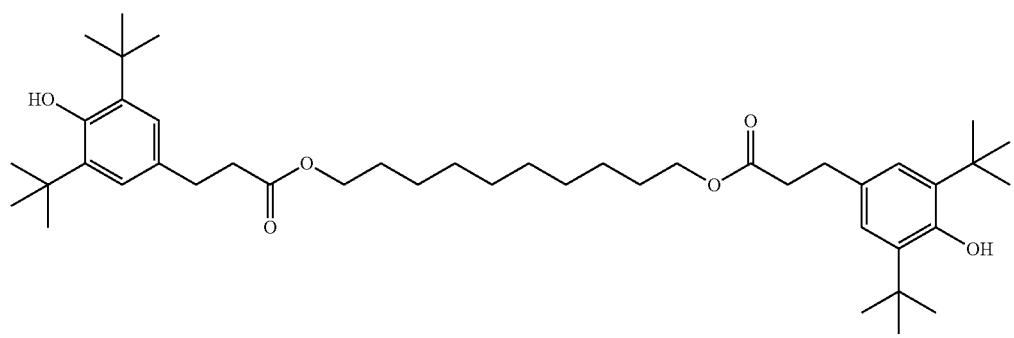
[Chemical formula 17]
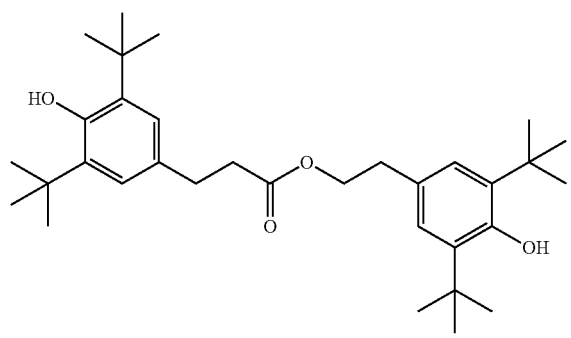
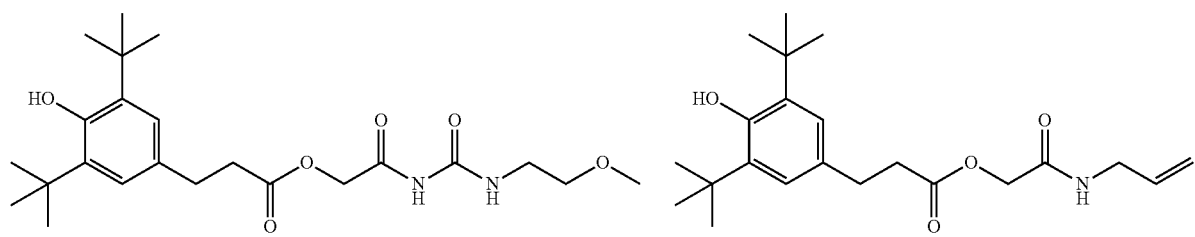
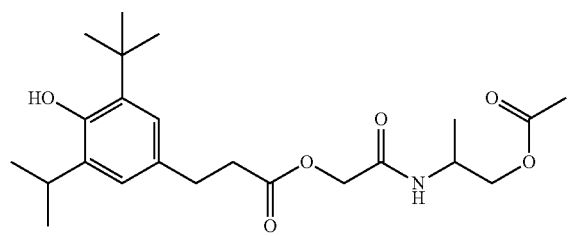
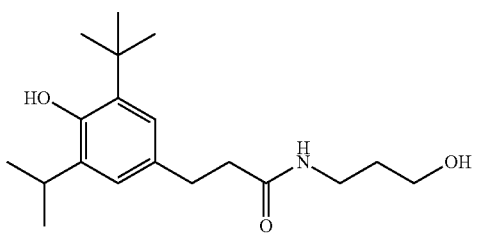

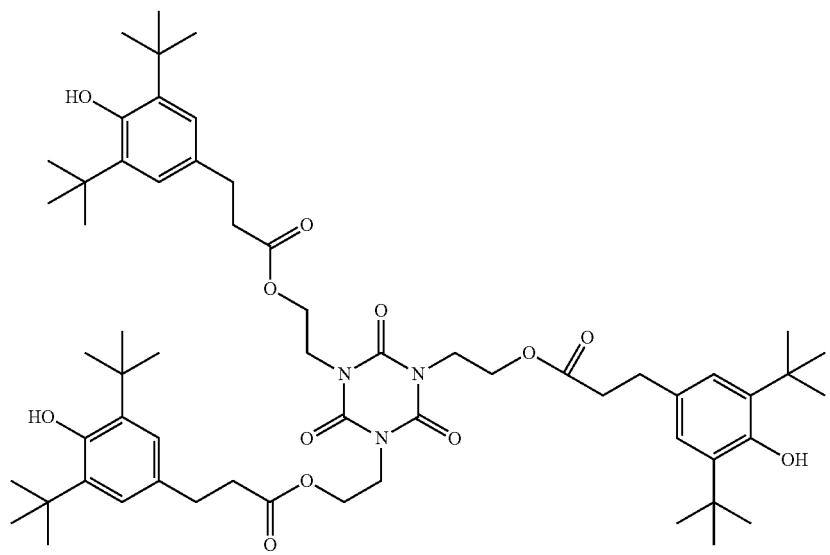
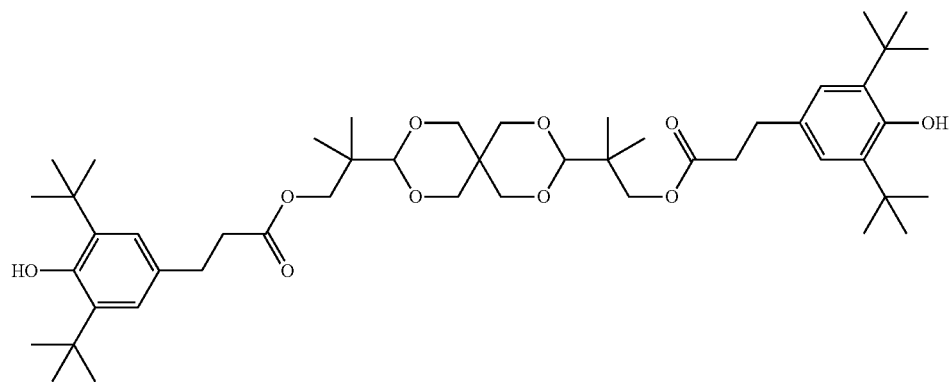
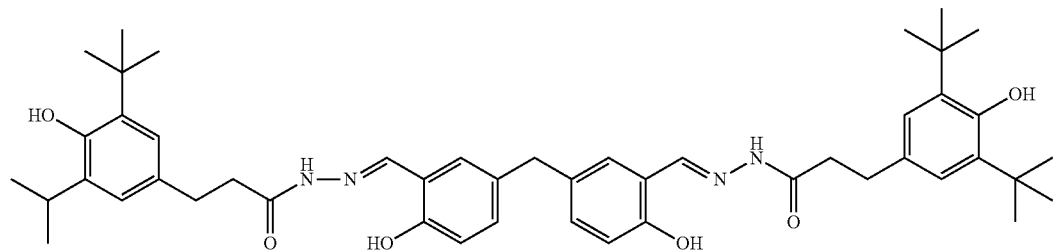
[Chemical formula 18]
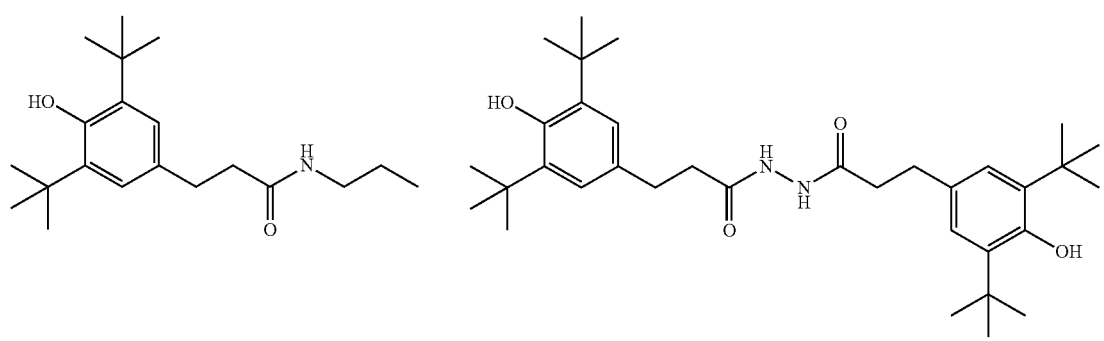

-continued
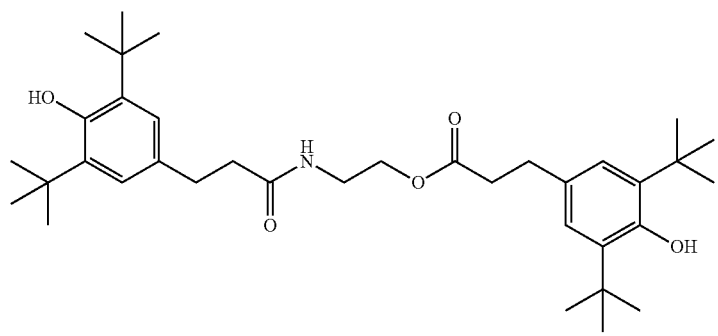
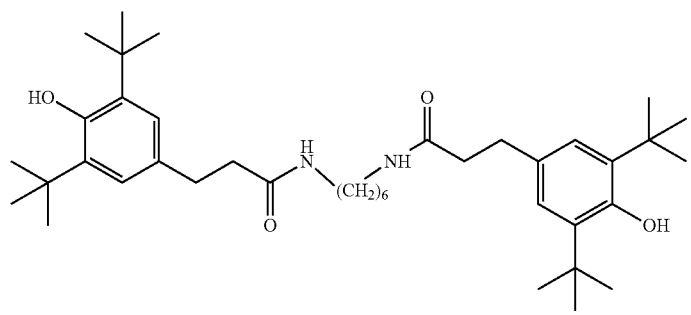
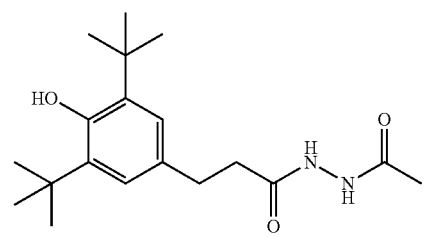
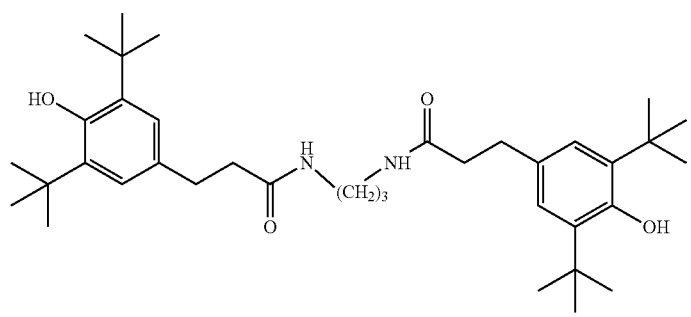
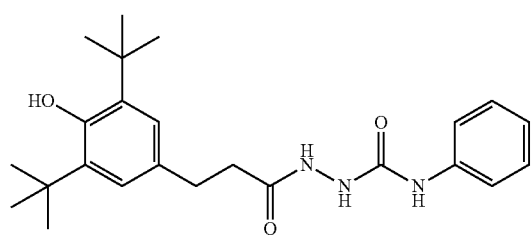
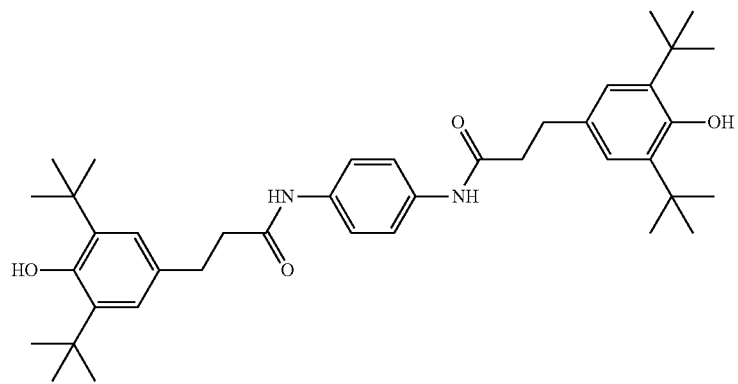

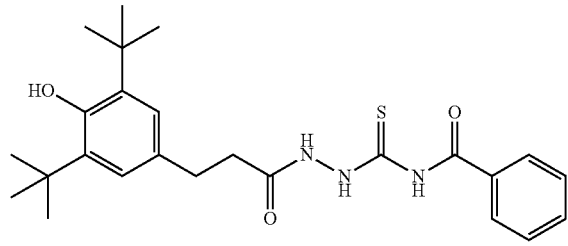

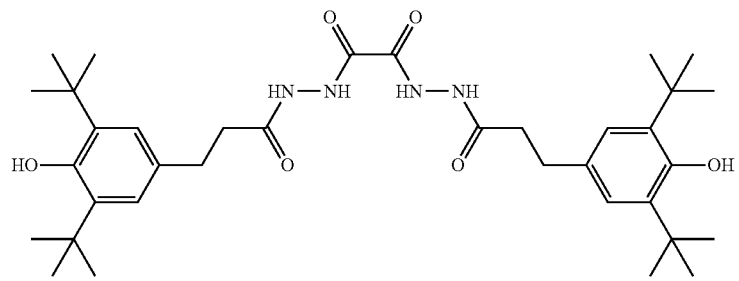

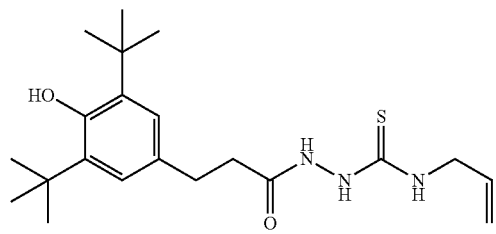

The quantity of the component (C) added, on the other hand, preferably accounts for 0.1 to 10 parts by mass, more preferably 0.2 to 5 parts by mass, relative to 100 parts by mass of the component (A). An addition of 0.1 part by mass or more serves to depress the oxidative degradation and improve the reflow resistance. If the addition is 10 parts by mass or less, it serves to maintain the sensitivity of the resin composition.

<Component (D)>

The resin composition according to the present invention may contain a heat crosslinking agent as (D) (hereinafter occasionally referred to as the component (D)). A thermal crosslinking agent is a resin or a compound that contains at least two thermally reactive functional groups in one molecule. Examples of the thermally reactive functional groups include alkoxymethyl groups, methylol groups, and cyclic ether groups.

One or more compounds selected from alkoxymethyl compounds and methylol compounds (hereinafter occasionally referred to as the component (D-1)) may be used as the thermal crosslinking agent. The inclusion of the component (D-1) serves to further strengthen the crosslinks and increase the chemical resistance to flux liquids etc. of the cured film.

Specific examples of the component (D-1) include, but not limited to, the structures given below such as methylol compounds and alkoxymethyl compounds produced by replacing a hydrogen atom in the methylol group with a methyl group or an alkyl group containing 2 to 10 carbon atoms.

[Chemical formula 19]

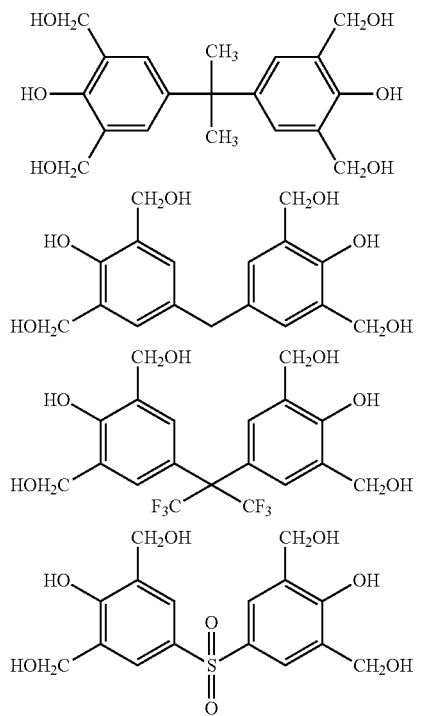

-continued
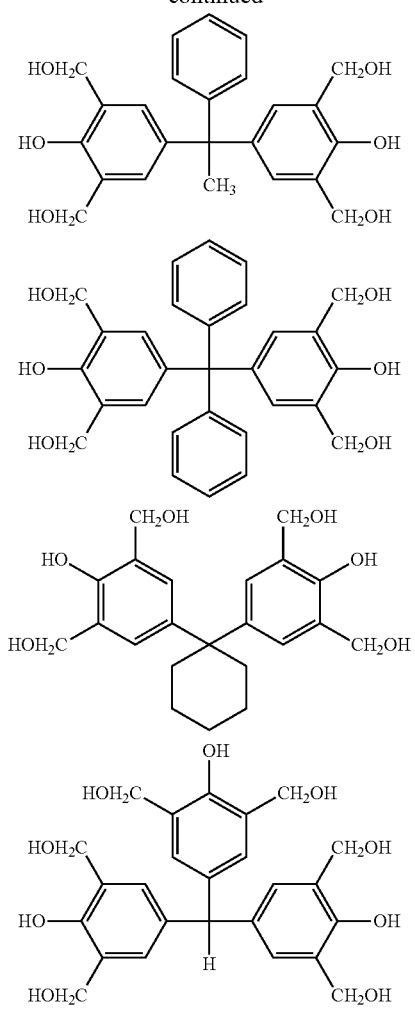
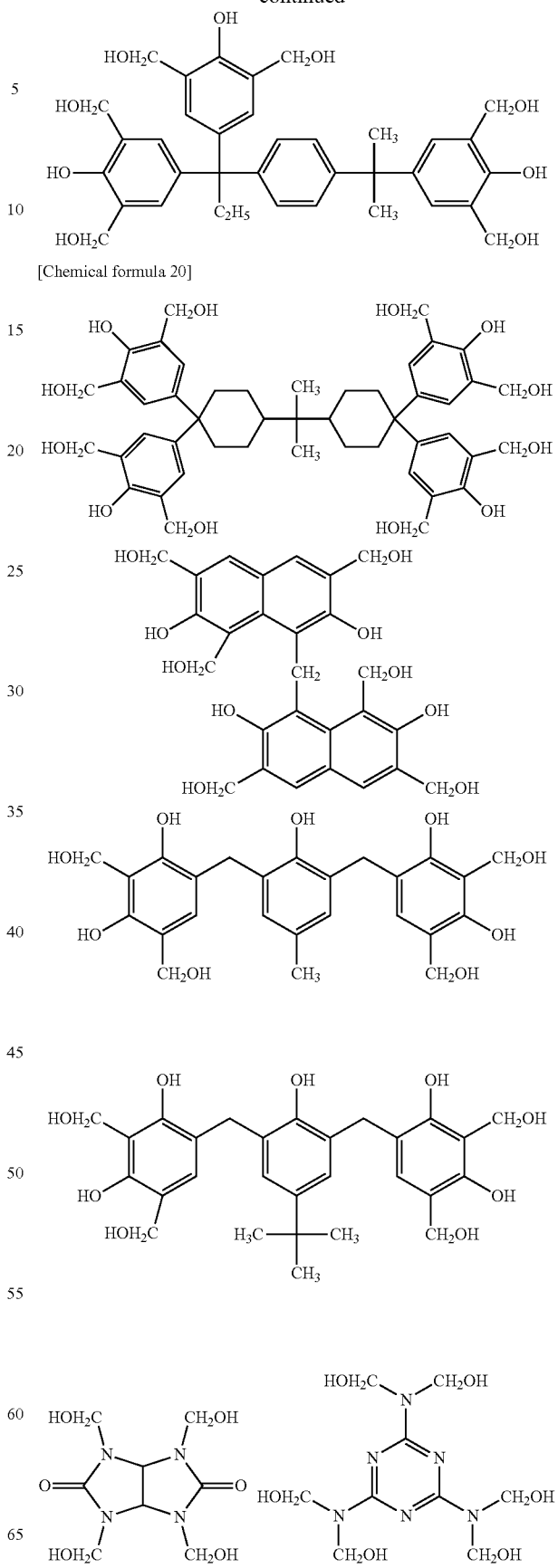

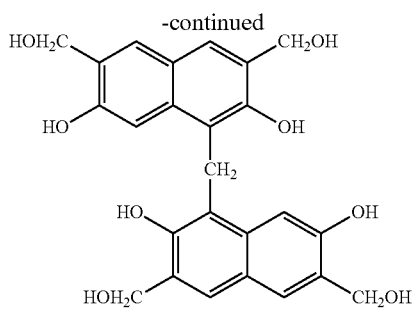

Furthermore, one or more cyclic ether groups (hereinafter occasionally referred to as the component (D-2)) may be contained as the component (D). The inclusion of the component (D-2) serves to allow the reaction to proceed at a low temperature of 160° C. or lower, further strengthen the crosslinks, and increase the chemical resistance of the cured film.

Specific examples of the component (D-2) include Denacol (registered trademark) EX-212L, Denacol EX-214L, Denacol EX-216L, Denacol EX-850L, and Denacol EX-321L (all manufactured by Nagase ChemteX Corporation), GAN and GOT (both manufactured by Nippon Kayaku Co., Ltd.), Epikote (registered trademark) 828, Epikote 1002, Epikote 1750, Epikote 1007, YX4000, YX4000H, YX8100-BH30, E1256, E4250, and E4275 (all manufactured by Mitsubishi Chemical Corporation), Epicron (registered trademark) 850-S, Epicron HP-4032, Epicron HP-7200, Epicron HP-820, Epicron HP-4700, Epicron HP-4770, and Epicron HP4032 (all manufactured by DIC Corporation), TECHMORE VG3101L (manufactured by Printec, Inc.), Tepic (registered trademark) S, Tepic G, and Tepic P (all manufactured by Nissan Chemical Industries, Ltd.), Epotohto YH-434L (manufactured by Tohto Kasei Co., Ltd.), EPPN502H, NC-3000, NC-6000, and XD-1000 (all manufactured by Nippon Kayaku Co., Ltd.), Epicron N695 and HP7200 (both manufactured by DIC Corporation), Eternacoll (registered trademark) EHO, Eternacoll OXBP, Eternacoll OXTP, and Eternacoll OXMA (all manufactured by Ube Industries, Ltd.), and oxetanized phenol novolac.

Of these, substances having a triaryl methane structure or a biphenyl structure are preferred. Specific examples include YX4000 and YX4000H (both manufactured by Mitsubishi Chemical Corporation), TECHMORE VG3101L (manufactured by Printec, Inc.), and NC-3000.

In addition, one or more compound having a structural unit as represented by the general formula (6) given below (hereinafter occasionally referred to as the component (D-3)) may be contained as the component (D).

[Chemical formula 21]

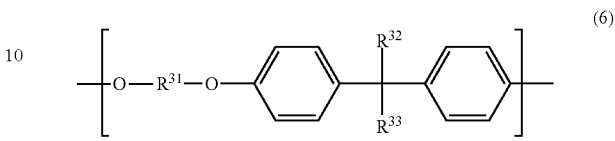

In the general formula (6), $R^{31}$ denotes a divalent organic group having an alkylene group or an alkylene ether group containing 1 or more and 15 or less carbon atoms, and such groups include, for example, methylene group, ethylene group, propylene group, butylene group, ethylene oxide group, propylene oxide group, and butylene oxide group, which may be linear, branched, or cyclic. Furthermore, some of the substituent groups in the divalent organic group having an alkylene group or an alkylene ether group containing 1 or more and 15 or less carbon atoms may have one or a combination of the following: cyclic ether groups, alkylsilyl groups, alkoxysilyl groups, aryl groups, aryl ether groups, carboxy groups, carbonyl groups, allyl groups, vinyl groups, heterocyclic groups, and other substituent groups. $R^{32}$ and $R^{33}$ each independently denote a hydrogen atom or a methyl group group.

Since the component (D-3) itself has a flexible alkylene group and a rigid aromatic group, the inclusion of the component (D-3) serves to produce a cured film that is higher in elongation property and lower in stress while maintaining heat resistance.

There are no specific limitations on the crosslink group contained in the component (D-3), but examples include acrylic group, methylol group, alkoxy methyl group, and cyclic ether group.

Of these, cyclic ether groups are preferred because they can react with hydroxyl groups in the component (A) to provide a cured film with improved heat resistance and also because they can react without undergoing dehydration.

Specific examples of compounds that contain structural units as represented by the general formula (6) include, but not limited to, those having structures as described below.

[Chemical formula 22]

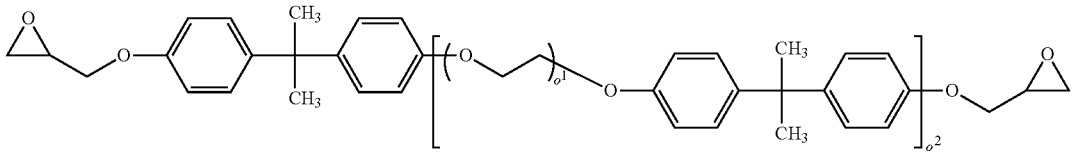

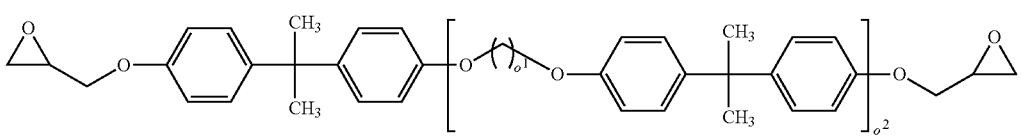

-continued

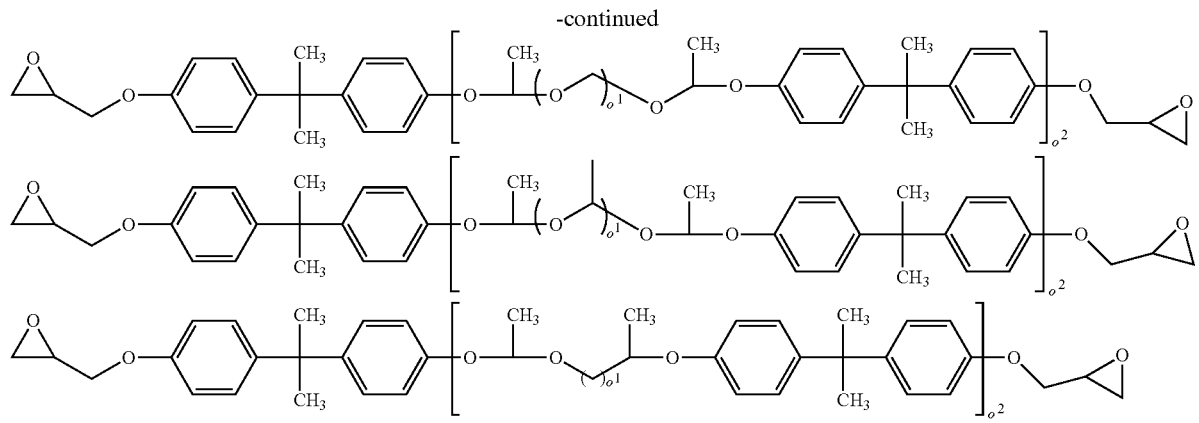

In the formulae, $o^2$ denotes an integer of 1 to 5 and $o^1$ denotes an integer of 1 to 20. In order to ensure both improved heat resistance and elongation property, it is preferable that $o^2$ is 1 to 2 and $o^1$ is 3 to 7.

Two or more of the above structures may be contained in combination as the component (D).

The component (D) preferably accounts for 5 parts by mass or more, more preferably 10 parts by mass or more, relative to 100 parts by mass of the component (A) from the viewpoint of producing a cured film having high, for example, chemical resistance to flux liquids. It preferably accounts for 100 parts by mass or less, more preferably 90 parts by less more, and still more preferably 80 parts by less more, relative to 100 parts by mass of the component (A) from the viewpoint of producing a cured film having, for example, high chemical resistance to flux liquids while allowing the resin composition to maintain a long pot life and in addition, preventing the separation of metal wiring and cracks in the cured film after reliability test of the metal wiring to which the cured film is applied.

<Component (E)>

The resin composition according to the present invention may contain a photosensitive agent as (E) (hereinafter occasionally referred to as the component (E)). The inclusion of the component (E) serves to impart photosensitive property to a resin composition.

The component (E) is a compound in which the chemical structure changes in response to ultraviolet ray, and examples thereof include photoacid generating agent, photobase generating agent, and photo-initiator. If a photoacid generating agent is used as the component (E), it works to produce an acid in the irradiated portion of the resin composition so that the irradiated portion increases in solubility in the alkaline developer, thus providing a positive type pattern in which the irradiated portion is dissolvable.

If a photobase generating agent is used as the component (E), it works to produce a base in the irradiated portion of the resin composition so that the irradiated portion decreases in solubility in the alkaline developer, thus providing a negative type pattern in which the irradiated portion is insoluble.

If a photo initiator is used as the component (E), it works to produce radicals to cause polymerization in the irradiated portion of the resin composition so that the portion becomes insoluble in the alkaline developer, thus forming a negative type pattern. Furthermore, the UV curing in the light irradiation step is promoted to improve the sensitivity.

Of the above substances for the component (E), the use of a photoacid generating agent is preferred because it serves to produce a high-resolution pattern with high sensitivity. Examples of the photoacid generating agent include quinonediazide compounds, sulfonium salts, phosphonium salts, diazonium salts, and iodonium salts. In addition, a sensitization agent etc. may also be added as required.

It is preferable for the quinonediazide compound to have a structure in which a sulfonic acid of naphthoquinonediazide is connected through an ester bond to a compound having a phenolic hydroxyl group. Compounds having phenolic hydroxyl groups that are useful here include those produced by introducing 4-naphthoquinonediazide sulfonic acid or 5-naphthoquinonediazide sulfonic acid through an ester bond into compounds as follows: Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (trade names, all manufactured by Honshu Chemical Industry Co., Ltd.), BIR—OC, BIP-PC, BIR—PC, BIR-PTBP, BIR—PCHP, BIP—BIOC—F, 4PC, BIR—BIPC—F, TEP-BIP-A, 46DMOC, 46DMOEP, and TM-BIP-A (trade names, all manufactured by Asahi Organic Chemicals Industry Co., Ltd.), and 2,6-dimethoxymethyl-4-tert-butyl phenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylene bisphenol, and BisP-AP (trade names, all manufactured by Honshu Chemical Industry Co., Ltd.), although other compounds may also be used.

It is preferable that 50 mol % or more of the functional groups in these compounds having phenolic hydroxide groups are substituted by quinonediazide. If the quinonediazide used is substituted up to 50 mol % or more, the affinity of the quinonediazide compound with an aqueous alkali solution will decrease. As a result, the resin composition in the unirradiated portion decreases largely in solubility in an aqueous alkali solution. Furthermore, light irradiation works to convert the quinonediazide sulfonyl group into an indene carboxylic acid, and the photosensitive resin composition in the light-irradiated portion largely increases in the rate of dissolution in an aqueous alkali solution. Thus, this results in a large ratio in dissolution ratio between the irradiated portion and the unirradiated portion of the composition, thereby making it possible to form a pattern with high resolution.

The inclusion of such a quinonediazide compound enables the production of a positive type photosensitive resin composition that is photosensitive not only to the i-line (365 nm), h-line (405 nm), or g-line (436 nm) of a common mercury lamp, but also to broad band light that contains them. Furthermore, the useful compounds for the component (E) may be contained singly or two or more of them may be contained in combination to provide a highly photosensitive resin composition.

As the quinonediazide, both 5-naphthoquinonediazide sulfonyl group and 4-naphthoquinonediazide sulfonyl group can be used suitably. A 5-naphthoquinonediazide sulfonyl ester compound absorbs light in a region including the g-line of a mercury lamp, and therefore, it is suitable for g-line irradiation or full wavelength range irradiation. A 4-naphthoquinonediazide sulfonyl ester compound absorbs light in the i-line range of mercury lamps, and therefore, it is suitable for i-line irradiation. It is preferable to adopt either a 4-naphthoquinonediazide sulfonyl ester compound or a 5-naphthoquinonediazide sulfonyl ester compound depending on the wavelength of the light used for irradiation.

It is also possible to obtain a naphthoquinonediazide sulfonyl ester compound that contains both a 4-naphthoquinonediazide sulfonyl group and a 5-naphthoquinonediazide sulfonyl group in one molecule. It may also be good to use a 4-naphthoquinonediazide sulfonyl ester compound and a 5-naphthoquinonediazide sulfonyl ester compound in combination.

A quinonediazide compound can be synthesized by a generally known method through esterification reaction between a compound containing a phenolic hydroxyl group and a quinonediazide sulfonic acid compound. The use of a quinonediazide compound serves to further improve the resolution, sensitivity, and residual film percentage.

The molecular weight of the component (E) is preferably 300 or more, more preferably 350 or more, and preferably 3,000 or less, more preferably 1,500 or less, from the viewpoint of the heat resistance, mechanical property, and adhesiveness of the film resulting from heat treatment.

Of the useful substances for the component (E), sulfonium salts, phosphonium salts, and diazonium salts are preferred because they can stabilize moderately the acid component produced by light irradiation. The use of a sulfonium salt is particularly preferred.

It is preferable for the component (E) to account for 0.1 part by mass or more and 100 parts by mass or less relative to 100 parts by mass of the component (A). If accounting for 0.1 part by mass or more and 100 parts by mass or less, the component (E) can work to develop photosensitivity while serving to produce a heat-treated film with high heat resistance, chemical resistance, and mechanical property.

If the component (E) contains a quinonediazide compound, it is more preferable for the component (E) to account for 1 part by mass or more, still more preferably 3 parts by mass or more, relative to 100 parts by mass of the component (A). On the other hand, its content is more preferably 100 parts by mass or less, still more preferably 80 parts by mass or less. If accounting for 1 part by mass or more and 100 parts by mass or less, it can work to develop photosensitivity while serving to produce a heat-treated film with high heat resistance, chemical resistance, and mechanical property.

If the component (E) contains a sulfonium salt, phosphonium salt, or diazonium salt, it is more preferable for the component (E) to account for 0.1 part by mass or more, still more preferably 1 part by mass or more, and particularly preferably 3 parts by mass or more, relative to 100 parts by mass of the component (A). On the other hand, its content is more preferably 100 parts by mass or less, still more preferably 80 parts by less, and particularly preferably 50 parts by mass or less. If accounting for 0.1 part by mass or more and 100 parts by mass or less, it can work to develop photosensitivity while serving to produce a heat-treated film with high heat resistance, chemical resistance, and mechanical property.

If a photobase generating agent is to be used as the component (E), examples of good photobase generating agents include amide compounds and ammonium salts.

Such amide compounds include, for example, 2-nitrophenylmethyl-4-methacryloyloxy piperidine-1-carboxylate, 9-anthrylmethyl-N,N-dimethyl carbamate, 1-(anthraquinone-2-yl) ethylimidazole carboxylate, and (E)-1-[3-(2-hydroxyphenyl)-2-propenoyl]piperidine.

Such ammonium salts include, for example, 1,2-diisopropyl-3-(bisdimethylamino) methylene) guanidium 2-(3-benzoylphenyl) propionate, (Z)-{[bis(dimethylamino) methylidene]amino}-N-cyclohexylamino) methaniumtetrakis(3-fluorophenyl) borate, and 1,2-dicyclohexyl-4,4,5,5-tetramethylbiguanidium n-butyltriphenyl borate When a photobase generating agent is contained as the component (E), it is preferable for the component (E) in the resin composition to account for 0.1 part by mass or more, more preferably 0.5 part by mass or more, still more preferably 0.7 part by mass or more, and particularly preferably 1 part by mass or more, relative to 100 parts by mass of the component (A). A content in the above range ensures an improved sensitivity in the light irradiation step. On the other hand, the content is preferably 25 parts by mass or less, more preferably 20 parts by mass or less, still more preferably 17 parts by mass or less, and particularly preferably 15 parts by mass or less. A content in the above range ensures an improved resolution after the development step.

When a photo-initiator is contained as the component (E), examples of preferred photo-initiators include benzyl ketal based photo-initiators, α-hydroxyketone based photo-initiators, α-aminoketone based photo-initiators, acylphosphine oxide based photo-initiators, oxime ester based photo-initiators, acridine based photo-initiators, benzophenone based photo-initiators, acetophenone based photo-initiators, aromatic keto ester based photo-initiators, benzoic ester based photo-initiators, and titanocene based photo-initiators. From the viewpoint of improvement in sensitivity during light irradiation, preferred ones include α-hydroxyketone based photo-initiators, α-aminoketone based photo-initiators, acylphosphine oxide based photo-initiators, oxime ester based photo-initiators, acridine based photo-initiators, and benzophenone based photo-initiators, of which α-aminoketone based photo-initiators, acylphosphine oxide based photo-initiators, and oxime ester based photo-initiators are more preferable.

Examples of the benzyl ketal based photo-initiators include 2,2-dimethoxy-1,2-diphenylethane-1-one.

Examples of the α-hydroxyketone based photo-initiators include 1-(4-isopropylphenyl)-2-hydroxy-2-methylpropane-1-one, 2-hydroxy-2-methyl-1-phenylpropane-1-one, 1-hydroxycyclohexylphenyl ketone, 1-[4-(2-hydroxyethoxy) phenyl]-2-hydroxy-2-methylpropane-1-one, and 2-hydroxy-1-[4-[4-(2-hydroxy-2-methylpropionyl) benzyl]phenyl]-2-methylpropane-1-one.

Examples of the α-aminoketone based photo-initiators include 2-dimethylamino-2-methyl-1-phenylpropane-1-one, 2-diethylamino-2-methyl-1-phenylpropane-1-one, 2-methyl-2-morpholino-1-phenylpropane-1-one, 2-dimethylamino-2-methyl-1-(4-methylphenyl) propane-1-one, 2-dimethylamino-1-(4-ethyl phenyl)-2-methylpropane-1-one, 2-dimethylamino-1-(4-isopropyl phenyl)-2-methylpropane-1-one, 1-(4-butylphenyl)-2-dimethylamino-2-methylpropane-1-one, 2-dimethylamino-1-(4-methoxyphenyl)-2-methylpropane-1-one, 2-dimethylamino-2-methyl-1-(4-methylthiophenyl) propane-1-one, 2-methyl-1-(4-methylthiophenyl)-2-morpholinopropane-1-one, 2-benzyl-2-dimethylamino-1-(4-morpholinophenyl)-butane-1-one, 2-benzyl-2-dimethylamino-1-(4-dimethylaminophenyl)-butane-1-one, and 2-dimethylamino-2-[(4-methylphenyl) methyl]-1-[4-(4-morpholinyl) phenyl]-1-butanone.

Examples of the acylphosphine oxide based photo-initiators include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester based photo-initiators include 1-phenylpropane-1,2-dione-2-(O-ethoxycarbonyl) oxime, 1-phenylbutane-1,2-dione-2-(O-methoxycarbonyl) oxime, 1,3-diphenylpropane-1,2,3-trione-2-(O-ethoxycarbonyl) oxime, 1-[4-(phenylthio) phenyl]octane-1,2-dione-2-(O-benzoyl) oxime, 1-[4-[4-(carboxyphenyl) thio]phenyl] propane-1,2-dione-2-(O-acetyl) oxime, 1-[9-ethyl-6-(2-methylbenzoyl)-9H-carbazole-3-yl]ethanone-1-(O-acetyl) oxime, 1-[9-ethyl-6-[2-methyl-4-[1-(2,2-dimethyl-1,3-dioxolan-4-yl) methyloxy]benzoyl]-9H-carbazole-3-yl]ethanone-1-(O-acetyl) oxime, and Adeka Kluse (registered trademark) NCI-831.

Examples of the acridine based photo-initiators include 1,7-bis(acridine-9-yl)-n-heptane.

Examples of the benzophenone based photo-initiators include benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzylketone, and fluorenone.

Examples of the acetophenone based photo-initiators include 2,2-diethoxyacetophenone, 2,3-diethoxyacetophenone, 4-t-butyldichloroacetophenone, benzalacetophenone, an 4-azidebenzalacetophenone.

Examples of the aromatic keto ester based photo-initiators include methyl 2-phenyl-2-oxyacetate.

Examples of the benzoic ester based photo-initiators include ethyl 4-(dimethylamino)benzoate, (2-ethyl)hexyl 4-(dimethylamino)benzoate, ethyl 4-(diethylamino)benzoate, and methyl 2-benzoylbenzoate.

Examples of the titanocene based photo-initiators include bis($\eta^5$-2,4-cyclopentadiene-1-yl)-bis[2,6-difluoro)-3-(1H-pyrrole-1-yl)phenyl]titanium (IV) and bis($\eta^5$-3-methyl-2,4-cyclopentadiene-1-yl)-bis(2,6-difluorophenyl) titanium (IV).

When a photo-initiator is contained as the component (E), it is preferable for the component (E) in the resin composition to account for 0.1 part by mass or more, more preferably 0.5 part by mass or more, still more preferably 0.7 part by mass or more, and particularly preferably 1 part by mass or more, relative to 100 parts by mass of the component (A). A content in the above range ensures an improved sensitivity in the light irradiation step. On the other hand, the content is preferably 25 parts by mass or less, more preferably 20 parts by mass or less, still more preferably 17 parts by mass or less, and particularly preferably 15 parts by mass or less. A content in the above range ensures an improved resolution after the development step.

<Component (F)>

If a photo-initiator is contained as the component (E), it is preferable to further contain a radical polymerizable compound as (F) (hereinafter occasionally referred to as component (F)).

The component (F) is a compound that has a plurality of ethylenically unsaturated double bond groups in its molecule. When a photo-initiator is contained as the component (E) and the component (F) is also contained, radicals generated from the photo-initiator in the light irradiation step acts to cause radical polymerization of the radical polymerizable compound, and the irradiated portion of the film of the resin composition becomes insoluble in the alkaline developer, thereby serving to form a negative type pattern. The inclusion of the component (F) in the resin composition serves to accelerate the UV curing in the irradiation step to ensure improved sensitivity in the irradiation step. In addition, the crosslinking density after the heat curing step will increase and accordingly, the cured film produced by curing the resin composition will have an improved hardness.

The component (F) is preferably a compound having a methacrylic group and/or acrylic group (hereinafter occasionally referred to collectively as (meth)acrylic groups. Compound names are also occasionally abbreviated similarly) that can undergo rapid radical polymerization. It is more preferable for the compound to have two or more (meth)acrylic groups in the molecule from the viewpoint of ensuring an improved sensitivity in the irradiation step and producing a cured film with an increased hardness. The radical polymerizable compound preferably has a double bond equivalent of 80 to 400 g/mol from the viewpoint of ensuring an improved sensitivity in the irradiation step and producing a cured film with an increased hardness.

Examples of the component (F) include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol tricyclodecane di(meth)acrylate, ethoxylated glycerin tri(meth)acrylate, pentaerythritol tri(meth) acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipenta erythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy) phenyl]propane, 1,3,5-tris-((meth)acryloxyethyl) isocyanuric acid, 1,3-bis((meth)acryloxyethyl) isocyanuric acid, 9,9-bis[4-(2-(meth)acryloxyethoxy) phenyl]fluorene, 9,9-bis[4-(3-(meth)acryloxypropoxy) phenyl] fluorene, and 9,9-bis(4-(meth)acryloxyphenyl) fluorene, as well as acid-modified forms thereof, ethylene oxide-modified forms thereof, and propylene oxide-modified forms thereof.

From the viewpoint of ensuring an improved sensitivity in the irradiation step and producing a cured film with an increased hardness, preferred are trimethylolpropane tri(meth)acrylate, ditrimethylolpropane tri(meth)acrylate, ditrimethylolpropane tetra(meth)acrylate, pentaerythritol tri (meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy) phenyl]propane, 1,3,5-tris-((meth) acryloxyethyl) isocyanuric acid, 1,3-bis((meth) acryloxyethyl) isocyanuric acid, 9,9-bis[4-(2-(meth) acryloxyethoxy) phenyl]fluorene, 9,9-bis[4-(3-(meth) acryloxypropoxy) phenyl]fluorene, and 9,9-bis(4-(meth) acryloxyphenyl) fluorene, as well as acid-modified forms thereof, ethylene oxide-modified forms thereof, and propylene oxide-modified forms thereof, of which acid-modified forms thereof and ethylene oxide-modified forms thereof are more preferable from the viewpoint of ensuring an improved resolution after the development step. From the viewpoint of ensuring an improved resolution after the development step, furthermore, also preferable are compounds that are produced by subjecting a compound having two or more glycidoxy groups in the molecule and an unsaturated carboxylic acid having an ethylenically unsaturated double bond group to a ring-opening addition reaction and then reacting the resulting compound with a polybasic carboxylic acid or a polybasic carboxylic anhydride.

It is preferable for the component (F) to account for 1 part by mass or more, more preferably 5 parts by mass or more, still more preferably 8 parts by mass or more, and particularly preferably 10 parts by mass or more, relative to 100 parts by mass of the component (A). A content in the above range ensures an improved sensitivity in the light irradiation step. On the other hand, the content is preferably 65 parts by mass or less, more preferably 60 parts by mass or less, still more preferably 55 parts by mass or less, and particularly preferably 50 parts by mass or less. A content in the above range ensures the production of a cured film having an improved heat resistance.

<Compound Having a Phenolic Hydroxyl Group>

The resin composition according to the present invention may contain a compound having a phenolic hydroxyl group in order to supplement the alkali-developability. Examples of the compound having a phenolic hydroxyl group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylene-tris-FR-CR, BisRS-26X, BisRS-OCHP, (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A (trade names, manufactured by Asahi Organic Chemicals Industry Co., Ltd.), 1,4-dihydroxy naphthalene, 1,5-dihydroxy naphthalene, 1,6-dihydroxy naphthalene, 1,7-dihydroxy naphthalene, 2,3-dihydroxy naphthalene, 2,6-dihydroxy naphthalene, 2,7-dihydroxy naphthalene, 2,4-dihydroxy quinoline, 2,6-dihydroxy quinoline, 2,3-dihydroxy quinoxaline, anthracene-1,2,10-triol, anthracene-1,8,9-triol, and 8-quinolinol.

If the resin composition according to the present invention contains such a compound having a phenolic hydroxyl group, it will not be dissolved significantly in an alkali developer before light irradiation, but will be easily dissolved in an alkali developer after light irradiation, leading to a decreased film loss during development and easy development in a short time. Accordingly, the sensitivity can be improved easily.

<Contact Improver>

The resin composition according to the present invention may contain an contact improver as required. It is preferable for the contact improver to contain a compound as represented by the general formula (7).

[Chemical formula 23]

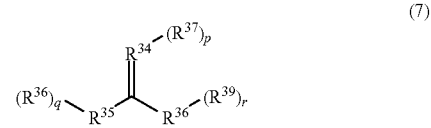

(7)

In the general formula (7), $R^{34}$ to $R^{36}$ each denote an O atom, S atom, or N atom, and at least one of $R^{34}$ to $R^{36}$ is an S atom. Here, p denotes an integer of 0 or 1, and q and r each independently denote an integer of 0 to 2. $R^{37}$ to $R^{39}$ each independently denote a hydrogen atom or an organic group containing 1 to 20 carbon atoms.

Examples of $R^{37}$ to $R^{39}$ include a hydrogen atom, alkyl group, cycloalkyl group, alkoxy group, alkyl ether group, alkylsilyl group, alkoxysilyl group, aryl group, aryl ether group, carboxy group, carbonyl group, allyl group, vinyl group, heterocyclic group, and combinations thereof, which may contain substituent groups.

The inclusion of a compound as represented by the general formula (7) acts to largely improve the adhesion between the heat-cured film and a metal material, copper in particular, and prevent their separation. This is attributed to efficient interaction between the S atom, N atom, etc., in a compound as represented by the general formula (7) and the metal surface, which is further attributed to a three-dimensional structure suitable for interaction with the metal. These effects serve to produce a cured film highly adhesive to metal materials.

Here, it is preferable for the compound represented by the general formula (7) added to account for 0.1 to 10 parts by mass relative to 100 parts by mass of the component (A). When the compound added accounts for 0.1 part by mass or more, it will be possible to realize the effect of sufficiently enhancing the adhesion to metal materials. On the other hand, in the case where the resin composition is one having positive photosensitivity, an addition of 10 parts by mass or less is preferred because the interaction with a photosensitive agent acts to prevent a sensitivity decrease of the resin composition from occurring before curing.

Examples of compounds as represented by the general formula (7) include, but not limited to, those having structures as described below.

[Chemical formula 24]

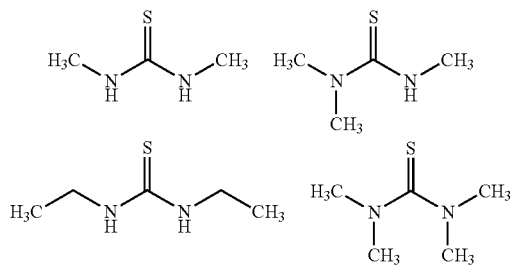

-continued
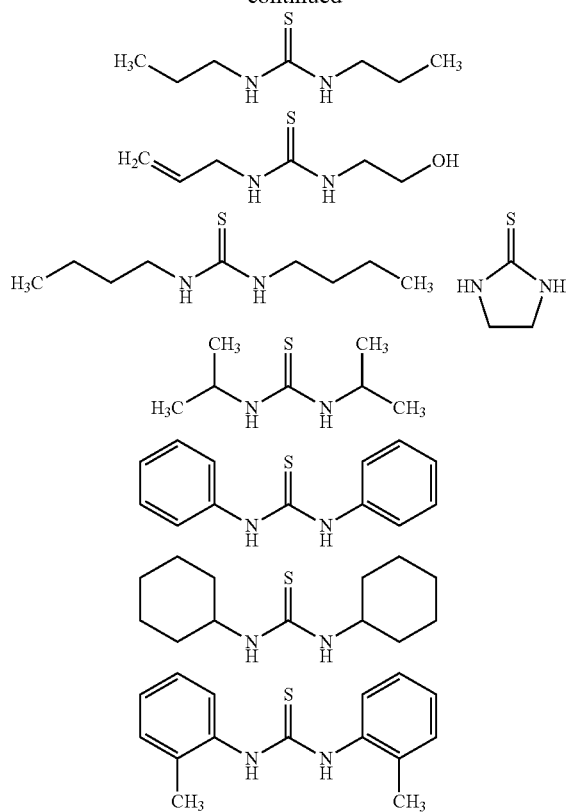
[Chemical formula 25]
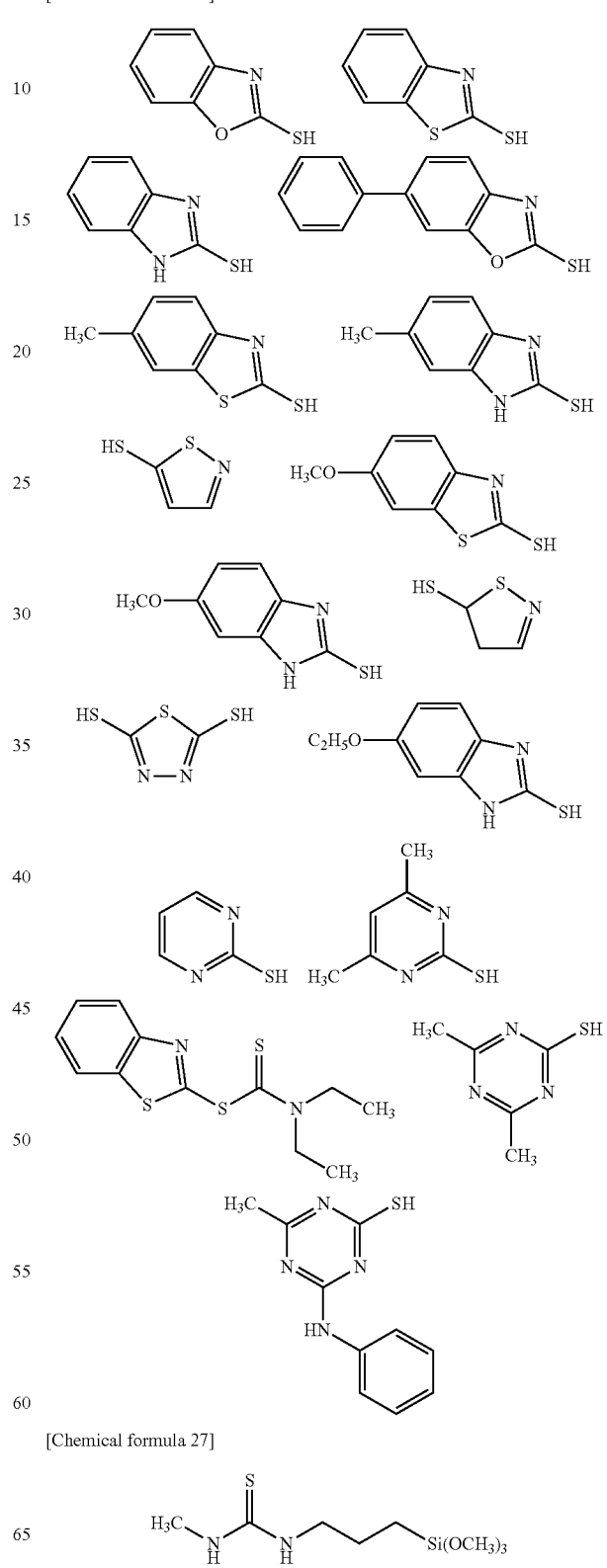
[Chemical formula 26]
[Chemical formula 27]

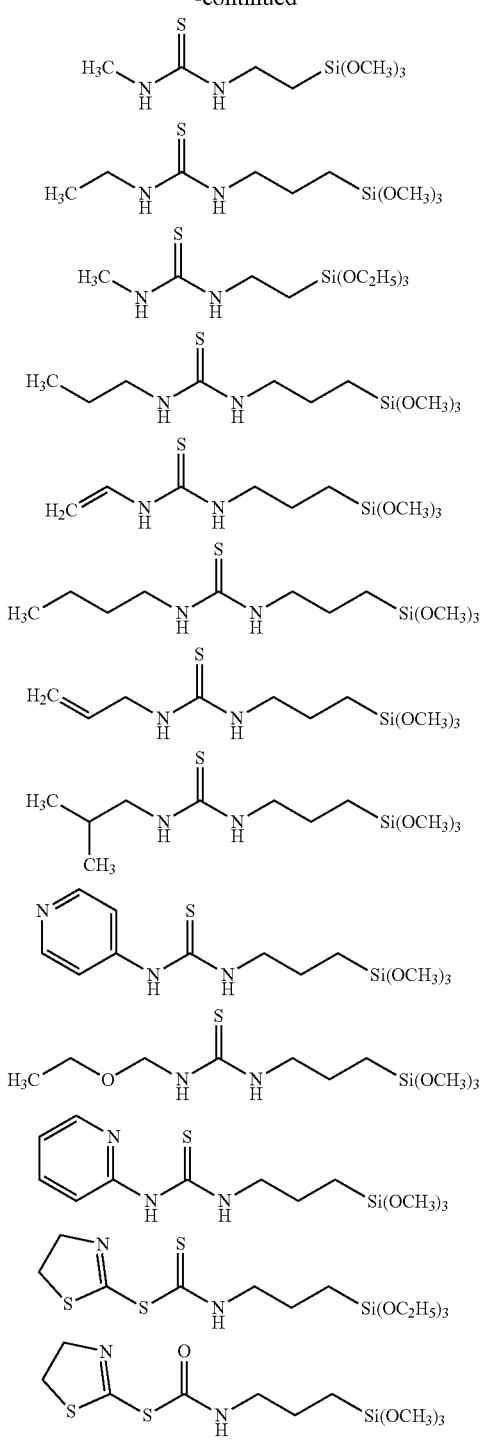

[Chemical formula 28]

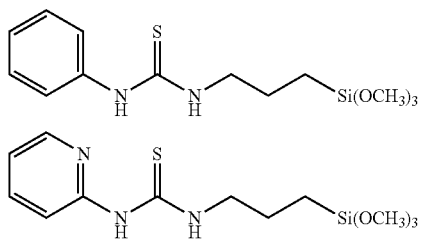

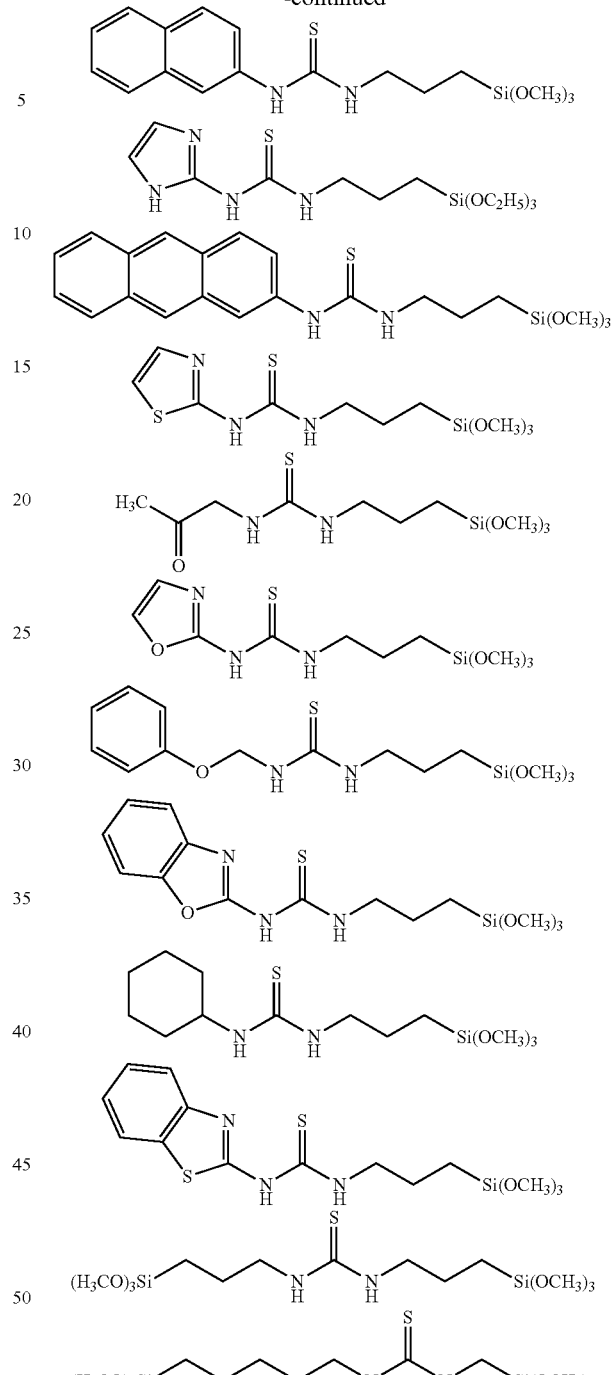

The resin composition according to the present invention may contain an contact improver other than the compounds represented by the general formula (7). Examples of such other contact improvers include silane coupling agents such as vinyl trimethoxysilane, vinyl triethoxysilane, epoxy cyclohexylethyl trimethoxysilane, 3-glycidoxypropyl trimethoxysilane, 3-glycidoxypropyl triethoxysilane, p-styryl trimethoxysilane, 3-aminopropyl trimethoxysilane, 3-aminopropyl triethoxysilane, and N-phenyl-3-aminopropyl trimethoxysilane, and others such as titanium chelating agents, aluminum chelating agents, and those compound resulting from reaction between an aromatic amine compound and an alkoxy group-containing silicon compound. Two or more of these may be contained together.

If such a contact improver is contained, the resin film can develop stronger adhesion to the substrate material such as silicon wafer, ITO, $SiO_2$, and silicon nitride during the resin film development step etc. It also serves to improve the resistance to oxygen plasma and UV ozone treatment performed for cleaning etc.

The content of the contact improver in the resin composition is preferably 0.1 to 10 parts by mass relative to 100 parts by mass of the component (A). A content in this range serves to ensure strong adhesion after the development step and provide a resin composition that is highly resistant to oxygen plasma and UV ozone treatment.

Here, the content of other contact improvers is preferably 10 to 500 parts by mass relative to 100 parts by mass of the aforementioned compound represented by the general formula (7). If having a content in such a range, each contact improver will show its effect sufficiently.

<Adhesion Improver>

In addition, the resin composition may also contain an adhesion improver. Examples of the adhesion improver include alkoxysilane-containing aromatic amine compounds, aromatic amide compounds, and non-aromatic silane compounds. Two or more of these may be contained together. If these compounds are contained, it ensures improved adhesion between the cured film produced by curing the resin composition and the substrate.

Specific examples of the alkoxysilane-containing aromatic amine compounds and aromatic amide compounds are given below. In addition, other examples include compounds obtainable through a reaction between an aromatic amine compound and an alkoxy-containing silicon compound, such as, for instance, compounds obtainable through a reaction between an aromatic amine compound and an alkoxysilane compound having an epoxy group, chloromethyl group, etc., that reacts with the amino group.

[Chemical formula 29]

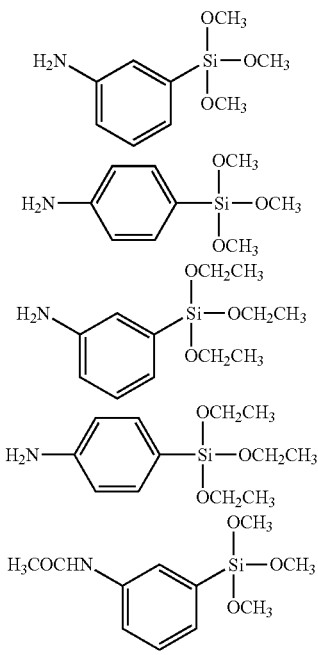
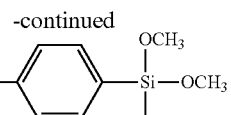
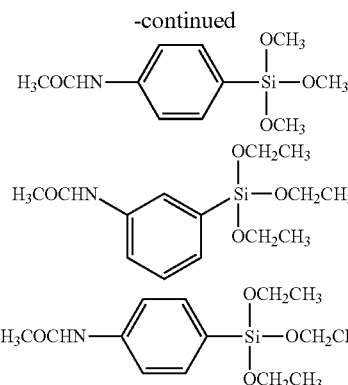
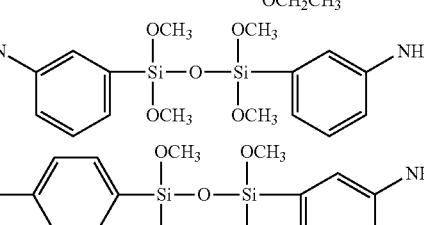
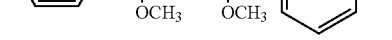
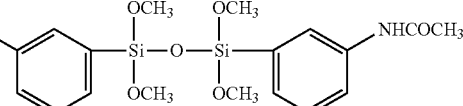
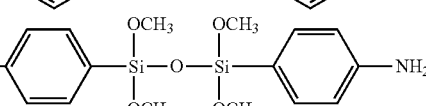
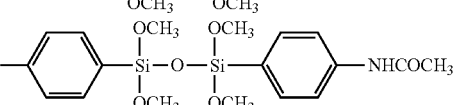
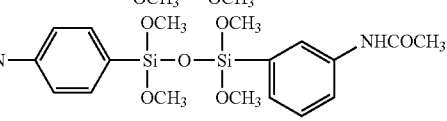

Examples of the non-aromatic silane compounds include vinyl silane compounds such as vinyl trimethoxysilane, vinyl triethoxysilane, vinyl trichlorosilane, and vinyl tris-(β-methoxyethoxy) silane and silane compounds containing unsaturated carbon-carbon bonds such as 3-methacryloxypropyl trimethoxysilane, 3-acryloxypropyl trimethoxysilane, p-styryl trimethoxysilane, 3-methacryloxypropyl methyldimethoxysilane, and 3-methacryloxypropyl methyldiethoxysilane. Of these, vinyl trimethoxysilane and vinyl triethoxysilane are preferred.

The content of the adhesion improver is preferably 0.01 to 15 parts by mass relative to 100 parts by mass of the component (A). If it is in this range, it ensures improved adhesion between the cured film produced by curing the resin composition and the substrate. Furthermore, it may also be good to use such compounds as vinyl trimethoxysilane and vinyl triethoxysilane that can work as both a contact improver and an adhesion improver.

<Surface Active Agent>

The resin composition according to the present invention may contain a surface active agent, as required, with the aim of improving the wettability on the substrate or improving the thickness uniformity of the coat film. There are commercially available compounds that serve as surface active agents. Specific examples include, but not limited to, silicone based surface active agents such as SH series, SD series, and ST series manufactured by Toray Dow Corning Silicone Co., Ltd., BYK series manufactured by BYK Japan KK, KP series manufactured by Shin-Etsu Silicone, Disfoam series manufactured by NOF Corporation, and TSF series manufactured by Toshiba Silicone Co., Ltd.; fluorochemical surface active agents such as Megafac (registered trademark) series manufactured by Dainippon Ink and Chemicals Inc., Fluorad series manufactured by Sumitomo 3M Limited, Surflon (registered trademark) series and Asahi Guard (registered trademark) series manufactured by Asahi Glass Co., Ltd., µF series manufactured by Shin-Akita Kasei Co., Ltd., and PolyFox series manufactured by OMNOVA Solutions Inc; and acrylic and/or methacrylic polymer based surface active agents such as Polyflow series manufactured by Kyoeisha Chemical Co., Ltd., and Disparlon (registered trademark) series manufactured by Kusumoto Chemicals Ltd.

It is preferable for the surface active agent to account for 0.001 part by mass or more and 1 part by mass or less relative to 100 parts by mass of the component (A). A content in the above range makes it possible to improve the wettability of the resin composition on the substrate and the thickness uniformity of the coat film without suffering troubles such as bubbles and pinholes.

<Solvent>

The resin composition according to the present invention may contain an solvent. Such solvents include, for example, polar aprotic solvents such as N-methyl-2-pyrolidone, γ-butyrolactone, γ-valerolactone, δ-valerolactone, N,N-dimethyl formamide, N,N-dimethyl acetamide, dimethyl sulfoxide, 1,3-dimethyl-2-imidazolidinone, N,N'-dimethyl propyleneurea, N,N-dimethyl isobutyric acid amide, and methoxy-N,N-dimethyl propionamide; ethers such as tetrahydrofuran, dioxane, propylene glycol monomethyl ether, and propylene glycol monoethyl ether; ketones such as acetone, methyl ethyl ketone, and diisobutyl ketone; esters such as ethyl acetate, butyl acetate, isobutyl acetate, propyl acetate, propylene glycol monomethyl ether acetate, and 3-methyl-3-methoxybutyl acetate; alcohols such as ethyl lactate, methyl lactate, diacetone alcohol, and 3-methyl-3-methoxybutanol; and aromatic hydrocarbons such as toluene and xylene. Two or more of these may be contained together.

To ensure dissolution of the composition, the solvent used preferably accounts for 100 parts by mass or more relative to 100 parts by mass the component (A). To ensure the formation of a coat film with a film thickness of 1 µm or more, it preferably accounts for 1,500 parts by mass or less.

<Production Methods for Resin Composition>

Next, described below are production methods for the resin composition according to the present invention. For instance, a resin composition can be prepared by, for example, mixing the aforementioned components (A), (B), (C), (D), (E), and (F) with a compound having a phenolic hydroxyl group, contact improver, adhesion improver, surface active agent, and solvent, as required, followed by dissolution.

Dissolution can be carried out by heating, stirring, etc. When heating is performed, an appropriate heating temperature is adopted in a range, commonly from 25° C. to 80° C., where the performance of the resin composition is not impaired. There are no specific limitations on the order of dissolving these components, and for example, the compound with the lowest solubility may be dissolved first followed by others in the order of solubility. When stirring is performed, an appropriate rotating speed is adopted in a range, commonly from 200 rpm to 2,000 rpm, where the performance of the resin composition is not impaired. Even when stirring is adopted, heating may also be performed as required, normally at 25° C. to 80° C. In the case of components that are likely to form bubbles when dissolved by stirring, such as surface active agents and some adhesion improvers, their dissolution may be postponed to the other components so that the dissolution of the latter will not be hindered by bubble formation.

The resin composition preferably has a viscosity of 2 to 5,000 mPa·s. An intended film thickness may be realized easily by controlling the solid content so as to adjust the viscosity to 2 mPa·s or more. On the other hand, a highly uniform coating film can be obtained easily if the viscosity is 5,000 mPa·s or less. A resin composition having such a viscosity can be obtained easily if, for example, the solid content is adjusted to 5 to 60 mass %. Here, the solid content means the content of the components other than the solvents.

The resulting resin composition is preferably filtrated through a filter to remove dust and particles. Filters with a pore size of, for instance, 0.5 µm, 0.2 µm, 0.1 µm, 0.05 µm, or 0.02 µm may be useful, though there are no specific limitations on the size. The filter to be used for filtration may be of such a material as polypropylene (PP), polyethylene (PE), nylon (NY), and polytetrafluoroethylene (PTFE), of which polyethylene and nylon are preferred.

<Production Methods for Resin Film and Cured Film>

Next, described below are production methods for the resin composition according to the present invention and for a cured film of a resin film or a resin sheet prepared from the resin composition.

Here, the resin film referred to above is a film prepared by spreading the resin composition according to the present invention over a substrate, followed by drying it. The resin sheet is a sheet prepared by spreading the resin composition over a strippable base, followed by drying it. Furthermore, the cured film is a film prepared by curing the resin film or the resin sheet.

The production method for the cured film according to the present invention includes a step for forming a resin film by coating a substrate with the aforementioned resin composition or laminating a substrate with the resin sheet, followed by drying, and, in the case where the resin is photosensitive, a light irradiation step for irradiating the resin film with light, a development step for developing the light-irradiated resin film, and a heat treatment step for heat-treating the developed resin film.

First, the resin composition according to the present invention is spread over a substrate to form a coating film of the resin composition. Useful materials for the substrate include, but not limited to, silicon wafers, various ceramics, gallium arsenide, organic circuit boards, inorganic circuit boards, and such boards provided with circuit components arranged thereon. Available coating methods include the spin coating method, slit coating method, dip coating method, spray coating method, and printing method. The coating thickness depends on the coating method used, solid content in the composition, viscosity, and the like, but commonly, coating is performed in such a manner that the film thickness will be 0.1 to 150 µm after drying.

Before the coating step, the substrate to be coated with the resin composition may be pre-treated with a contact improver as described above. For example, a contact improver is dissolved to 0.5 to 20 mass % in a solvent such as isopropanol, ethanol, methanol, water, tetrahydrofuran, propylene glycol monomethyl ether acetate, propylene glycol monomethyl ether, ethyl lactate, and diethyl adipate to prepare a solution, which is then used to treat the surface of a substrate by an appropriate technique such as spin coating, slit die coating, bar coating, dip coating, spray coating, and steam treatment. After treating the substrate surface, reduced pressure drying may be performed as required. In addition, heat treatment at 50° C. to 280° C. may be performed to accelerate the reaction between the substrate and the contact improver.

Then, the coating film of the resin composition is dried to provide a resin film. Drying is preferably performed in the temperature range of 50° C. to 140° C. for one minute to several hours, using an oven, a hot plate, infrared rays, and the like.

On the other hand, in the case of using a resin sheet prepared from the resin composition according to the present invention, the protective film, if any, is removed from the resin sheet, and the resin sheet and the substrate are held so that they face each other, followed by combining them by thermocompression bonding (such an operation of holding a resin sheet and a substrate so that they face each other and combining them by thermocompression bonding will be occasionally expressed as laminating a substrate with a resin sheet). Then, the resin sheet on the laminated substrate is dried as in the case of the aforementioned resin film preparation, to form a resin film. Such a resin sheet can be formed by spreading the resin composition according to the present invention over a support film of a strippable substrate material such as polyethylene terephthalate, followed by drying.

Thermocompression bonding can be carried out by hot pressing treatment, thermal lamination treatment, thermal vacuum lamination treatment, or the like. The combining temperature is preferably 140° C. or higher from the viewpoint of the adhesion to the substrate and embedding property. When the resin sheet is photosensitive, furthermore, the combining temperature is preferably 40° C. or lower in order to prevent the resin sheet from being cured during the combining step to cause a decrease in the resolution in pattern formation during the light irradiation and development steps.

When the resin film is photosensitive, an actinic ray is applied to the photosensitive resin film through a mask having an intended pattern in the light irradiation step. When the resin film is not photosensitive, a known photoresist film is formed on the resin film, for example, and then an actinic ray is applied through a mask having an intended pattern in the light irradiation step. Then, the photoresist film is preferably removed after the completion of the development step described below using a chemical liquid etc. Examples of the actinic ray used for light irradiation include ultraviolet ray, visible light, electron beam, and X-ray. For the present invention, the use of g-line (436 nm), h-line (405 nm) or i-line (365 nm), which are generally used for light irradiation, is preferred.

Next, the irradiated resin film is developed. Preferred developers include aqueous solutions of alkaline compounds such as tetramethyl ammonium, diethanol amine, diethyl aminoethanol, sodium hydroxide, potassium hydroxide, sodium carbonate, potassium carbonate, trimethyl amine, diethyl amine, methyl amine, dimethyl amine, dimethylaminoethyl acetate, dimethylaminoethanol, dimethylaminoethyl methacrylate, cyclohexyl amine, ethylene di-amine, and hexamethylene di-amine. In some cases, thses aqueous alkali solutions may contain polar solvents such as N-methyl-2-pyrolidone, N,N-dimethyl formamide, N,N-dimethyl acetamide, dimethyl sulfoxide, γ-butyrolactone, and dimethyl acrylamide; alcohols such as methanol, ethanol and isopropanol; esters such as ethyl lactate and propylene glycol monomethyl ether acetate; and ketones such as cyclopentanone, cyclohexanone, isobutyl ketone, and methyl isobutyl ketone; which may be added singly or as a combination of two or more thereof. Commonly, rinsing with water is performed after the development step. Here again, rinsing may be performed with a solution prepared by adding to water an alcohol such as ethanol and isopropyl alcohol or an ester such as ethyl lactate and propylene glycol monomethyl ether acetate.

A resin film thus obtained is heated to undergo a thermal crosslinking reaction, thereby forming a cured film according to the present invention. The heat resistance and chemical resistance of the cured film can be improved by crosslinking. The heat treatment may be carried out by raising the temperature stepwise or by raising it continuously. It is preferable for the heat treatment to be performed for 5 minutes to 5 hours. For example, heat treatment is performed first at 140° C. for 30 minutes and additional heat treatment is performed at 320° C. for 60 minutes. Preferred heat treatment conditions include a temperature range of 140° C. and higher and 400° C. or lower. The heat treatment temperature is preferably 140° C. or higher, more preferably 160° C. or higher, in order to accelerate the thermal crosslinking reaction. On the other hand, the heat treatment temperature is preferably 400° C. or lower, more preferably 350° C. or lower in order to provide a good cured film and to improve the yield.

<Semiconductor Apparatus>

The cured film prepared by curing the resin composition or the resin sheet according to the present invention can be used in electronic components of semiconductor apparatuses etc. Specifically, the semiconductor apparatus according to present invention is a semiconductor apparatus having metal wiring and an insulation film, wherein the cured film according to the present invention is used as the insulation film. In general, a semiconductor apparatus means an apparatus containing, as a component, a semiconductor device or an integrated circuit that integrates such devices. The semiconductor apparatus according to present invention may contain not only a semiconductor device but also other components, such as circuit board, intended for semiconductor apparatuses. In addition, the semiconductor device according to the present invention may also be in the form of a semiconductor package consisting of a semiconductor device etc. protected by encapsulation resin and provided with a function for electric connection to external components. The cured film according to the present invention is used suitably for, for example, semiconductor's passivation film, semiconductor device's protective film, interlayer dielectric film in multi-layered wiring for high-density packaging.

Preferred examples of the semiconductor device according to the present invention include, for example, logic device for CPU and GPU, and surface protective film for memory devices such as MRAM, polymer memory (polymer ferroelectric RAM (PFRAM)), which is a promising next generation memory, and phase change memory (phase change RAM (PCRAM) or ovonic unified memory (OUM)). It can also serve as insulation layers in various display apparatuses that contain a first electrode formed on a substrate and a second electrode disposed opposite to the first electrode, such as LCDs, ECDs, ELDs, and display apparatuses incorporating organic electroluminescent elements (organic electroluminescent devices).

In particular, as electrodes for semiconductor devices and metal wiring for substrates are increasingly sophisticated to have hyperfine structures, most semiconductor apparatuses in recent years incorporate electrodes, metal wiring, and bumps that contain gold, silver, copper, nickel, aluminum, etc., and they tend to come in contact with various chemicals including flux and stripper for photoresist removal in many manufacturing steps such as for etching of metal wiring and barrier metals and formation of resist patterns. Cured film formed from the resin composition or resin sheet according to the present invention will be particularly preferred for use as protective film for such electrodes and metal wiring because of their high resistance to those chemicals. It is noted that in some cases, copper wiring is subjected to oxidation treatment as required in the manufacturing process. The cured film according to the present invention can be used suitably even in such cases. Furthermore, the resin composition and resin sheet according to the present invention has thick film processability and accordingly, they can be used suitably as protective film or interlayer dielectric film not only for, for example, metal wiring having a thickness in the range of 10 μm or less, but also in the range of 10 μm or more and 20 μm or less. In such cases, it is preferable for the cured film according to the present invention to have a thickness of 11 μm or more, more preferably 15 μm or more, from the viewpoint of the coverage on metal wiring. On the other hand, it is preferably 20 μm or less, more preferably 18 μm or less, from the viewpoint of processability.

Next, the cured film prepared from the resin composition or resin sheet according to the present invention is described below with reference to drawings focusing on its application to a semiconductor apparatus with a bump. FIG. 1 is an enlarged cross-sectional view of a pad member of a semiconductor apparatus with a bump. As seen in FIG. 1, an input/output aluminum (hereinafter Al) pad 2 and a passivation film 3 are located on a silicon wafer 1, and the passivation film 3 has a via hole. In addition, an insulation film 4 formed of a cured product of the resin composition or resin sheet according to the present invention is located on top of this, and a metal film 5 is formed in such a manner that it is electrically connected to the Al pad 2. Cr, Ti, etc., are used suitably as the material for the metal film 5. A metal wiring 6 is laid on the metal film 5. Ag, Cu, etc., are used suitably as the material for the metal wiring 6. Copper wiring is particular preferred in recent years as described above. It is preferable for the metal wiring 6 to be formed on the metal film 5 by the plating technique. An insulation film 7 formed of a cured product of the resin composition or resin sheet according to the present invention is formed on top of the insulation film 4 and the metal film 5. It is necessary to form openings in the insulation film 7 by the photolithographic technique for a scribe line 9 and a pad portion for forming a solder bump 10. In the pad portion, a barrier metal 8 is formed first, and then the solder bump 10 is formed. Having good mechanical property, the polyimide resin and polybenzoxazole resin can work to relax the stress caused by encapsulation resin during the component formation steps and accordingly serve to provide a highly reliable semiconductor apparatus that can prevent damage to the low-k layer.

Figure 2:
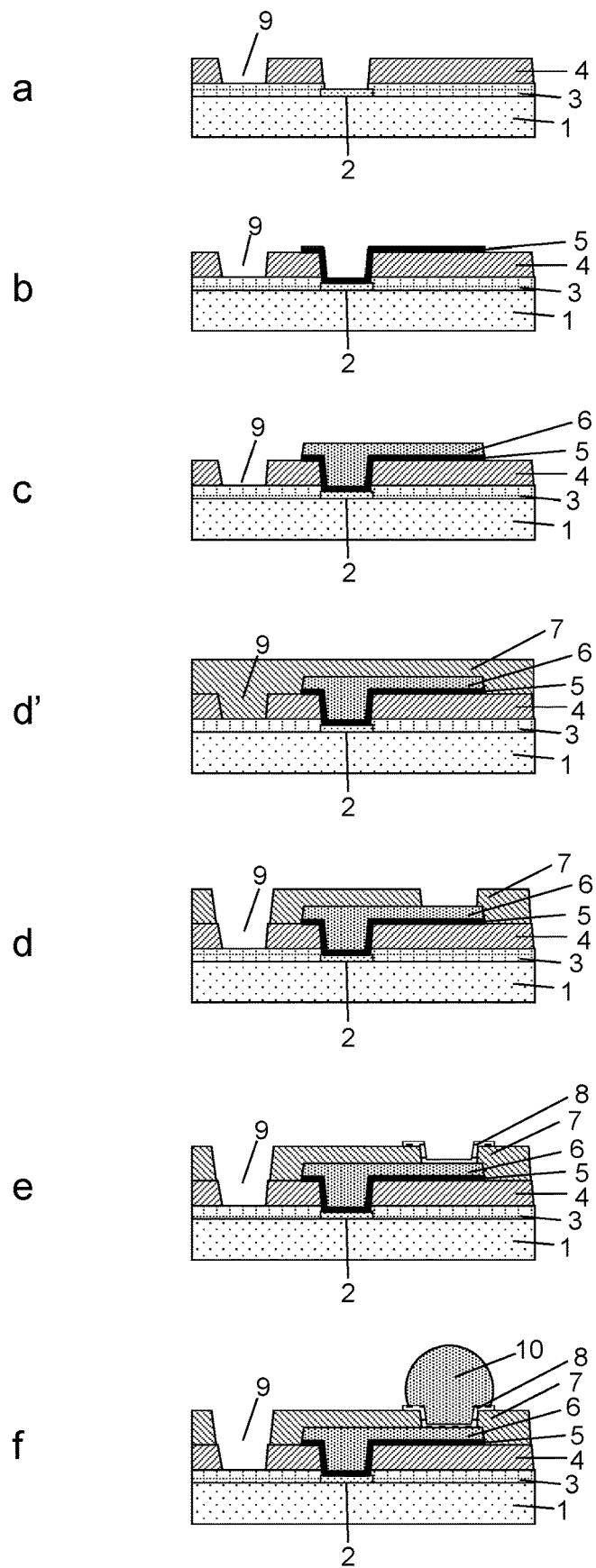
FIG. 2 This is a diagram detailedly illustrating a method for producing a semiconductor apparatus with a bump.

Next, a method for producing a semiconductor apparatus is described in detail with reference to FIG. 2. In the step shown in FIG. 2a, after forming an Al pad 2 and a passivation layer 3 on a silicon wafer 1, the top surface is coated or laminated with the resin composition according to the present invention, which is then patterned by the photolithographic technique and cured to form an insulation layer 4. Then, in the step in FIG. 2b, a metal layer 5 is formed by the sputtering technique. Furthermore, as shown in FIG. 2c, a metal wiring 6 is formed on the metal film 5 by the plating technique. Subsequently, as shown in FIG. 2d, the top surface is coated or laminated with the resin composition or resin sheet according to the present invention, which is then patterned by the photolithographic technique and cured to form an insulation layer 7 as shown in FIG. 2d. During this step, an opening for the scribe line 9 is formed in the insulation film 7. An additional metal wiring (so-called rewiring) may be formed on top of the insulation film 7. The above step may be performed repeatedly to produce a multi-layered wiring structure that contains two or more rewiring layers separated from each other by an insulation film formed of a cured product of the resin composition or resin sheet according to the present invention. The insulation film formed to separate this rewiring film is called the interlayer dielectric film. Although the insulation film formed comes in contact with various chemicals a plurality of times in this step, a good multi-layered wiring structure can be formed because the insulation film formed of a cured product of the resin composition or resin sheet according to the present invention is high in adhesiveness and chemical resistance. There are no limitations on the upper limit to the number of layers in the multi-layered wiring structure, but generally structures composed of 10 or less layers are used.

Then, a barrier metal 8 and a solder bump 10 are formed as shown in FIG. 2e and FIG. 2f. Subsequently, the wafer is diced along the scribe line 9 into chips. If the insulation film 7 fails to have an opening or suffers from residues left along the scribe line 9, the dicing may cause cracks and have influence on the reliability of the chips. Therefore, if pattern processing can be performed while forming a thick film, it is highly desirable in order to provide semiconductor devices with high reliability.

Furthermore, the resin composition or resin sheet according to the present invention can be used suitably for fan-out wafer level packages (fan-out WLP) and fan-out panel level packages (fan-out PLP). The fan-out WLP represents a technique to produce many semiconductor packages at once on a wafer. The fan-out PLP represents a technique to produce many semiconductor packages at once on a rectangular substrate, i.e. a panel, in a part or the entirety of the process.

Figure 3:
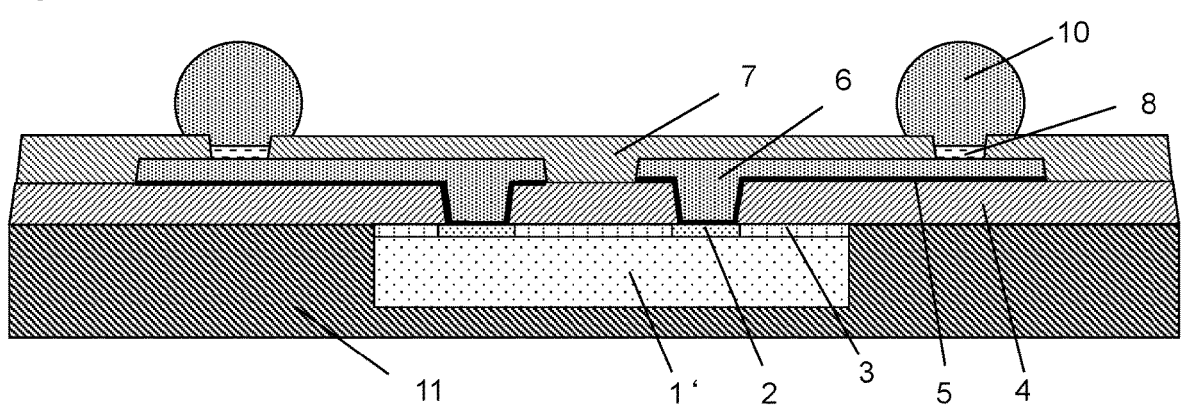
FIG. 3 This is a cross-sectional diagram illustrating a production process of a typical semiconductor apparatus containing the cured film according to the present invention.

FIG. 3 is a cross-sectional diagram illustrating a production process of a typical semiconductor apparatus that contains the cured film according to the present invention. More specifically, it is an enlarged cross section of a semiconductor package called a chip-first fan-out WLP or a chip-first fan-out PLP. A silicon wafer having an Al pad 2 and a passivation film 3 formed thereon is diced to form a semiconductor chip 1' and encapsulated by encapsulation resin 11. The top surface containing this encapsulation resin 11 and the semiconductor chip 1' are laminated with the resin composition or resin sheet according to the present invention, which is then patterned by the photolithographic technique to form openings and cured to form an insulation film 4. In addition, a metal film 5 of Cr, Ti, etc., and a metal wiring 6 of Ag, Cu, etc., are formed on the insulation film 4. In the opening formed in the insulation film 4, the metal film 5 and the metal wiring 6 are electrically connected to the Al pad 2 disposed on the semiconductor chip 1'. An insulation film 7 is then formed on top of it. The resin composition or resin sheet according to the present invention is also used suitably for the formation of the insulation film 7. A barrier metal 8 and a solder bump 10 are formed in the opening present in the insulation film 7. The barrier metal 8 and the solder bump 10 are electrically connected to the metal wiring 6.

The chip-first fan-out WLP or chip-first fan-out PLP is a semiconductor package produced by creating an extended portion around the semiconductor chip using an encapsulation resin such as epoxy resin, laying rewiring from the electrodes on the semiconductor chip to the extended portion, and forming an additional solder ball in the extended portion in order to provide a required number of terminals. In the chip-first fan-out WLP or chip-first fan-out PLP, metal wiring is formed so as to cross the boundary line between the principal plane of the semiconductor chip and the principal plane of the encapsulation resin. Specifically, the insulation film 7, which acts as an interlayer dielectric film, is disposed on the substrate that contains two or more materials, i.e. the semiconductor chip and encapsulation resin, and the metal wiring (rewiring) 6 is disposed on the interlayer dielectric film.

Chip-first fan-out WLPs and chip-first fan-out PLPs with increasingly finer rewiring layers are now available. The cured film according to the present invention can be used suitably in fine rewiring layers because it has high adhesiveness to metals even in the case of a metal wiring in which both the width of each metal wire and the distance between adjacent metal wires are 5 µm or less. Here, the expression "both the width of each metal wire and the distance between adjacent metal wires are 5 µm or less" means that the width of each metal wire is 5 µm or less and at the same time the distance between adjacent metal wires is 5 µm or less.

It is preferable for chip-first fan-out WLPs and chip-first fan-out PLPs with such fine structures to have multi-layered laminated structures containing a plurality of stacked rewiring layers in which, when each pair of mutually adjacent rewiring layers are compared, the width of each metal wire and the distance between adjacent metal wires in the rewiring layer that is located nearer to the semiconductor chip than the other are equal to or smaller than the width of each metal wire and the distance between adjacent metal wires in the rewiring layer that is located farther from the semiconductor chip. A rewiring layer as referred to herein is a layer that is part of a multi-layered wiring structure having a plurality of rewirings separated by a plurality of interlayer dielectric films and that consists mainly of a rewiring and an interlayer dielectric film formed thereon. It is noted that there exists only one rewiring layer in some cases. In addition, the expression "the width of each metal wire and the distance between adjacent metal wires in mutually adjacent rewiring layers are equal to or smaller" means that the width of each metal wire in rewiring layers that are located nearer to the semiconductor chip is equal to or smaller than the width of each metal wire in rewiring layers that are located farther from the semiconductor chip and at the same time the distance between adjacent metal wires in rewiring layers that are located nearer to the semiconductor chip is equal to or smaller than the distance between adjacent metal wires in rewiring layers that are located farther from the semiconductor chip.

In this structure, furthermore, it is preferable that, when each pair of mutually adjacent rewiring layers are compared, the thickness of the interlayer dielectric film in the rewiring layer that is located nearer to the semiconductor chip is equal to or smaller than the thickness of the interlayer dielectric film in the rewiring layer that is located farther from the semiconductor chip.

That is, it is preferable that the rewiring layers in the multi-layered wiring structure gradually become finer in pitch from the farthest one from the semiconductor chip to the nearest one to the semiconductor chip. As a result of having this structure, the semiconductor chip and terminals can be connected smoothly even when the semiconductor chip is a highly integrated one. To produce such a structure, it is important for the interlayer dielectric films in each rewiring layer to have in-plane uniformity.

Among the fan-out WLPs and fan-out PLPs, there are semiconductor packages produced by the so-called RDL (redistribution layer) first process, in which temporarily pasted materials are arranged on a support substrate, followed by forming thereon a stack of a plurality of rewiring layers, each containing a metal wiring (rewiring) and an interlayer dielectric film, arranging a semiconductor chip and encapsulation resin on top of it to form a semiconductor package, and removing the support substrate from the rewiring layer to separate the semiconductor package. Thus, the support substrate is used only in the production process and is not contained in the completed semiconductor package. In this process, glass substrates etc. that tend to suffer larger warp than silicon wafers are used frequently as support substrates and accordingly, it is preferable to adopt low-stress insulation films. However, as this process uses large sized panels aiming at cost reduction through mass production, some improvements are now required including a reduction in warp of the interlayer dielectric film due to film shrinkage and an increase in the in-plane uniformity of film thickness.

Figure 4:
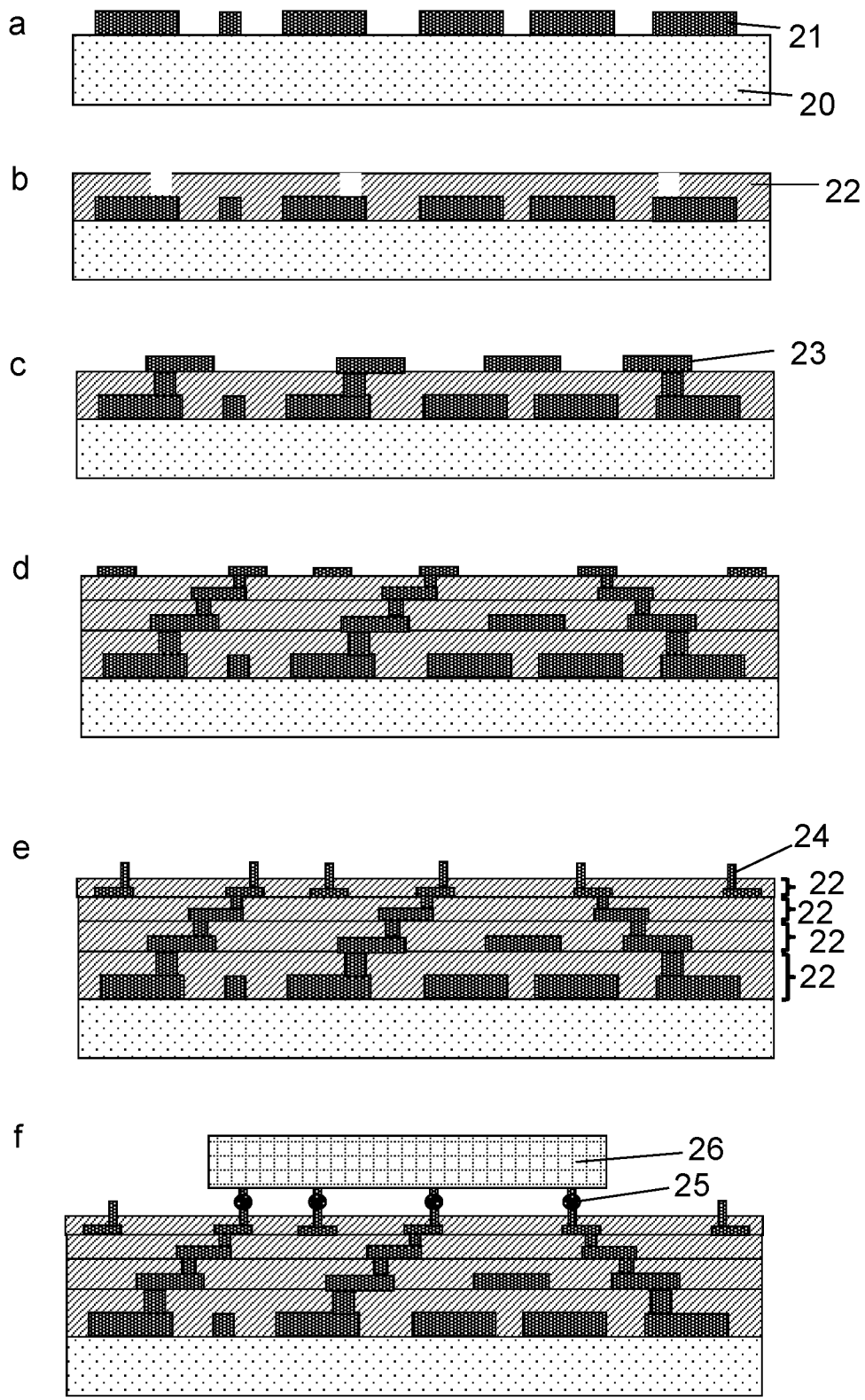
FIG. 4 This is a diagram illustrating a method for producing a semiconductor apparatus by the RDL first process.

A method for producing a semiconductor apparatus by the RDL first process is illustrated below with reference to FIG. 4. FIG. 4a shows a support substrate 20 in the form of a glass substrate, silicon wafer, etc., which may have temporally pasted materials arranged thereon, on which a barrier metal layer of Ti etc. is formed by sputtering and a Cu seed (seed layer) is formed on top of it by sputtering, followed by forming an electrode pad 21 of Cu by plating. Next, in the step shown in FIG. 4b, the entire surface of the support substrate 20 having an electrode pad 21 formed thereon is coated or laminated with the resin composition or resin sheet according to the present invention, which is then patterned by the photolithographic technique and cured to form an insulation layer 22. Subsequently, in the step in FIG. 4c, another seed layer is formed by sputtering and a metal wiring 23 (rewiring) of Cu is formed by plating. Following this, the steps illustrated in FIG. 4b and FIG. 4c are carried out repeatedly to form a multi-layered wiring structure as shown in FIG. 4d. Next, in the step shown in FIG. 4e, the top surface is coated or laminated again with the resin composition or resin sheet according to the present invention, which is then patterned by the photolithographic technique and cured to form an insulation layer 22, followed by forming a Cu post 24 on the metal wiring 23 in an opening in the insulation film 22. Here, the Cu posts 24 are arranged so that their pitch coincides with that of the conductor portions of a semiconductor chip 26. Specifically, since the pitch of conductor portions of the semiconductor chip 26 is smaller than that of the electrode pads 21, the rewiring layers present in the multi-layered wiring structure gradually becomes finer in pitch from the electrode pad 21 to the Cu post 24, as shown in FIG. 4e, to form a stack of multiple metal wiring layers. In the multi-layered wiring structure, the thickness of an interlayer dielectric film 22 is equal to or smaller than that of the adjacent one nearer to the semiconductor chip. In the next step shown in FIG. 4f, the Cu posts 24 are connected to the semiconductor chip 26 through a solder bumps 25. In this way, the electrode pads 21 are electrically connected to the semiconductor chip 26 through the metal wiring 23 and solder bumps 25. Subsequently, the semiconductor chip 26 is encapsulated by an encapsulation resin to form a semiconductor package, and the support substrate is removed from the rewiring layer to separate the semiconductor package. Thus, a semiconductor device having a multi-layered wiring structure is produced by the RDL first process.

As another example, a semiconductor chip is embedded in a recess formed in a glass epoxy resin substrate to produce a semiconductor package in which a metal wiring is formed in such a manner that it crosses the boundary line between the principal plane of the semiconductor chip and the principal plane of the printed circuit board. In this embodiment as well, an interlayer dielectric film is formed on a substrate that contains two or more materials, and a metal wiring (rewiring) is formed on the interlayer dielectric film. A cured film produced by curing the resin composition or resin sheet according to the present invention has high adhesiveness to a semiconductor chip having a metal wiring and also has high adhesiveness to an encapsulation resin such as epoxy resin and accordingly can be used suitably as an interlayer dielectric film to be disposed on a substrate containing two or more materials.

<Other Apparatus>

Figure 5:
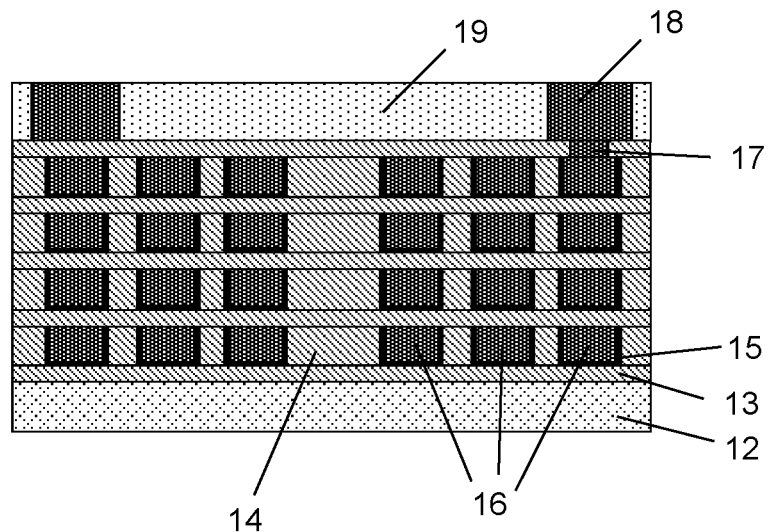
FIG. 5 This is a cross-sectional diagram of a coil part of an inductor device that exemplifies the semiconductor apparatus according to the present invention.

The resin composition or resin sheet according to the present invention can also be used suitably in coil parts of inductor devices. FIG. 5 gives a cross-sectional diagram of a coil part of an inductor device that exemplifies the semiconductor apparatus according to the present invention. As seen in FIG. 5, an insulation film 13 is formed over the entire surface of a substrate 12, and an insulation film 14 having openings are formed thereon. The substrate 12 is made of ferrite etc. The resin composition or resin sheet according to the present invention can be used either as the insulation film 13 or the insulation film 14. A metal film 15 of Cr, Ti, etc., is formed in each opening in the insulation film 14, and a metal wiring 16 of Ag, Cu, etc., is formed thereon by plating. The metal wiring 16 has a spiral shape. The above step is performed repeatedly a plurality of times to form a stack of the insulation film 13, insulation film 14, metal film 15, and metal wiring 16 to function as a coil. The metal wiring 16 formed as the top layer is connected to an electrode 18 through a metal wiring 17 of Ag, Cu, etc., and encapsulated by an encapsulation resin 19.

The resin composition or resin sheet according to the present invention can be used in a display apparatus that includes a first electrode disposed on a substrate, an insulation layer covering the periphery of the first electrode, and a second electrode disposed opposite to the first electrode.

The resin composition or resin sheet according to the present invention can also be used suitably in organic EL display apparatuses. Such an organic EL display apparatus includes a drive circuit, planarization layer, first electrode, insulation layer, light emitting layer, and second electrode mounted on a substrate, of which the planarization layer and/or insulation layer are formed of the cured film according to the present invention. Organic EL light emitting materials are generally liable to degradation caused by moisture and likely to have adverse influences such as a decrease in the ratio of the area of the light emitting region to that of the light emitting pixels, but the cured film according to the present invention is low enough in water absorption rate to maintain stable drive performance and light emitting properties. An active matrix type organic EL display apparatus, for example, is composed mainly of a substrate of glass, various plastics, or the like, that supports a TFT and a metal wiring located on the side of the TFT and connected to the TFT, both disposed on the substrate, a planarization layer disposed on top of it so as to cover the surface irregularities, and a display device disposed on the planarization layer. The display device and metal wiring are connected to each other through a contact hole provided in the planarization layer.

A specific example of a display apparatus that consists of a first electrode disposed on a substrate, an insulation layer covering the periphery of the first electrode, and a second electrode disposed opposite to the first electrode is described below with reference to FIG. 6.

Figure 6:
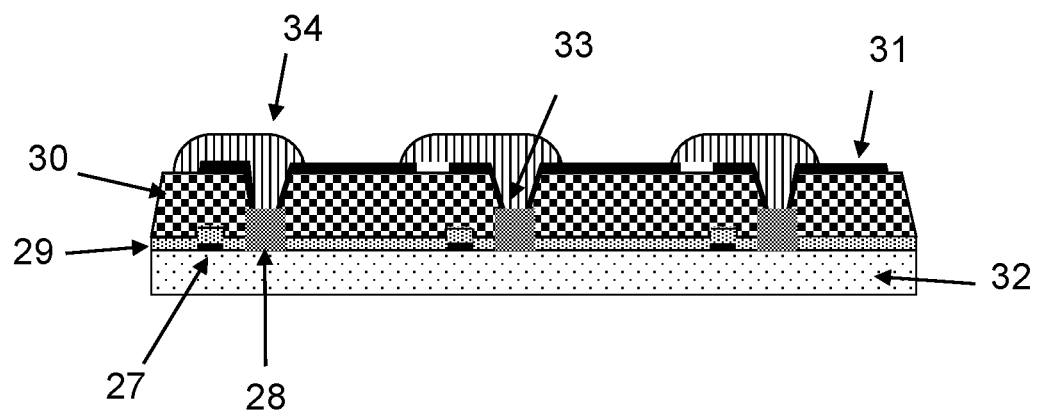
FIG. 6 This is a cross-sectional diagram of a typical TFT substrate.

FIG. 6 gives a cross section of a typical TFT substrate. Bottom gate type or top gate type TFTs (thin film transistors) 27 are disposed along lines on a substrate 32, and a TFT insulation layer 29 is disposed so as to cover these TFTs 27. Also, metal wirings 28 connected to the TFTs 27 are disposed on this TFT insulation layer 29. On top of the TFT insulation layer 29, furthermore, a planarization layer 30 is laid in such a manner that the wires 28 are embedded therein. The planarization layer 30 has contact holes 33 that reach the metal wires 28. In addition, transparent electrodes 31 of ITO etc., i.e. the first electrodes, which are connected to the metal wirings 28 through the contact holes 33 are located on the planarization layer 30. Here, each transparent electrode 31 is intended to work as an electrode of the display device (for example, organic EL device). In addition, an insulation layer 34 is formed so as to cover the periphery of the transparent electrode 31. Subsequently, a light emitting layer is formed on the first electrode and insulation layer, and a second electrode is formed so as to be opposed to the first electrode. This organic EL device can work as either a top emission type one that emits luminescence from the opposite side to the substrate 32 or a bottom emission type one that emits luminescence from the substrate 32 side. Thus, an active matrix type organic EL display apparatus in which each organic EL device is connected to a TFT 27 to drive it is obtained.

The TFT insulation layer 29, planarization layer 30, and/or insulation layer 34 can be produced by carrying out a step for forming a resin film from the resin composition or resin sheet according to the present invention, a step for irradiating the resin film with light, a step for developing the irradiated resin film, and a step for heat-treating the developed resin film. An organic EL display apparatus can be produced by carrying out a production procedure that includes these steps.

EXAMPLES

The present invention will be illustrated below in greater detail with reference to examples etc., but the invention should not be construed as being limited thereto. Evaluation of the resin composition and resin sheet samples prepared in Examples was performed according to the following methods. A resin composition (hereinafter referred to as a varnish) filtered through a 1 μm thick polytetrafluoroethylene filter (manufactured by Sumitomo Electric Industries, Ltd.) in advance was used for the evaluation.

<Evaluation of Non-Photosensitive Resin Composition>

(1) Evaluation of Compatibility of Non-Photosensitive Resin Composition

A varnish (resin composition) was prepared and observed in the solution state. Then, using a coater-developer apparatus (ACT-8, manufactured by Tokyo Electron Ltd.), spin coating was performed to coat an 8 inch silicon wafer in such a manner that the film thickness after development would be 20 μm, and then prebaking was performed to provide a prebaked film. In all cases, prebaking was performed at 120° C. for 3 minutes. The resulting prebaked film was developed with an aqueous solution containing 2.38 mass % of tetramethyl ammonium (TMAH) (manufactured by Tama Chemicals Co., Ltd.) under conditions where the unirradiated portion of the film would undergo a thickness change of 2 µm between before and after the development step, followed by rinsing with pure water and drying by shaking off water.

The thickness of the prebaked resin film and that of the developed resin film were measured using a Lambda Ace STM-602 optical interference type film thickness measuring apparatus manufactured by Dainippon Screen Mfg. Co., Ltd. assuming a refractive index of 1.629.

Based on the results, the film was judged to be excellent and rated as "3" if no white haze was seen in the solution or in the resin film after preparation or development, judged to be fair and rated as "2" if white haze was seen in the resin film after preparation or development under light from the light source of Lambda Ace STM-602, and judged to be poor and rated as "1" if significant white haze was seen visually in the solution or in the resin film after preparation or development.

(2) Evaluation of Flux Resistance of Non-Photosensitive Resin Composition

A varnish was prepared and then, using a coater-developer apparatus (ACT-8, manufactured by Tokyo Electron Ltd.), spin coating was performed to coat an 8 inch silicon wafer in such a manner that the film thickness after heat treatment would be 15 µm, and prebaking was performed to provide a prebaked film. In all cases, prebaking was performed at 120° C. for 3 minutes.

Subsequently, the prebaked film was coated with a positive photoresist (OFPR-800, manufactured by Tokyo Ohka Kogyo Co., Ltd.) and prebaking was performed at 100° C. for 10 minutes. Then, the film was irradiated with light to an exposure of 700 mJ/cm$^2$ using a ghi-line mask aligner (PEM-6M, manufactured by Union Optical Co., Ltd.). The circular pattern used for the light irradiation had a size of 20 µm. After the irradiation, the film was developed with a 2.38 mass % aqueous solution of tetramethyl ammonium (TMAH) (manufactured by Tama Chemicals Co., Ltd.) by performing a 40 second development run four times repeatedly, followed by rinsing with pure water and drying by shaking off water to provide a patterned film. Next, the film was baked at 160° C. for 10 minutes, immersed in a stripping liquid 106 (manufactured by Tokyo Ohka Kogyo Co., Ltd.) for 3 minutes, and rinsed with pure water to remove the photoresist film.

Subsequently, the patterned film was put in an inert oven (CLH-21CD-S, manufactured by Koyo Thermo Systems Co., Ltd.), heated in a nitrogen flow with an oxygen concentration of 20 ppm or less at a rate of 3.5° C./min from 50° C. to a curing temperature of 230° C. or 320° C. as specified Tables 5 and 6, and immediately heat-treated for 1 hour at a curing temperature of 230° C. or 320° C. as specified Tables 5 and 6 to cure the patterned film, thereby providing a cured film. Here, the thickness of the prebaked film and that of the patterned film were measured using an optical interference type film thickness measuring apparatus (Lambda Ace STM-602, manufactured by Dainippon Screen Mfg. Co., Ltd.) assuming a refractive index of 1.629, whereas a refractive index of 1.629 or 1.773 was assumed in measuring the thickness of the cured film.

The silicon wafer was taken out after cooling it to a temperature below 50° C., and the resulting cured film was heated to 260° C., coated with a flux (WF-6400, manufactured by Senju Metal Industry Co., Ltd.), and treated for 1 minute. Then, it was washed with pure water for 3 minutes and observed to check for peeling, elution, etc.

Based on the results, the film was judged to be excellent and rated as "3" if the rate of thickness change between before and after the immersion was 3% or less, judged to be good and rated as "2" if the rate of thickness change was more than 3% and 10% or less, and judged to be poor and rated as "1" if the rate of thickness change was more than 10% or peeling was seen. A smaller rate of thickness change represents higher flux resistance.

(3) Evaluation of Reflow Resistance of Non-Photosensitive Resin Composition

For peeling evaluation of copper wiring, an substrate to use for evaluation was prepared as described below. On an 8 inch silicon wafer, a cylinder type copper wiring with a thickness of 10 µm and diameter of 90 µm was formed in such a manner that the copper wires were disposed at regular intervals with a center-to-center distance of 150 µm. This was used as an evaluation substrate.

Using a coater-developer apparatus (ACT-8, manufactured by Tokyo Electron Ltd.), the evaluation substrate was coated with a varnish by spin coating in such a manner that the film thickness after heat treatment would be 15 µm, and prebaking was performed to provide a prebaked film. In all cases, prebaking was performed at 120° C. for 3 minutes. Subsequently, using an inert oven (CLH-21CD-S, manufactured by Koyo Thermo Systems Co., Ltd.), it was heated in a nitrogen flow with an oxygen concentration of 20 ppm or less at a rate of 3.5° C./min from 50° C. to a curing temperature of 230° C. or 320° C. as specified Tables 5 and 6, and immediately heat-treated for 1 hour at a curing temperature of 230° C. or 320° C. as specified in Tables 5 and 6 to cure the prebaked film, thereby providing a cured film. The evaluation substrate (hereinafter referred to as specimen) was taken out after cooling it to a temperature below 50° C.

Next, the specimen was placed on a hot plate adjusted to 260° C. and treated for 1 minute. Then, it was cooled to room temperature. This measurement run was repeated five times. Subsequently, after taking out the specimen, a scanning electron microscope equipped with a focused ion beam machining device (Versa 3D Dual Beam, manufactured by FEI) was used to cut it and observe the cross section at a magnification of 50,000 to perform peeling evaluation of the copper wiring.

Based on the results, the film was judged to be excellent and rated as "3" if no peeling was seen in the side face of the copper wiring, judged to be fair and rated as "2" if defects such as voids were seen in part of it, and judged to be poor and rated as "1" if peeling was seen. A smaller number of peeled portions, voids, etc., represents higher reflow resistance.

<Evaluation of Photosensitive Resin Composition>

(4) Evaluation of Compatibility of Photosensitive Resin Composition

A varnish (resin composition) was prepared and observed in the solution state. Then, using a coater-developer apparatus (ACT-8, manufactured by Tokyo Electron Ltd.), spin coating was performed to coat an 8 inch silicon wafer in such a manner that the film thickness after development would be 20 µm, and then prebaking was performed to provide a prebaked film. Prebaking was performed at 120° C. for 3 minutes or performed at 110° C. for 3 minutes when the specimen contained the component (D-2). The resulting prebaked film was developed with an aqueous solution containing 2.38 mass % of tetramethyl ammonium (TMAH) (manufactured by Tama Chemicals Co., Ltd.) under conditions where the unirradiated portion of the film would undergo a thickness change of 2 μm between before and after the development step, followed by rinsing with pure water and drying by shaking off water.

The thickness of the prebaked resin film and that of the developed resin film were measured using a Lambda Ace STM-602 optical interference type film thickness measuring apparatus manufactured by Dainippon Screen Mfg. Co., Ltd. assuming a refractive index of 1.629.

Based on the results, the film was judged to be excellent and rated as "3" if no white haze was seen in the solution or in the resin film after preparation or development, judged to be fair and rated as "2" if white haze was seen in the resin film after preparation or development under light from the light source of Lambda Ace STM-602, and judged to be poor and rated as "1" if significant white haze was seen visually in the solution or in the resin film after preparation or development.

(5) Evaluation of Thick Film Processability of Photosensitive Resin Composition

A varnish was prepared and then, using a coater-developer apparatus (ACT-8, manufactured by Tokyo Electron Ltd.), spin coating was performed to coat an 8 inch silicon wafer in such a manner that the film thickness after heat treatment would be 15 μm, and prebaking was performed to provide a prebaked film. Prebaking was performed at 120° C. for 3 minutes or performed at 110° C. for 3 minutes when the specimen contained the component (D-2). Then, the film was irradiated with light to an exposure of of 100 to 2,000 mJ/cm$^2$ using a ghi-line mask aligner (PEM-6M, manufactured by Union Optical Co., Ltd.). The circular pattern used for the light irradiation had a size of 20 μm. The irradiated film was developed with an aqueous solution containing 2.38 mass % of tetramethyl ammonium (TMAH) (manufactured by Tama Chemicals Co., Ltd.) under conditions where the unirradiated portion of the film would undergo a thickness change of 2 μm between before and after the development step, followed by rinsing with pure water and drying by shaking off water to provide a patterned film. Here, the thickness of the prebaked film and that of the developed film were measured with a Lambda Ace STM-602 optical interference type film thickness measuring apparatus manufactured by Dainippon Screen Mfg. Co., Ltd. assuming a refractive index of 1.629.

The minimum light exposure required to produce a 20 μm opening in the developed film using a 20 μm circular pattern was defined as the sensitivity. Based on the results, the film was judged to be excellent and rated as "4" if the sensitivity was 700 mJ/cm$^2$ or less, judged to be good and rated as "3" if the sensitivity was more than 700 mJ/cm$^2$ and 800 mJ/cm$^2$ or less, judged to be fair and rated as "2" if the sensitivity was more than 800 mJ/cm$^2$ and 1,000 mJ/cm$^2$ or less, and judged to be poor and rated as "1" if the sensitivity was more than 1,000 mJ/cm$^2$.

A smaller minimum light exposure required to produce a 20 μm opening in the developed film using a 20 μm circular pattern represents a higher thick film processability.

(6) Evaluation of Flux Resistance of Photosensitive Resin Composition

A varnish was prepared and then, using a coater-developer apparatus (ACT-8, manufactured by Tokyo Electron Ltd.), spin coating was performed to coat an 8 inch silicon wafer in such a manner that the film thickness after heat treatment would be 15 μm, and prebaking was performed to provide a prebaked film. Prebaking was performed at 120° C. for 3 minutes or performed at 110° C. for 3 minutes when the specimen contained the component (D-2). Then, in a ghi-line mask aligner (PEM-6M, manufactured by Union Optical Co., Ltd.), the film was irradiated to the minimum light exposure required to produce a 50 μm opening using a 50 μm circular pattern. The circular pattern used for the light irradiation had a size of 50 μm. The irradiated film was developed with an aqueous solution containing 2.38 mass % of tetramethyl ammonium (TMAH) (manufactured by Tama Chemicals Co., Ltd.) under conditions where the unirradiated portion of the film would undergo a thickness change of 2 μm between before and after the development step, followed by rinsing with pure water and drying by shaking off water to provide a patterned film.

Subsequently, the patterned film was put in an inert oven (CLH-21CD-S, manufactured by Koyo Thermo Systems Co., Ltd.), heated in a nitrogen flow with an oxygen concentration of 20 ppm or less at a rate of 3.5° C./min from 50° C. to a curing temperature of 230° C. or 320° C. as specified Tables 7 and 8, and immediately heat-treated for 1 hour at a curing temperature of 230° C. or 320° C. as specified Tables 5 to 8 to cure the patterned film, thereby providing a cured film. Here, the thickness of the prebaked film and that of the patterned film were measured using an optical interference type film thickness measuring apparatus (Lambda Ace STM-602, manufactured by Dainippon Screen Mfg. Co., Ltd.) assuming a refractive index of 1.629, whereas a refractive index of 1.629 or 1.773 was assumed in measuring the thickness of the cured film.

The silicon wafer was taken out after cooling it to a temperature below 50° C., and the resulting cured film was heated to 260° C., coated with a flux (WF-6400, manufactured by Senju Metal Industry Co., Ltd.), and treated for 1 minute. Then, it was washed with pure water for 3 minutes and observed to check for peeling, elution, etc.

Based on the results, the film was judged to be excellent and rated as "3" if the rate of thickness change between before and after the immersion was 3% or less, judged to be good and rated as "2" if the rate of thickness change was more than 3% and 10% or less, and judged to be poor and rated as "1" if the rate of thickness change was more than 10% or peeling was seen. A smaller rate of thickness change represents higher flux resistance.

(7) Evaluation of Reflow Resistance of Photosensitive Resin Composition

For peeling evaluation of copper wiring, a substrate to use for evaluation was prepared as described below. On an 8 inch silicon wafer, a cylinder type copper wiring with a thickness of 10 μm and diameter of 90 μm was formed in such a manner that the copper wires were disposed at regular intervals with a center-to-center distance of 150 μm. This was used as an evaluation substrate.

Using a coater-developer apparatus (ACT-8, manufactured by Tokyo Electron Ltd.), the evaluation substrate was coated with a varnish by spin coating in such a manner that the film thickness after heat treatment would be 15 μm, and prebaking was performed to provide a prebaked film. Prebaking was performed at 120° C. for 3 minutes or performed at 110° C. for 3 minutes when the specimen contained the component (D-2). Subsequently, using an inert oven (CLH-21CD-S, manufactured by Koyo Thermo Systems Co., Ltd.), it was heated in a nitrogen flow with an oxygen concentration of 20 ppm or less at a rate of 3.5° C./min from 50° C. to a curing temperature of 230° C. or 320° C. as specified Tables 7 and 8, and immediately heat-treated for 1 hour at a curing temperature of 230° C. or 320° C. as specified in Tables 5 to 8 to cure the prebaked film, thereby providing a cured film. The evaluation substrate (hereinafter referred to as specimen) was taken out after cooling it to a temperature below 50° C.

Next, the specimen was placed on a hot plate adjusted to 260° C. and treated for 1 minute. Then, it was cooled to room temperature. This measurement run was repeated five times. Subsequently, after taking out the specimen, a scanning electron microscope equipped with a focused ion beam machining device (Versa 3D Dual Beam, manufactured by FEI) was used to cut it and observe the cross section at a magnification of 50,000 to perform peeling evaluation of the copper wiring.

Based on the results, the film was judged to be excellent and rated as "3" if no peeling was seen in the side face of the copper wiring, judged to be fair and rated as "2" if defects such as voids were seen in part of it, and judged to be poor and rated as "1" if peeling was seen.

A smaller number of peeled portions, voids, etc., represents higher reflow resistance.

Synthesis Example 1 Synthesis of Hydroxyl-Containing Di-Amine Compounds

First, 18.3 g (0.05 mole) of 2,2-bis(3-amino-4-hydroxyphenyl) hexafluoropropane (manufactured by Central Glass Co., Ltd., hereinafter referred to as BAHF) was dissolved in 100 mL of acetone and 17.4 g (0.3 mole) of propylene oxide (manufactured by Tokyo Chemical Industry Co., Ltd.), and cooled to −15° C. Then, a solution of 20.4 g (0.11 mole) of 3-nitrobenzoyl chloride (manufactured by Tokyo Chemical Industry Co., Ltd.) dissolved in 100 mL of acetone was added dropwise. After the end of dropwise addition, the solution was stirred at −15° C. for 4 hours, followed by leaving it to return to room temperature. The resulting white solid precipitate was separated out by filtration and vacuum-dried at 50° C.

A 30 g portion of the resulting white solid was put in a 300 mL stainless steel autoclave and dispersed in 250 mL of methyl cellosolve, followed by adding 2 g of 5% palladium-carbon (manufactured by Wako Pure Chemical Industries, Ltd.). Then, a balloon was used to introduce hydrogen into the solution to cause a reduction reaction at room temperature. About 2 hours later, the reaction was terminated after confirming that the balloon would deflate no more. After the end of the reaction, the solution was filtrated to remove the palladium compound used as catalyst and concentrated in a rotary evaporator to provide a hydroxyl-containing di-amine compound as represented by the formula given below.

[Chemical formula 30]

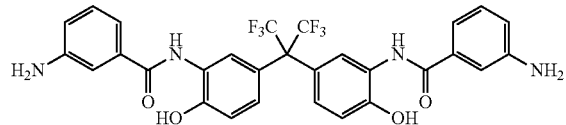

Synthesis Example 2 Synthesis of Polyimide Precursor (A-1)

In a dry nitrogen flow, 51.9 g (0.086 mole) of the hydroxyl-containing di-amine prepared in Synthesis example 1 and 0.99 g (0.004 mole) of 1,3-bis(3-aminopropyl) tetramethyl disiloxane (hereinafter referred to as SiDA) were dissolved in 200 g of NMP. To the resulting solution, 31.0 g (0.10 mole) of 4,4'-oxydiphthalic anhydride (hereinafter referred to as ODPA) was added and stirred at 40° C. for 2 hours. Then, 1.1 g (0.01 mole) of 3-aminophenol (manufactured by Tokyo Chemical Industry Co., Ltd.), used as an end cap compound, was added together with 10 g of NMP and allowed to react at 40° C. for 1 hour. Subsequently, a solution prepared by diluting 7.14 g (0.06 mole) of dimethyl formamide dimethyl acetal (supplied by Mitsubishi Rayon Co., Ltd., hereinafter referred to as DFA) with 5 g of NMP was added dropwise over 10 minutes. After the dropping, stirring was continued at 40° C. for 2 hours. After the stirring, the solution was poured in 2 L of water, and the resulting solid polymer precipitate was collected by filtration. In addition, washing in 2 L of water was performed three times, and the collected solid polymer material was dried at 50° C. in a vacuum dryer for 72 hours to provide a polyimide precursor (A-1).

Synthesis Example 3 Synthesis of Polyimide Precursor (A-2)

In a dry nitrogen flow, 41.1 g (0.068 mole) of the hydroxyl-containing di-amine prepared in Synthesis example 1, 18.00 g (0.018 mole) of a di-amine compound containing propylene oxide and tetramethylene ether glycol structures (RT-1000, manufactured by HUNTSMAN), and 0.99 g (0.004 mole) of SiDA were dissolved in 200 g of NMP. To this solution, 31.0 g (0.10 mole) of ODPA was added and stirred at 40° C. for 2 hours. Then, 1.1 g (0.01 mole) of 3-aminophenol, used as an end cap compound, was added together with 10 g of NMP and allowed to react at 40° C. for 1 hour. Subsequently, a solution prepared by diluting 5.95 g (0.05 mole) of DFA (manufactured by Mitsubishi Rayon Co., Ltd.) with 5 g of NMP was added dropwise over 10 minutes. After the dropping, stirring was continued at 40° C. for 2 hours. After the stirring, the solution was poured in 2 L of water, and the resulting solid polymer precipitate was collected by filtration. In addition, washing in 2 L of water was performed three times, and the collected solid polymer material was dried at 50° C. in a vacuum dryer for 72 hours to provide a polyimide precursor (A-2).

Synthesis Example 4 Synthesis of Polybenzoxazole Precursor (A-3)

In a dry nitrogen flow, 34.8 g (0.095 mole) of BAHF was dissolved in 257 g of NMP. To the resulting solution, 17.20 g (0.048 mole) of 1,1'-(4,4'-oxybenzoyl) diimidazole (hereinafter referred to as PBOM) was added together with 20 g of NMP and allowed to react at 85° C. for 3 hours. Subsequently, 1.24 g (0.005 mole) of SiDA and 14.33 g (0.040 mole) of PBOM were added together with 50 g of NMP and allowed to react at 85° C. for 1 hour. In addition, 3.94 g (0.024 mole) of 5-norbornene-2,3-dicarboxylic anhydride, used as an end cap compound, was added together with 10 g of NMP and allowed to react at 85° C. for 30 minutes. After the end of reaction, it was allowed to cool to room temperature and 52.82 g (0.50 mole) of acetic acid was added together with 87 g of NMP and stirred at room temperature for 1 hour. After the end of the stirring, the solution was poured in 3 L of water to provide a white precipitate. This precipitate was collected by filtration, rinsed with water three times, and dried in a forced-air drier at 50° C. for 3 days to provide a powdery polybenzoxazole precursor (A-3).

Synthesis Example 5 Synthesis of Polybenzoxazole Precursor (A-4)

In a dry nitrogen flow, 27.47 g (0.075 mole) of BAHF was dissolved in 257 g of NMP. Subsequently, 17.20 g (0.048 mole) of PBOM was added together with 20 g of NMP and allowed to react at 85° C. for 3 hours. Subsequently, 20.00 g (0.020 mole) of RT-1000 (manufactured by HUNTSMAN), 1.24 g (0.005 mole) of SiDA, and 14.33 g (0.040 mole) of PBOM were added together with 50 g of NMP and allowed to react at 85° C. for 1 hour. In addition, 3.94 g (0.024 mole) of 5-norbornene-2,3-dicarboxylic anhydride, used as an end cap compound, was added together with 10 g of NMP and allowed to react at 85° C. for 30 minutes. After the end of reaction, it was allowed to cool to room temperature and 52.82 g (0.50 mole) of acetic acid was added together with 87 g of NMP and stirred at room temperature for 1 hour. After the end of the stirring, the solution was poured in 3 L of water to provide a white precipitate. This precipitate was collected by filtration, rinsed with water three times, and dried in a forced-air drier at 50° C. for 3 days to provide a powdery polybenzoxazole precursor (A-4).

Synthesis Example 6 Synthesis of Polyimide (A-5)

In a dry nitrogen flow, 29.30 g (0.080 mole) of BAHF, 1.24 g (0.005 mole) of SiDA, and 3.27 g (0.030 mole) of 3-aminophenol, used as an end cap compound, were dissolved in 80 g of NMP. To this solution, 31.2 g (0.10 mole) of ODPA was added together with 20 g of NMP and allowed to react at 60° C. for 1 hour, followed by stirring at 180° C. for 4 hours. After the end of the stirring, the solution was poured in 3 L of water to provide a white precipitate. This precipitate was collected by filtration, rinsed with water three times, and dried in a vacuum dryer at 80° C. for 20 hours to provide powdery polyimide (A-5).

Synthesis Example 8 Synthesis of Polybenzoxazole Precursor (A-6)

In a dry nitrogen air flow, 1.50 g (0.0075 mole) of 4,4'-diaminodiphenyl ether (hereinafter referred to as 4,4'-DAE), 12.82 g (0.035 mole) of BAHF, and 5.00 g (0.0050 mole) of RT-1000 (manufactured by HUNTSMAN) were dissolved in 100 g of NMP. To the resulting solution, diimidazole dodecanoate (7.43 g, 0.023 mole) and PBOM (8.06 g, 0.023 mole) were added together with 25 g of NMP and allowed to react at 85° C. for 3 hours. Subsequently, 0.62 g (0.0025 mole) of SiDA, 0.78 g (0.0025 mole) of ODPA, and 0.82 g (0.0050 mole) of NA were added together with 25 g of NMP and allowed to react at 85° C. for 1 hour. After the end of reaction, it was allowed to cool to room temperature and 13.20 g (0.25 mole) of acetic acid was added together with 25 g of NMP and stirred at room temperature for 1 hour. After the end of the stirring, the solution was poured in 1.5 L of water to provide a white precipitate. This precipitate was collected by filtration, rinsed with water three times, and dried in a forced-air drier at 50° C. for 3 days to provide a powdery polybenzoxazole precursor (A-6).

Synthesis Example 9 Synthesis of Polyimide Precursor (A-7)

In a dried nitrogen flow, 35.4 g (0.0585 mole) of the hydroxyl-containing di-amine prepared in Synthesis example 1 and 6.3 g (0.0315 mole) of 4,4'-DAE were dissolved in 200 g of NMP. To this solution, 31.0 g (0.10 mole) of ODPA was added and stirred at 40° C. for 2 hours. Then, 1.1 g (0.01 mole) of 3-aminophenol, used as an end cap compound, was added together with 10 g of NMP and allowed to react at 40° C. for 1 hour. Subsequently, a solution prepared by diluting 7.14 g (0.06 mole) of DFA with 5 g of NMP was added dropwise over 10 minutes. After the dropping, stirring was continued at 40° C. for 2 hours. After the stirring, the solution was poured in 2 L of water, and the resulting solid polymer precipitate was collected by filtration. In addition, washing in 2 L of water was performed three times, and the collected solid polymer material was dried at 50° C. in a vacuum dryer for 72 hours to provide a polyimide precursor (A-7).

Synthesis Example 10 Synthesis of Polyimide Precursor (A-8)

In a dried nitrogen flow, 24.2 g (0.04 mole) of the hydroxyl-containing di-amine prepared in Synthesis example 1 and 8.0 g (0.04 mole) of 4,4'-DAE were dissolved in 200 g of NMP. To this solution, 31.0 g (0.10 mole) of ODPA was added and stirred at 40° C. for 2 hours. Then, 1.1 g (0.01 mole) of 3-aminophenol, used as an end cap compound, was added together with 10 g of NMP and allowed to react at 40° C. for 1 hour. Subsequently, a solution prepared by diluting 7.14 g (0.06 mole) of DFA with 5 g of NMP was added dropwise over 10 minutes. After the dropping, stirring was continued at 40° C. for 2 hours. After the stirring, the solution was poured in 2 L of water, and the resulting solid polymer precipitate was collected by filtration. In addition, washing in 2 L of water was performed three times, and the collected solid polymer material was dried at 50° C. in a vacuum dryer for 72 hours to provide a polyimide precursor (A-8).

Synthesis Example 11 Synthesis of Polyimide Precursor (A-9)

In a dried nitrogen flow, 52.5 g (0.087 mole) of the hydroxyl-containing di-amine prepared in Synthesis example 1 and 0.6 g (0.003 mole) of 4,4'-DAE were dissolved in 200 g of NMP. To this solution, 31.0 g (0.10 mole) of ODPA was added and stirred at 40° C. for 2 hours. Then, 1.1 g (0.01 mole) of 3-aminophenol, used as an end cap compound, was added together with 10 g of NMP and allowed to react at 40° C. for 1 hour. Subsequently, a solution prepared by diluting 7.14 g (0.06 mole) of DFA with 5 g of NMP was added dropwise over 10 minutes. After the dropping, stirring was continued at 40° C. for 2 hours. After the stirring, the solution was poured in 2 L of water, and the resulting solid polymer precipitate was collected by filtration. In addition, washing in 2 L of water was performed three times, and the collected solid polymer material was dried at 50° C. in a vacuum dryer for 72 hours to provide a polyimide precursor (A-9).

Synthesis Example 12 Synthesis of Polybenzoxazole Precursor (A-10)

In a dry nitrogen flow, 36.63 g, (0.010 mole) of BAHF was dissolved in 307 g of NMP. To the resulting solution, 31.53 g (0.088 mole) of PBOM was added together with 20 g of NMP and allowed to react at 85° C. for 3 hours. In addition, 3.94 g (0.024 mole) of 5-norbornene-2,3-dicarboxylic anhydride, used as an end cap compound, was added together with 10 g of NMP and allowed to react at 85° C. for 30 minutes. After the end of reaction, it was allowed to cool to room temperature and 52.82 g (0.50 mole) of acetic acid was added together with 87 g of NMP and stirred at room temperature for 1 hour. After the end of the stirring, the solution was poured in 3 L of water to provide a white precipitate. This precipitate was collected by filtration, rinsed with water three times, and dried in a forced-air drier at 50° C. for 3 days to provide a powdery polybenzoxazole precursor (A-10).

Synthesis Example 7 Synthesis of Photosensitive Agent (Quinone Diazide Compound) (E-1)

In a dry nitrogen flow, 21.22 g (0.05 mole) of 4,4'-[1-[4-[1-(4-hydroxyphenyl-1)-1-methylethyl]phenyl]ethylidene]bisphenol (manufactured by Honshu Chemical Industry Co., Ltd., hereinafter referred to as TrisP-PA) and 26.8 g (0.10 mole) of 5-naphthoquinone diazide sulfonic acid chloride (NAC-5, manufactured by Toyo Gosei Co., Ltd.) were dissolved in 450 g of γ-butyrolactone at room temperature. To this solution, a mixture of 12.65 g of triethyl amine with 50 g of γ-butyrolactone was added dropwise while maintaining the system below 35° C. After the dropping, stirring was performed at 40° C. for 2 hours. The triethylamine salt was filtered and the filtrate was poured in water. Subsequently, the resulting precipitate was collected by filtration, and then washed with 1 L of 1% hydrochloric acid solution. In addition, washing in 2 L of was performed twice. The resulting precipitate was dried in a vacuum dryer to provide a quinone diazide compound (E-1) as represented by the following formula.

[Chemical formula 31]

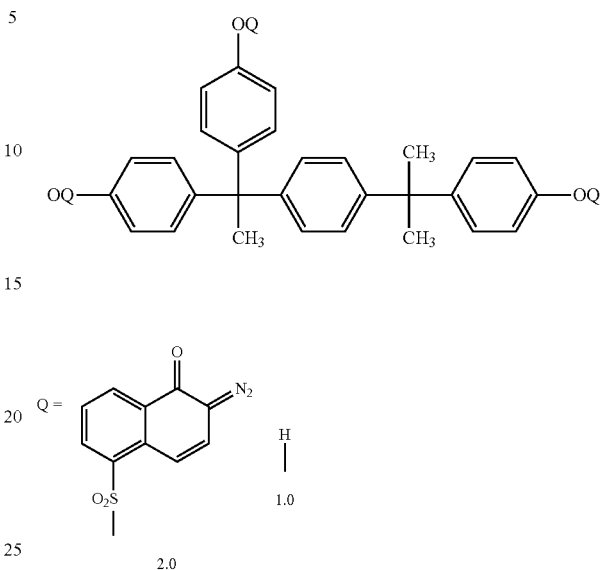

The component (B-1), component (B-2), component (B-3), component (B-4), other phenol resin component (B-5), component (C-1), component (D-1), component (D-2-1), component (D-2-2), component (E-2), and component (F-1) used in Examples and Comparative examples are described below.

The components (B-1) to (B-4) have a structure as shown below, but differ in weight average molecular weight.

[Chemical formula 32]

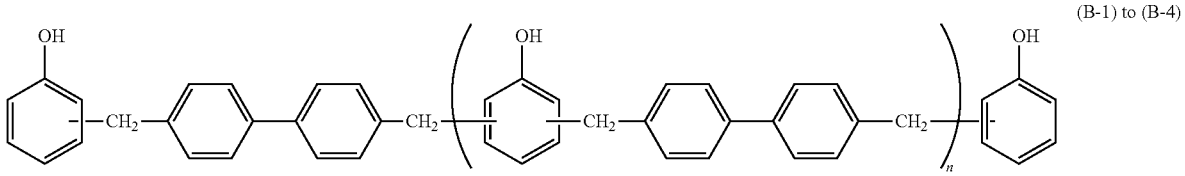

(B-1): MEHC-7851 S, manufactured by Meiwa Plastic Industries, Ltd. (weight average molecular weight 1,380)
(B-2): MEHC-7851 SS, manufactured by Meiwa Plastic Industries, Ltd. (weight average molecular weight 1,100)
(B-3): MEHC-7851 M, manufactured by Meiwa Plastic Industries, Ltd. (weight average molecular weight 1,740)
(B-4): MEHC-7851 H, manufactured by Meiwa Plastic Industries, Ltd. (weight average molecular weight 1,950)
(B-5): novolac resin (m-xylene/p-xylene=45/55) (weight average molecular weight 1,500) The component (C-1) has a structure as shown below.

[Chemical formula 33]

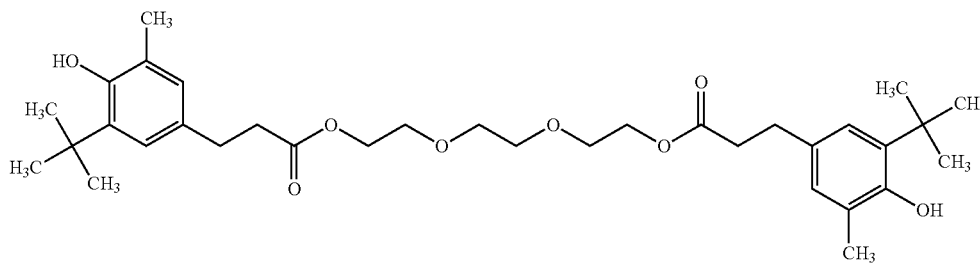

(C-1)

The component (D-1) has a structure as shown below.

[Chemical formula 34]

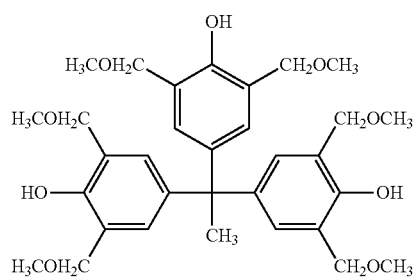

(D-1)

The component (D-2-1) has a structure as shown below.

[Chemical formula 35]

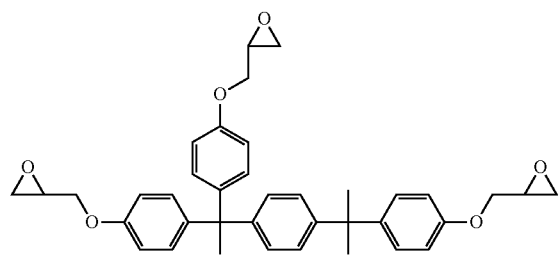

(D-2-1)

The component (D-2-2) has a structure as shown below.

[Chemical formula 36]

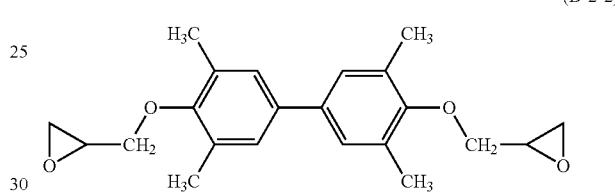

(D-2-2)

Examples 1 to 6, 8 to 30, and 32 to 68, and Comparative Examples 1 to 34

To prepare varnish samples, the phenol resins (B-1) to (B-5), used as the component (B), antioxidant (C-1), used as the component (C), thermal crosslinking agents (D-1), (D-2-1), and (D-2-2), used as the component (D), and photosensitive agent (E-1), used as the component (E), were added in the amounts (in parts by mass) shown in Tables 1 to 4 to 100 parts by mass of the resins (A-1) to (A-10) prepared in Synthesize examples 2 to 12. Their properties were measured by the aforementioned evaluation methods. The proportions of the components are listed in Tables 1 to 4, and results of measurement are listed in Tables 5 to 8.

TABLE 1

| | component | | | | | | | |
|---|---|---|---|---|---|---|---|---|
| | resin | phenol resin | | antioxidant | thermal crosslinking agent | photosensitive compound | other | |
| | component (A) | component (B) | other | component (C) | component (D) | component (E) | other component | solvent |
| Example 1 | (A-1) (100 parts by mass) | (B-1) (49 parts by mass) | — | (C-1) (0.5 parts by mass) | — | — | — | EL/GBL 40/60 |
| Example 2 | (A-1) (100 parts by mass) | (B-1) (25 parts by mass) | — | (C-1) (0.5 parts by mass) | — | — | — | EL/GBL 40/60 |
| Example 3 | (A-1) (100 parts by mass) | (B-1) (19 parts by mass) | — | (C-1) (0.5 parts by mass) | — | — | — | EL/GBL 40/60 |
| Example 4 | (A-1) (100 parts by mass) | (B-1) (15 parts by mass) | — | (C-1) (0.5 parts by mass) | — | — | — | EL/GBL 40/60 |
| Example 5 | (A-1) (100 parts by mass) | (B-1) (10 parts by mass) | — | (C-1) (0.) parts by mass) | — | — | — | EL/GBL 40/60 |

TABLE 1-continued

| | resin component (A) | phenol resin component (B) | other | antioxidant component (C) | thermal crosslinking agent component (D) | photosensitive compound component (E) | other component | solvent |
|---|---|---|---|---|---|---|---|---|
| Example 6 | (A-1) (100 parts by mass) | (B-1) (5 parts by mass) | — | (C-1) (0.5 parts by mass) | — | — | — | EL/GBL 40/60 |
| Example 8 | (A-1) (100 parts by mass) | (B-1) (49 parts by mass) | — | (C-1) (0.5 parts by mass) | (D-1) (15 parts by mass) | — | — | EL/GBL 40/60 |
| Example 9 | (A-1) (100 parts by mass) | (B-1) (25 parts by mass) | — | (C-1) (0.5 parts by mass) | (D-1) (15 parts by mass) | — | — | EL/GBL 40/60 |
| Example 10 | (A-1) (100 parts by mass) | (B-1) (19 parts by mass) | — | (C-1) (0.5 parts by mass) | (D-1) (15 parts by mass) | — | — | EL/GBL 40/60 |
| Example 11 | (A-1) (100 parts by mass) | (B-1) (15 parts by mass) | — | (C-1) (0.5 parts by mass) | (D-1) (15 parts by mass) | — | — | EL/GBL 40/60 |
| Example 12 | (A-1) (100 parts by mass) | (B-1) (10 parts by mass) | — | (C-1) (0.5 parts by mass) | (D-1) (15 parts by mass) | — | — | EL/GBL 40/60 |
| Example 13 | (A-1) (100 parts by mass) | (B-1) (5 parts by mass) | — | (C-1) (0.5 parts by mass) | (D-1) (15 parts by mass) | — | — | EL/GBL 40/60 |
| Example 14 | (A-1) (100 parts by mass) | (B-2) (15 parts by mass) | — | (C-1) (0.5 parts by mass) | (D-1) (15 parts by mass) | — | — | EL/GBL 40/60 |
| Example 15 | (A-1) (100 parts by mass) | (B-3) (15 parts by mass) | — | (C-1) (0.5 parts by mass) | (D-1) (15 parts by mass) | — | — | EL/GBL 40/60 |
| Example 16 | (A-1) (100 parts by mass) | (B-4) (15 parts by mass) | — | (C-1) (0.5 parts by mass) | (D-1) (15 parts by mass) | — | — | EL/GBL 40/60 |
| Example 17 | (A-2) (100 parts by mass) | (B-1) (15 parts by mass) | — | (C-1) (0.5 parts by mass) | — | — | — | EL/GBL 40/60 |
| Example 18 | (A-3) (100 parts by mass) | (B-1) (15 parts by mass) | — | (C-1) (0.5 parts by mass) | — | — | — | EL/GBL 40/60 |
| Example 19 | (A-4) (100 parts by mass) | (B-1) (15 parts by mass) | — | (C-1) (0.5 parts by mass) | — | — | — | EL/GBL 40/60 |
| Example 20 | (A-5) (100 parts by mass) | (B-1) (15 parts by mass) | — | (C-1) (0.5 parts by mass) | — | — | — | EL/GBL 40/60 |
| Example 21 | (A-2) (100 parts by mass) | (B-1) (15 parts by mass) | — | (C-1) (0.5 parts by mass) | (D-1) (15 parts by mass) | — | — | EL/GBL 40/60 |
| Example 22 | (A-3) (100 parts by mass) | (B-1) (15 parts by mass) | — | (C-1) (0.5 parts by mass) | (D-1) (15 parts by mass) | — | — | EL/GBL 40/60 |
| Example 23 | (A-4) (100 parts by mass) | (B-1) (15 parts by mass) | — | (C-1) (0.5 parts by mass) | (D-1) (15 parts by mass) | — | — | EL/GBL 40/60 |
| Example 24 | (A-5) (100 parts by mass) | (B-1) (15 parts by mass) | — | (C-1) (0.5 parts by mass) | (D-1) (15 parts by mass) | — | — | EL/GBL 40/60 |
| Example 49 | (A-6) (100 parts by mass) | (B-1) (10 parts by mass) | — | (C-1) (0.5 parts by mass) | — | — | — | EL/GBL 40/60 |
| Example 50 | (A-7) (100 parts by mass) | (B-1) (10 parts by mass) | — | (C-1) (0.5 parts by mass) | — | — | — | EL/GBL 40/60 |
| Example 51 | (A-10) (100 parts by mass) | (B-1) (10 parts by mass) | — | (C-1) (0.5 parts by mass) | — | — | — | EL/GBL 40/60 |
| Example 52 | (A-6) (100 parts by mass) | (B-1) (10 parts by mass) | — | (C-1) (0.5 parts by mass) | (D-1) (15 parts by mass) | — | — | EL/GBL 40/60 |
| Example 53 | (A-7) (100 parts by mass) | (B-1) (10 parts by mass) | — | (C-1) (0.5 parts by mass) | (D-1) (15 parts by mass) | — | — | EL/GBL 40/60 |
| Example 54 | (A-8) (100 parts by mass) | (B-1) (10 parts by mass) | — | (C-1) (0.5 parts by mass) | (D-1) (15 parts by mass) | — | — | EL/GBL 40/60 |
| Example 55 | (A-9) (100 parts by mass) | (B-1) (10 parts by mass) | — | (C-1) (0.5 parts by mass) | (D-1) (15 parts by mass) | — | — | EL/GBL 40/60 |
| Example 56 | (A-10) (100 parts by mass) | (B-1) (10 parts by mass) | — | (C-1) (0.5 parts by mass) | (U-1) (15 parts by mass) | — | — | EL/GBL 40/60 |

TABLE 2

| | resin component (A) | phenol resin component (B) | other | antioxidant component (C) | thermal crosslinking agent component (D) | photosensitive compound component (E) | other component | solvent |
|---|---|---|---|---|---|---|---|---|
| Comparative example 1 | (A-1) (100 parts by mass) | — | — | — | — | — | — | EL/GBL 40/60 |
| Comparative example 2 | (A-1) (100 parts by mass) | (B-1) (25 parts by mass) | — | — | — | — | — | EL/GBL 40/60 |
| Comparative | (A-1) | (B-1) | — | — | — | — | — | EL/GBL |

TABLE 2-continued

| | resin component (A) | phenol resin component (B) | other | antioxidant component (C) | thermal crosslinking agent component (D) | photo-sensitive compound component (E) | other component | solvent |
|---|---|---|---|---|---|---|---|---|
| example 3 | (100 parts by mass) | (15 parts by mass) | | | | | | 40/60 |
| Comparative example 4 | (A-1) (100 parts by mass) | — | — | (C-1) (0.5 parts by mass) | — | — | — | EL/GBL 40/60 |
| Comparative example 5 | (A-2) (100 parts by mass) | — | — | (C-1) (0.5 parts by mass) | — | — | — | EL/GBL 40/60 |
| Comparative example 6 | (A-1) (100 parts by mass) | — | — | — | (D-1) (15 parts by mass) | — | — | EL/GBL 40/60 |
| Comparative example 7 | (A-1) (100 parts by mass) | — | — | (C-1) (0.5 parts by mass) | (D-1) (15 parts by mass) | — | — | EL/GBL 40/60 |
| Comparative example 8 | (A-1) (100 parts by mass) | — | (B-5) (15 parts by mass) | — | — | — | — | EL/GBL 40/60 |
| Comparative example 9 | (A-1) (100 parts by mass) | — | (B-5) (15 parts by mass) | (C-1) (0.5 parts by mass) | — | — | — | EL/GBL 40/60 |
| Comparative example 10 | (A-2) (100 parts by mass) | — | — | — | — | — | — | EL/GBL 40/60 |
| Comparative example 11 | (A-4) (100 parts by mass) | — | — | — | — | — | — | EL/GBL 40/60 |
| Comparative example 12 | (A-2) (100 parts by mass) | (B-1) (15 parts by mass) | — | — | — | — | — | EL/GBL 40/60 |
| Comparative example 13 | (A-4) (100 parts by mass) | (B-1) (15 parts by mass) | — | — | — | — | — | EL/GB L 40/60 |
| Comparative example 27 | (A-1) (100 parts by mass) | (B-1) (55 parts by mass) | — | (C-1) (0.5 parts by mass) | — | — | — | EL/GB L 40/60 |
| Comparative example 28 | (A-1) (100 parts by mass) | (B-1) (3 parts by mass) | — | (C-1) (0.5 parts by mass) | — | — | — | EL/GBL 40/60 |
| Comparative example 29 | (A-1) (100 parts by mass) | (B-1) (60 parts by mass) | — | (C-1) (0.5 parts by mass) | (D-1) (15 parts by mass) | — | — | EL/GBL 40/60 |
| Comparative example 30 | (A-1) (100 parts by mass) | (B-1) (3 parts by mass) | — | (C-1) (0.5 parts by mass) | (D-1) (15 parts by mass) | — | — | EL/GBL 40/60 |

TABLE 3

| | resin component (A) | phenol resin component (B) | other | antioxidant component (C) | thermal crosslinking agent component (D) | photosensitive compound component (E) | component (F) | solvent |
|---|---|---|---|---|---|---|---|---|
| Example 25 | (A-1) (100 parts by mass) | (B-1) (49 parts by mass) | — | (C-1) (0.5 parts by mass) | — | (E-1) (20 parts by mass) | — | EL/GBL 40/60 |
| Example 26 | (A-1) (100 parts by mass) | (B-1) (25 parts by mass) | — | (C-1) (0.5 parts by mass) | — | (E-1) (20 parts by mass) | — | EL/GBL 40/60 |
| Example 27 | (A-1) (100 parts by mass) | (B-1) (19 parts by mass) | — | (C-1) (0.5 parts by mass) | — | (E-1) (20 parts by mass) | — | EL/GBL 40/60 |
| Example 28 | (A-1) (100 parts by mass) | (B-1) (15 parts by mass) | — | (C-1) (0.5 parts by mass) | — | (E-1) (20 parts by mass) | — | EL/GBL 40/60 |
| Example 29 | (A-1) (100 parts by mass) | (B-1) (10 parts by mass) | — | (C-1) (0.5 parts by mass) | — | (E-1) (20 parts by mass) | — | EL/GBL 40/60 |
| Example 30 | (A-1) (100 parts by mass) | (B-1) (5 parts by mass) | — | (C-1) (0.5 parts by mass) | — | (E-1) (20 parts by mass) | — | EL/GBL 40/60 |
| Example 32 | (A-1) (100 parts by mass) | (B-1) (49 parts by mass) | — | (C-1) (0.5 parts by mass) | (D-1) (15 parts by mass) | (E-1) (20 parts by mass) | — | EL/GBL 40/60 |
| Example 33 | (A-1) (100 parts by mass) | (B-1) (25 parts by mass) | — | (C-1) (0.5 parts by mass) | (D-1) (15 parts by mass) | (E-1) (20 parts by mass) | — | EL/GBL 40/60 |
| Example 34 | (A-1) (100 parts by mass) | (B-1) (19 parts by mass) | — | (C-1) (0.5 parts by mass) | (D-1) (15 parts by mass) | (E-1) (20 parts by mass) | — | EL/GBL 40/60 |
| Example 35 | (A-1) (100 parts by mass) | (B-1) (15 parts by mass) | — | (C-1) (0.5 parts by mass) | (D-1) (15 parts by mass) | (E-1) (20 parts by mass) | — | ELIGEIL |
| Example 36 | (A-1) (100 parts by mass) | (B-1) (10 parts by mass) | — | (C-1) (0.5 parts by mass) | (D-1) (15 parts by mass) | (E-1) (20 parts by mass) | — | ELIGEIL 40/60 |
| Example 37 | (A-1) (100 parts by mass) | (B-1) (5 parts by mass) | — | (C-1) (0.5 parts by mass) | (D-1) (15 parts by mass) | (E-1) (20 parts by mass) | — | EL/GBL 40/60 |
| Example 38 | (A-1) (100 parts by mass) | (B-2) (15 parts by mass) | — | (C-1) (0.5 parts by mass) | (D-1) (15 parts by mass) | (E-1) (20 parts by mass) | — | EL/GBL 40/60 |
| Example 39 | (A-1) (100 parts by mass) | (B-3) (15 parts by mass) | — | (C-1) (0.5 parts by mass) | (D-1) (15 parts by mass) | (E-1) (20 parts by mass) | — | EL/GBL 40/60 |

TABLE 3-continued

| | resin component (A) | phenol resin component (B) | other | antioxidant component (C) | thermal crosslinking agent component (D) | photosensitive compound component (E) | component (F) | solvent |
|---|---|---|---|---|---|---|---|---|
| Example 40 | (A-1) (100 parts by mass) | (B-4) (15 parts by mass) | — | (C-1) (0.5 parts by mass) | (D-1) (15 parts by mass) | (E-1) (20 parts by mass) | — | EL/GBL 40/60 |
| Example 41 | (A-)) (100 parts by mass) | (B-1) (15 parts by mass) | — | (C-1) (0.5 parts by mass) | — | (E-1) (20 parts by mass) | — | EL/GBL 40/60 |
| Example 42 | (A-3) (100 parts by mass) | (B-1) (15 parts by mass) | — | (C-1) (0.5 parts by mass) | — | (E-1) (20 parts by mass) | — | EL/GBL 40/60 |
| Example 43 | (A-4) (100 parts by mass) | (B-1) (15 parts by mass) | — | (C-1) (0.5 parts by mass) | — | (E-1) (20 parts by mass) | — | EL/GBL 40/60 |
| Example 44 | (A-5) (100 parts by mass) | (B-1) (15 parts by mass) | — | (C-1) (0.5 parts by mass) | — | (E-1) (20 parts by mass) | — | EL/GBL 40/60 |
| Example 45 | (A-2) (100 parts by mass) | (B-1) (15 parts by mass) | — | (C-1) (0.5 parts by mass) | (D-1) (15 parts by mass) | (E-1) (20 parts by mass) | — | EL/GBL 40/60 |
| Example 46 | (A-3) (100 parts by mass) | (B-1) (15 parts by mass) | — | (C-1) (0.5 parts by mass) | (D-1) (15 parts by mass) | (E-1) (20 parts by mass) | — | EL/GBL 40/60 |
| Example 47 | (A-4) (100 parts by mass) | (B-1) (15 parts by mass) | — | (C-1) (0.5 parts by mass) | (D-1) (15 parts by mass) | (E-1) (20 parts by mass) | — | ELIGEIL 40/60 |
| Example 48 | (A-5) (100 parts by mass) | (B-1) (15 parts by mass) | — | (C-1) (0.5 parts by mass) | (D-1) (15 parts by mass) | (E-1) (20 parts by mass) | — | ELIGEIL 40/60 |
| Example 57 | (A-6) (100 parts by mass) | (B-1) (10 parts by mass) | — | (C-1) (0.5 parts by mass) | — | (E-1) (20 parts by mass) | — | EL/GBL 40/60 |
| Example 58 | (A-7) (100 parts by mass) | (B-1) (10 parts by mass) | — | (C-1) (0.5 parts by mass) | — | (E-1) (20 parts by mass) | — | EL/GBL 40/60 |
| Example 59 | (A-10) (100 parts by mass) | (B-1) (10 parts by mass) | — | (C-1) (0.5 parts by mass) | — | (E-1) (20 parts by mass) | — | EL/GBL 40/60 |
| Example 60 | (A-6) (100 parts by mass) | (B-1) (10 parts by mass) | — | (C-1) (0.5 parts by mass) | (D-1) (15 parts by mass) | (E-1) (20 parts by mass) | — | EL/GBL 40/60 |
| Example 61 | (A-7) (100 parts by mass) | (B-1) (10 parts by mass) | — | (C-1) (0.5 parts by mass) | (D-1) (15 parts by mass) | (E-1) (20 parts by mass) | — | EL/GBL 40/60 |
| Example 62 | (A-8) (100 parts by mass) | (B-1) (10 parts by mass) | — | (C-1) (0.5 parts by mass) | (D-1) (15 parts by mass) | (E-1) (20 parts by mass) | — | EL/GBL 40/60 |
| Example 63 | (A-9) (100 parts by mass) | (B-1) (10 parts by mass) | — | (C-1) (0.5 parts by mass) | (D-1) (15 parts by mass) | (E-1) (20 parts by mass) | — | EL/GBL 40/60 |
| Example 64 | (A-10) (100 parts by mass) | (B-1) (10 parts by mass) | — | (C-1) (0.5 parts by mass) | (D-1) (15 parts by mass) | (E-1) (20 parts by mass) | — | EL/GBL 40/60 |
| Example 65 | (A-1) (100 parts by mass) | (B-1) (15 parts by mass) | — | (C-1) (0.5 parts by mass) | (D-1) (10 parts by mass) (D-2-1) (5 parts by mass) | (E-1) (20 parts by mass) | — | EL/GBL 40/60 |
| Example 66 | (A-1) (100 parts by mass) | (B-1) (15 parts by mass) | — | (C-1) (0.5 parts by mass) | (D-1) (10 parts by mass) (D-2-2) (5 parts by mass) | (E-1) (20 parts by mass) | — | EL/GBL 40/60 |
| Example 67 | (A-6) (100 parts by mass) | (B-1) (10 parts by mass) | — | (C-1) (0.5 parts by mass) | (D-1) (10 parts by mass) (D-2-1) (5 parts by mass) | (E-1) (20 parts by mass) | — | EL/GBL 40/60 |
| Example 67 | (A-6) (100 parts by mass) | (B-1) (10 parts by mass) | — | (C-1) (0.5 parts by mass) | (D-1) (10 parts by mass) (D-2-2) (5 parts by mass) | (E-1) (20 parts by mass) | — | EL/GBL 40/60 |

TABLE 4

| | resin component (A) | phenol resin component (B) | other | antioxidant component (C) | thermal crosslinking agent component (D) | photosensitive compound component (E) | component (F) | solvent |
|---|---|---|---|---|---|---|---|---|
| Comparative example 14 | (A-1) (100 parts by mass) | — | — | — | — | (E-1) (20 parts by mass) | — | EL/GBL 40/60 |
| Comparative example 15 | (A-1) (100 parts by mass) | (B-1) (25 parts by mass) | — | — | — | (E-1) (20 parts by mass) | — | EL/GBL 40/60 |
| Comparative example 16 | (A-1) (100 parts by mass) | (B-1) (15 parts by mass) | — | — | — | (E-1) (20 parts by mass) | — | EL/GBL 40/60 |
| Comparative example 17 | (A-1) (100 parts by mass) | — | — | (C-1) (0.5 parts by mass) | — | (E-1) (20 parts by mass) | — | EL/GBL 40/60 |

TABLE 4-continued

| | component | | | | | | | |
|---|---|---|---|---|---|---|---|---|
| | resin component | phenol resin | | antioxidant component | thermal crosslinking agent | photosensitive compound | component | |
| | (A) | component (B) | other | (C) | component (D) | component (E) | (F) | solvent |
| Comparative example 18 | (A-2) (100 parts by mass) | — | — | (C-1) (0.5 parts by mass) | — | (E-1) (20 parts by mass) | — | EL/GBL 40/60 |
| Comparative example 19 | (A-1) (100 parts by mass) | — | — | — | (D-1) (15 parts by mass) | (E-1) (20 parts by mass) | — | EL/GBL 40/60 |
| Comparative example 20 | (A-1) (100 parts by mass) | — | — | (C-1) (0.5 parts by mass) | (D-1) (15 parts by mass) | (E-1) (20 parts by mass) | — | EL/GBL 40/60 |
| Comparative example 21 | (A-1) (100 parts by mass) | — | (B-5) (15 parts by mass) | — | — | (E-1) (20 parts by mass) | — | EL/GBL 40/60 |
| Comparative example 22 | (A-1) (100 parts by mass) | — | (B-5) (15 parts by mass) | (C-1) (0.5 parts by mass) | — | (E-1) (20 parts by mass) | — | EL/GBL 40/60 |
| Comparative example 23 | (A-2) (100 parts by mass) | — | — | — | — | (E-1) (20 parts by mass) | — | EL/GBL 40/60 |
| Comparative example 24 | (A-4) (100 parts by mass) | — | — | — | — | (E-1) (20 parts by mass) | — | EL/GBL 40/60 |
| Comparative example 25 | (A-2) (100 parts by mass) | (B-1) (15 parts by mass) | — | — | — | (E-1) (20 parts by mass) | — | EL/GBL 40/60 |
| Comparative example 26 | (A-4) (100 parts by mass) | (B-1) (15 parts by mass) | — | — | — | (E-1) (20 parts by mass) | — | EL/GBL 40/60 |
| Comparative example 31 | (A-1) (100 parts by mass) | (B-1) (55 parts by mass) | — | (C-1) (0.5 parts by mass) | — | (E-1) (20 parts by mass) | — | EL/GBIL 40/60 |
| Comparative example 32 | (A-1) (100 parts by mass) | (B-1) (3 parts by mass) | — | (C-1) (0.5 parts by mass) | — | (E-1) (20 parts by mass) | — | EL/GBL 40/60 |
| Comparative example 33 | (A-1) (100 parts by mass) | (B-1) (60 parts by mass) | — | (C-1) (0.5 parts by mass) | (D-1) (15 parts by mass) | (E-1) (20 parts by mass) | — | EL/GBL, 40/60 |
| Comparative example 34 | (A-1) (100 parts by mass) | (B-1) (3 parts by mass) | — | (C-1) (0.5 parts by mass) | (D-1) (15 parts by mass) | (E-1) (20 parts by mass) | — | EL/GBL 40/60 |

TABLE 5

| | evaluation results | | | | |
|---|---|---|---|---|---|
| | compatibility with component (A) | curing temperature | flux resistance | content of di-amine of general formula (5) in all diamine residues | peeling after reflow |
| Example 1 | 2 | 320° C. | 6.4% | 2 | 95 mol % | 2 |
| Example 2 | 2 | 320° C. | 4.5% | 2 | 95 mol % | 3 |
| Example 3 | 3 | 320° C. | 4.8% | 2 | 95 mol % | 3 |
| Example 4 | 3 | 320° C. | 5.2% | 2 | 95 mol % | 3 |
| Example 5 | 3 | 320° C. | 6.4% | 2 | 95 mol % | 3 |
| Example 6 | 3 | 320° C. | 7.4% | 2 | 95 mol % | 2 |
| Example 8 | 2 | 320° C. | 2.8% | 3 | 95 mol % | 2 |
| Example 9 | 2 | 320° C. | 1.4% | 3 | 95 mol % | 3 |
| Example 10 | 3 | 320° C. | 1.5% | 3 | 95 mol % | 3 |
| Example 11 | 3 | 320° C. | 1.6% | 3 | 95 mol % | 3 |
| Example 12 | 3 | 320° C. | 1.8% | 3 | 95 mol % | 3 |
| Example 13 | 3 | 320° C. | 2.0% | 3 | 95 mol % | 2 |
| Example 14 | 3 | 320° C. | 1.6% | 3 | 95 mol % | 3 |
| Example 15 | 3 | 320° C. | 1.6% | 3 | 95 mol % | 3 |
| Example 16 | 3 | 320° C. | 1.5% | 3 | 95 mol % | 3 |
| Example 17 | 3 | 320° C. | 6.7% | 2 | 76 mol % | 3 |
| Example 18 | 3 | 320° C. | 7.7% | 2 | 95 mol % | 3 |
| Example 19 | 3 | 230° C. | 8.3% | 2 | 75 mol % | 3 |
| Example 20 | 3 | 230° C. | 5.2% | 2 | 94 mol % | 3 |
| Example 21 | 3 | 320° C. | 2.3% | 3 | 76 mol % | 3 |
| Example 22 | 3 | 320° C. | 2.5% | 3 | 95 mol % | 3 |
| Example 23 | 3 | 230° C. | 3.0% | 3 | 75 mol % | 3 |
| Example 24 | 3 | 230° C. | 2.4% | 3 | 94 mol % | 3 |
| Example 49 | 3 | 230° C. | 8.1% | 2 | 70 mol % | 3 |
| Example 50 | 3 | 320° C. | 5.5% | 2 | 65 mol % | 3 |
| Example 51 | 3 | 320° C. | 7.8% | 2 | 100 mol % | 1 |
| Example 52 | 3 | 230° C. | 2.5% | 3 | 70 mol % | 3 |
| Example 53 | 3 | 320° C. | 1.6% | 3 | 65 mol % | 3 |
| Example 54 | 3 | 320° C. | 1.5% | 3 | 50 mol % | 3 |
| Example 55 | 3 | 320° C. | 1.9% | 3 | 97 mol % | 2 |
| Example 56 | 3 | 320° C. | 2.5% | 3 | 100 mol % | 1 |

TABLE 6

| | evaluation results | | | | |
|---|---|---|---|---|---|
| | compatibility with component (A) | curing temperature | flux resistance | content of di-amine of general formula (5) in all diamine residues | peeling after reflow |
| Comparative example 1 | 3 | 320° C. | peeling 1 | 95 mol % | 1 |
| Comparative example 2 | 2 | 320° C. | 4.5% 2 | 95 mol % | 1 |
| Comparative example 3 | 3 | 320° C. | 5.2% 2 | 95 mol % | 1 |
| Comparative example 4 | 3 | 320° C. | peeling 1 | 95 mol % | 1 |
| Comparative example 5 | 3 | 320° C. | peeling 1 | 76 mol % | 1 |
| Comparative example 6 | 3 | 320° C. | 2.2% 3 | 95 mol % | 1 |
| Comparative example 7 | 3 | 320° C. | 2.0% 3 | 95 mol % | 1 |
| Comparative example 8 | 3 | 320° C. | 4.4% 2 | 95 mol % | 1 |
| Comparative example 9 | 3 | 320° C. | 4.4% 2 | 95 mol % | 1 |
| Comparative example 10 | 3 | 320° C. | peeling 1 | 76 mol % | 1 |
| Comparative example 11 | 3 | 230° C. | peeling 1 | 75 mol % | 1 |
| Comparative example 12 | 3 | 320° C. | 6.7% 2 | 76 mol % | 1 |
| Comparative example 13 | 3 | 230° C. | 8.3% 2 | 75 mol % | 1 |
| Comparative example 27 | 1 | 320° C. | 6.7% 7 | 95 mol % | 2 |
| Comparative example 28 | 3 | 320° C. | 8.2% 2 | 95 mol % | 1 |
| Comparative example 29 | 1 | 320° C. | 2.6% 3 | 95 mol % | 2 |
| Comparative example 30 | 3 | 320° C. | 2.5% 3 | 95 mol % | 1 |

TABLE 7

| | evaluation results | | | | | |
|---|---|---|---|---|---|---|
| | compatibility with component (A) | thick film processability | curing temperature | flux resistance | content of di-amine of eneral formula (5) in all di-amine residues | peeling after reflow |
| Example 25 | 2 | 720 3 | 320° C. | 5.4% 2 | 95 mol % | 2 |
| Example 26 | 2 | 750 3 | 320° C. | 3.5% 2 | 95 mol % | 3 |
| Example 27 | 3 | 750 3 | 320° C. | 3.8% 2 | 95 mol % | 3 |
| Example 28 | 3 | 750 3 | 320° C. | 4.2% 2 | 95 mol % | 3 |
| Example 29 | 3 | 800 3 | 320° C. | 5.4% 2 | 95 mol % | 3 |
| Example 30 | 3 | 900 2 | 320° C. | 6.4% 2 | 95 mol % | 2 |
| Example 32 | 2 | 720 3 | 320° C. | 1.8% 3 | 95 mol % | 2 |
| Example 33 | 2 | 750 3 | 320° C. | 0.4% 3 | 95 mol % | 3 |
| Example 34 | 3 | 750 3 | 320° C. | 0.5% 3 | 95 mol % | 3 |
| Example 35 | 3 | 750 3 | 320° C. | 0.6% 3 | 95 mol % | 3 |
| Example 36 | 3 | 800 3 | 320° C. | 0.8% 3 | 95 mol % | 3 |
| Example 37 | 3 | 900 2 | 320° C. | 1.0% 3 | 95 mol % | 2 |
| Example 38 | 3 | 700 4 | 320° C. | 0.6% 3 | 95 mol % | 3 |
| Example 39 | 3 | 800 3 | 320° C. | 0.6% 3 | 95 mol % | 3 |
| Example 40 | 3 | 850 2 | 320° C. | 0.5% 3 | 95 mol % | 3 |
| Example 41 | 3 | 680 4 | 320° C. | 5.7% 2 | 76 mol % | 3 |
| Example 42 | 3 | 750 3 | 320° C. | 6.7% 2 | 95 mol % | 3 |
| Example 43 | 3 | 600 4 | 230° C. | 7.3% 2 | 75 mol % | 3 |
| Example 44 | 3 | 850 2 | 230° C. | 4.2% 2 | 94 mol % | 3 |
| Example 45 | 3 | 680 4 | 320° C. | 1.3% 3 | 76 mol % | 3 |
| Example 46 | 3 | 750 3 | 320° C. | 1.5% 3 | 95 mol % | 3 |
| Example 47 | 3 | 600 4 | 230° C. | 2.0% 3 | 75 mol % | 3 |
| Example 48 | 3 | 850 2 | 230° C. | 1.4% 3 | 94 mol % | 3 |
| Example 57 | 3 | 650 4 | 230° C. | 6.9% 2 | 70 mol % | 3 |
| Example 58 | 3 | 900 2 | 320° C. | 4.8% 2 | 65 mol % | 3 |
| Example 59 | 3 | 750 3 | 320° C. | 6.8% 2 | 100 mol % | 1 |
| Example 60 | 3 | 650 4 | 230° C. | 1.6% 3 | 70 mol % | 3 |

TABLE 7-continued

|  | evaluation results | | | | | |
|---|---|---|---|---|---|---|
|  | compatibility with component (A) | thick film processability | curing temperature | flux resistance | | content of di-amine of general formula (5) in all di-amine residues | peeling after reflow |
| Example 61 | 3 | 900 | 2 | 320° C. | 0.7% | 3 | 65 mol % | 3 |
| Example 62 | 3 | 1100 | 1 | 320° C. | 0.6% | 3 | 50 mol % | 3 |
| Example 63 | 3 | 800 | 3 | 320° C. | 1.0% | 3 | 97 mol % | 2 |
| Example 64 | 3 | 750 | 3 | 320° C. | 1.6% | 3 | 100 mol % | 1 |
| Example 65 | 3 | 800 | 3 | 320° C. | 0.7% | 3 | 95 mol % | 3 |
| Example 66 | 3 | 850 | 3 | 320° C. | 0.6% | 3 | 95 mol % | 3 |
| Example 67 | 3 | 650 | 4 | 230° C. | 1.4% | 3 | 70 mol % | 3 |
| Example 68 | 3 | 700 | 4 | 230° C. | 1.1% | 3 | 70 mol % | 3 |

TABLE 8

|  | evaluation results | | | | | |
|---|---|---|---|---|---|---|
|  | compatibility with component (A) | thick film processability | curing temperature | flux resistance | | content of di-amine of general formula (5) in all di-amine residues | peeling after reflow |
| Comparative example 14 | 3 | 1200 | 1 | 320° C. | peeling | 1 | 95 mol % | 1 |
| Comparative example 15 | 2 | 850 | 2 | 320° C. | 3.5% | 2 | 95 mol % | 1 |
| Comparative example 16 | 3 | 750 | 3 | 320° C. | 4.2% | 2 | 95 mol % | 1 |
| Comparative example 17 | 3 | 1300 | 1 | 320° C. | peeling | 1 | 95 mol % | 1 |
| Comparative example 18 | 3 | 1050 | 1 | 320° C. | peeling | 1 | 76 mol % | 1 |
| Comparative example 19 | 3 | 1200 | 1 | 320° C. | 1.2% | 3 | 95 mol % | 1 |
| Comparative example 20 | 3 | 1200 | 1 | 320° C. | 1.1% | 3 | 95 mol % | 1 |
| Comparative example 21 | 3 | 750 | 3 | 320° C. | 3.4% | 2 | 95 mol % | 1 |
| Comparative example 22 | 3 | 750 | 3 | 320° C. | 3.4% | 2 | 95 mol % | 1 |
| Comparative example 23 | 3 | 1050 | 1 | 320° C. | peeling | 1 | 76 mol % | 1 |
| Comparative example 24 | 3 | 900 | 2 | 230° C. | peeling | 1 | 75 mol % | 1 |
| Comparative example 25 | 3 | 680 | 4 | 320° C. | 5.7% | 2 | 76 mol % | 1 |
| Comparative example 26 | 3 | 600 | 4 | 230° C. | 7.3% | 2 | 75 mol % | 1 |
| Comparative example 31 | 1 | 720 | 3 | 320° C. | 5.9% | 2 | 95 mol % | 2 |
| Comparative example 32 | 3 | 900 | 2 | 320° C. | 6.8% | 2 | 95 mol % | 1 |
| Comparative example 33 | 1 | 720 | 3 | 320° C. | 1.7% | 3 | 95 mol % | 2 |
| Comparative example 34 | 3 | 900 | 2 | 320° C. | 1.3% | 3 | 95 mol % | 1 |

EXPLANATION OF NUMERALS

1 silicon wafer
1' semiconductor chip
2 Al pad
3 passivation film
4 insulation film
5 metal film
6 metal wiring
7 insulation film
8 barrier metal
9 scribe line
10 solder bump
11 encapsulation resin
12 substrate
13 insulation film
14 insulation film
15 metal film
16 metal wiring
17 metal wiring
18 electrode
19 encapsulation resin
20 support substrate
21 electrode pad
22 insulation film
23 metal wiring
34 Cu post
35 solder bump
26 semiconductor chip
27 TFT 28 metal wiring
29 TFT insulation layer
30 planarization layer
31 transparent electrode
32 substrate
33 contact hole
34 insulation layer

The invention claimed is:

1. A resin composition comprising: (A) a resin having a structural unit as represented by the general formula (1) and/or general formula (2), (B) a phenol resin, and (C) an antioxidant, wherein the phenol resin of (B) contains a structure as represented by the general formula (3), the component (B) accounts for 5 parts by mass or more and 19 parts by mass or less relative to 100 parts by mass of the component (A), and the component (C) contains a structure as represented by general formula (5),
and a content ratio ((B)/(C)) of the component (B) and the component (C) is 10 or more and 50 or less:

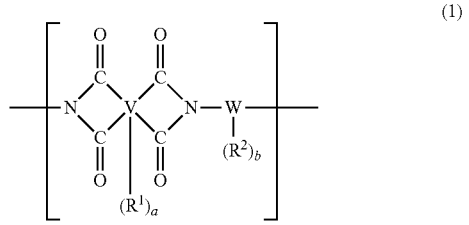
(1)

wherein, in the general formula (1), V is a tetravalent to decavalent organic group; W is a divalent to octavalent organic group; a and b each is an integer of 0 to 6; $R^1$ and $R^2$ each is one selected from the group consisting of a hydroxyl group, carboxy group, sulfonic group, and thiol group; the plurality of $R^1$'s are identical to or different from each other; and the plurality of $R^2$'s are identical to or different from each other;

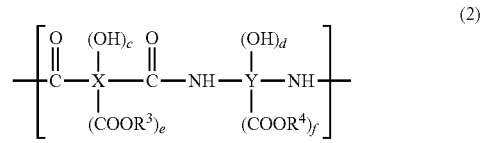
(2)

wherein, in the general formula (2), X and Y each independently is a divalent to octavalent organic group containing two or more carbon atoms; $R^3$ and $R^4$ each independently is a hydrogen atom or a monovalent organic group containing 1 to 20 carbon atoms; c and d each is an integer of 0 to 4; and e and f each denote an integer of 0 to 2;

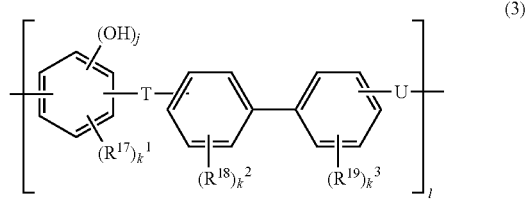
(3)

wherein, in the general formula (3), $R^{17}$, $R^{18}$, and $R^{19}$ each is a monovalent organic group containing 1 to 20 carbon atoms; T and U each independently is an alkylene group or alkylene oxide group containing 1 to 20 carbon atoms; j is an integer of 1 to 3; $k^1$, $k^2$, and $k^3$ each is an integer of 0 to 2; and l is an integer of 3 to 100;

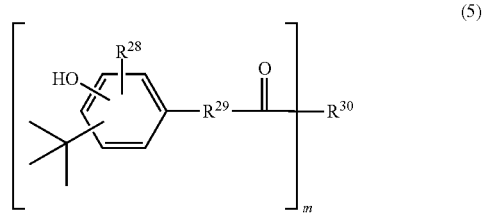
(5)

wherein, in the general formula (5), $R^{28}$ denotes a hydrogen atom or an alkyl group containing 1 to 15 carbon atoms and $R^{29}$ denotes an alkylene group containing 2 or more carbon atoms; $R^{30}$ denotes a monovalent to tetravalent organic group that contains at least one selected from the group consisting of alkyl groups containing 1 or more carbon atoms, alkylene groups containing 1 or more carbon atoms, C atom, O atom, and N atom; and m is an integer of 1 to 4.

2. A resin composition as set forth in claim 1, wherein the component (B) accounts for 5 parts by mass or more and 15 parts by mass or less relative to 100 parts by mass of the component (A).

3. A resin composition as set forth in claim 1, wherein component (A) comprises di-amine residues, wherein at least one di-amine residue has a structure represented by any of the general formulae (8) and also wherein such di-amine residues account for 65 mol % or more and 95 mol % or less of all di-amine residues, which account for 100 mol %:

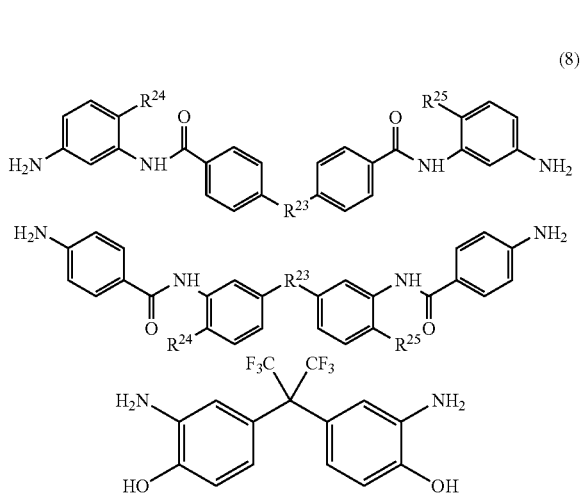
(8)

wherein, in the general formulae (8), $R^{23}$ is $C(CF_3)_2$, and $R^{24}$ and $R^{25}$ each independently is a hydrogen atom or a hydroxyl group.

4. A resin composition as set forth in claim 1, wherein, W in the general formula (1) and Y in the general formula (2) that represent the component (A) contain a group as represented by the general formula (4):

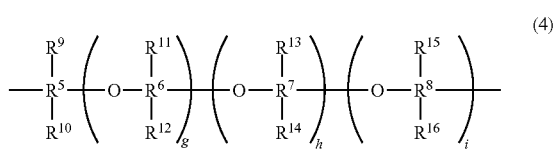

(4)

wherein, in the general formula (4), $R^5$ to $R^8$ each independently is an alkylene group containing 1 to 6 carbon atoms; $R^9$ to $R^{16}$ each independently is a hydrogen, fluorine, or an alkyl group containing 1 to 6 carbon atoms, with the structures in parentheses being different from each other; and g, h, and i each independently is an integer of 0 to 35 and meet the relation g+h+i>0.

5. A resin composition as set forth in claim 1, further comprising (D) a thermal crosslinking agent.

6. A resin composition as set forth in claim 1, further comprising (E) a photosensitive agent.

7. A resin sheet produced from a resin composition as set forth in claim 1.

8. A cured film produced by curing a resin composition as set forth in claim 1.

9. A production method for a cured film comprising a step for coating a substrate with a resin composition as set forth in claim 1 and drying it to form a resin film, an irradiation step for irradiating the dried resin film with light, a development step for developing the light-irradiated resin film, and a heat treatment step for heat-treating the developed resin film.

10. A semiconductor apparatus comprising a metal wiring and an insulation film, wherein the cured film set forth in claim 8 is used as the insulation film.

11. A semiconductor apparatus comprising a metal wiring and an insulation film, wherein the cured film set forth in claim 8 is used as the insulation film and has a thickness of 11 μm or more and 20 μm or less.

12. A semiconductor apparatus as set forth in claim 10, wherein the metal wiring has a thickness of 10 μm or more and 20 μm or less.

13. A semiconductor apparatus as set forth in claim 10, wherein both the width of each metal wire and the distance between adjacent metal wires are 5 μm or less.

14. A semiconductor apparatus as set forth in claim 10, further comprising a semiconductor chip, wherein the metal wiring is electrically connected to the semiconductor chip.

15. A semiconductor apparatus as set forth in claim 14, wherein the semiconductor chip is encapsulated by an encapsulation resin; the insulation film, acting as an interlayer dielectric film, is disposed on the semiconductor chip and the encapsulation resin; and the metal wiring is disposed on the interlayer dielectric film.

16. A semiconductor apparatus as set forth in claim 14, comprising a plurality of stacked rewiring layers containing a metal wirings and interlayer dielectric films wherein, when each pair of mutually adjacent rewiring layers are compared, the width of each metal wire and the distance between adjacent metal wires in the rewiring layer that is located nearer to the semiconductor chip than the other are equal to or smaller than the width of each metal wire and the distance between adjacent metal wires in the rewiring layer that is located farther from the semiconductor chip.

17. A production method for a semiconductor apparatus comprising a step for arranging temporarily pasted materials on a support substrate and forming thereon a stack of a plurality of rewiring layers, each containing a metal wiring (rewiring) and a cured film as set forth in claim 8, a step for arranging a semiconductor chip and encapsulation resin on top of it to form a semiconductor package, and subsequently removing the support substrate from the semiconductor package.

18. A display apparatus comprising a first electrode disposed on a substrate, an insulation layer covering the periphery of the first electrode, and a second electrode disposed opposite to the first electrode, wherein the insulation layer contains a cured film as set forth in claim 8.

19. A display apparatus comprising a thin film transistor containing a metal wiring and disposed on a substrate, a planarizing film disposed so as to cover the irregularities on the thin film transistor containing a metal wiring, and a display device disposed on the planarizing film, wherein the planarizing film contains a cured film as set forth in claim 8.

20. A resin composition as set forth in claim 2, wherein component (A) comprises di-amine residues, wherein at least one di-amine residue has a structure as represented by any of the general formulae (8) and also wherein such di-amine residues account for 65 mol % or more and 95 mol % or less of all di-amine residues, which account for 100 mol %:

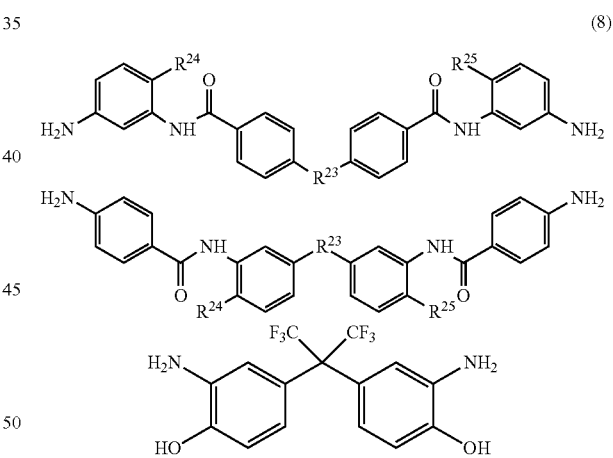

(8)

wherein, in the general formulae (8), $R^{23}$ denotes $C(CF_3)_2$, and $R^{24}$ and $R^{25}$ each independently is a hydrogen atom or a hydroxyl group.

* * * * *